(12) United States Patent
Hirakata

(10) Patent No.: US 7,495,644 B2
(45) Date of Patent: Feb. 24, 2009

(54) DISPLAY DEVICE AND METHOD FOR MANUFACTURING DISPLAY DEVICE

(75) Inventor: Yoshiharu Hirakata, Atsugi-Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 653 days.

(21) Appl. No.: 11/011,121

(22) Filed: Dec. 15, 2004

(65) Prior Publication Data

US 2005/0140265 A1 Jun. 30, 2005

(30) Foreign Application Priority Data

Dec. 26, 2003 (JP) ............................. 2003-432005

(51) Int. Cl.
*G09G 3/36* (2006.01)
(52) U.S. Cl. .......................................... 345/92; 345/87
(58) Field of Classification Search ................... 345/92, 345/430, 173, 174, 905, 80, 76, 44, 55, 82, 345/87; 313/503–506, 483, 499; 445/24, 445/25, 43; 315/169.1, 0.3, 169.3; 438/782; 430/9; 349/196, 98; 257/69, 734, 59, 40, 257/72, 79, 432
See application file for complete search history.

(56) References Cited

U.S. PATENT DOCUMENTS

| | | | | |
|---|---|---|---|---|
| 3,937,964 A | * | 2/1976 | Muehllehner | ................ 250/366 |
| 4,009,083 A | * | 2/1977 | Lyon et al. | ..................... 203/49 |
| 4,357,557 A | | 11/1982 | Inohara et al. | |
| 4,611,584 A | * | 9/1986 | Finney | .......................... 600/40 |
| 4,877,675 A | * | 10/1989 | Falicoff et al. | ............... 428/204 |
| 5,072,263 A | | 12/1991 | Watanabe et al. | |
| 5,107,175 A | | 4/1992 | Hirano et al. | |
| 5,124,204 A | | 6/1992 | Yamashita et al. | |
| 5,189,405 A | | 2/1993 | Yamashita et al. | |
| 5,240,979 A | * | 8/1993 | Maier et al. | ................... 524/145 |
| 5,518,940 A | | 5/1996 | Hodate et al. | |

(Continued)

FOREIGN PATENT DOCUMENTS

EP 0 999 595 A2 5/2000

(Continued)

OTHER PUBLICATIONS

"Investigation Committee of a Solar Cell Handbook" Institute of Electrical Engineers of Japan, pp. 164-167, 1985. (with Concise Statement).

*Primary Examiner*—Prabodh M. Dharia
(74) *Attorney, Agent, or Firm*—Nixon Peabody LLP; Jeffrey L. Costellia

(57) ABSTRACT

An object of the present invention is to provide a highly reliable display device and a method for manufacturing the display device with a much easy way. According to one aspect of a method for manufacturing a display device of the invention, it comprises the steps of forming a light-emitting element over a first substrate; forming a frame to surround the light-emitting element; dropping a composition containing a liquid hygroscopic substance in a region surrounded with the frame; and forming a layer containing a hygroscopic substance by solidifying the composition, wherein the first substrate and a second substrate are adhered to each other with a sealant so that the light-emitting element, the layer containing a hygroscopic substance, and the frame are sealed between the pair of substrates.

58 Claims, 32 Drawing Sheets

U.S. PATENT DOCUMENTS

| | | | |
|---|---|---|---|
| 5,686,360 A | 11/1997 | Harvey, III et al. | |
| 5,693,956 A | 12/1997 | Shi et al. | |
| 5,757,126 A | 5/1998 | Harvey, III et al. | |
| 5,771,562 A | 6/1998 | Harvey, III et al. | |
| 5,811,177 A | 9/1998 | Shi et al. | |
| 5,882,761 A | 3/1999 | Kawami et al. | |
| 5,952,778 A | 9/1999 | Haskal et al. | |
| 5,962,962 A | 10/1999 | Fujita et al. | |
| 5,973,258 A | 10/1999 | Shiotsuka et al. | |
| 5,990,542 A | 11/1999 | Yamazaki | |
| 6,080,031 A * | 6/2000 | Rogers et al. | 445/25 |
| 6,114,183 A | 9/2000 | Hamada et al. | |
| 6,146,225 A | 11/2000 | Sheats et al. | |
| 6,149,757 A | 11/2000 | Chikaki et al. | |
| 6,150,187 A | 11/2000 | Zyung et al. | |
| 6,198,217 B1 | 3/2001 | Suzuki et al. | |
| 6,198,220 B1 | 3/2001 | Jones et al. | |
| 6,239,470 B1 | 5/2001 | Yamazaki | |
| 6,268,071 B1 | 7/2001 | Yasukawa et al. | |
| 6,268,695 B1 | 7/2001 | Affinito | |
| 6,274,887 B1 | 8/2001 | Yamazaki et al. | |
| 6,320,115 B1 | 11/2001 | Kataoka et al. | |
| 6,323,416 B1 | 11/2001 | Komori et al. | |
| 6,326,109 B1 * | 12/2001 | Bourdelais et al. | 430/9 |
| 6,413,645 B1 | 7/2002 | Graff et al. | |
| 6,441,468 B1 | 8/2002 | Yamazaki | |
| 6,447,867 B1 | 9/2002 | Kominami et al. | |
| 6,784,037 B2 | 8/2004 | Yamazaki et al. | |
| 6,791,256 B2 * | 9/2004 | Nishizawa et al. | 313/495 |
| 6,822,629 B2 * | 11/2004 | Yamazaki et al. | 345/76 |
| 6,927,761 B2 * | 8/2005 | Badaye et al. | 345/173 |
| 6,960,878 B2 * | 11/2005 | Sakano et al. | 313/512 |
| 7,012,366 B2 * | 3/2006 | Park et al. | 313/505 |
| 7,067,170 B2 * | 6/2006 | Marcus et al. | 427/66 |
| 7,106,398 B2 * | 9/2006 | Bobrov | 349/96 |
| 7,169,461 B2 * | 1/2007 | Hiruma et al. | 428/209 |
| 7,258,589 B2 * | 8/2007 | Park et al. | 445/25 |
| 7,259,110 B2 * | 8/2007 | Ohnuma et al. | 438/782 |
| 7,280,181 B2 * | 10/2007 | Finot | 349/198 |
| 7,291,976 B2 * | 11/2007 | Hayashi | 313/512 |
| 2002/0003397 A1 * | 1/2002 | Yamazaki | 313/483 |
| 2002/0021268 A1 * | 2/2002 | Yamazaki et al. | 345/80 |
| 2002/0125814 A1 * | 9/2002 | Uchida | 313/483 |
| 2002/0125817 A1 | 9/2002 | Yamazaki et al. | |
| 2003/0127733 A1 * | 7/2003 | Nakazawa et al. | 257/734 |
| 2003/0155573 A1 | 8/2003 | Yamazaki et al. | |
| 2003/0178936 A1 * | 9/2003 | Park et al. | 313/505 |
| 2005/0140280 A1 * | 6/2005 | Yamazaki et al. | 313/504 |
| 2005/0263765 A1 * | 12/2005 | Maekawa | 257/69 |
| 2006/0043510 A1 * | 3/2006 | Yamazaki et al. | 257/432 |
| 2006/0071592 A1 * | 4/2006 | Narasimhan et al. | 313/506 |
| 2006/0087222 A1 * | 4/2006 | Yamauchi et al. | 313/503 |
| 2006/0166587 A1 * | 7/2006 | Park et al. | 445/24 |

FOREIGN PATENT DOCUMENTS

| | | |
|---|---|---|
| JP | 08-068990 | 3/1996 |
| JP | 08-096959 | 4/1996 |
| JP | 2003-297558 | 10/2003 |

* cited by examiner

PRIOR ART

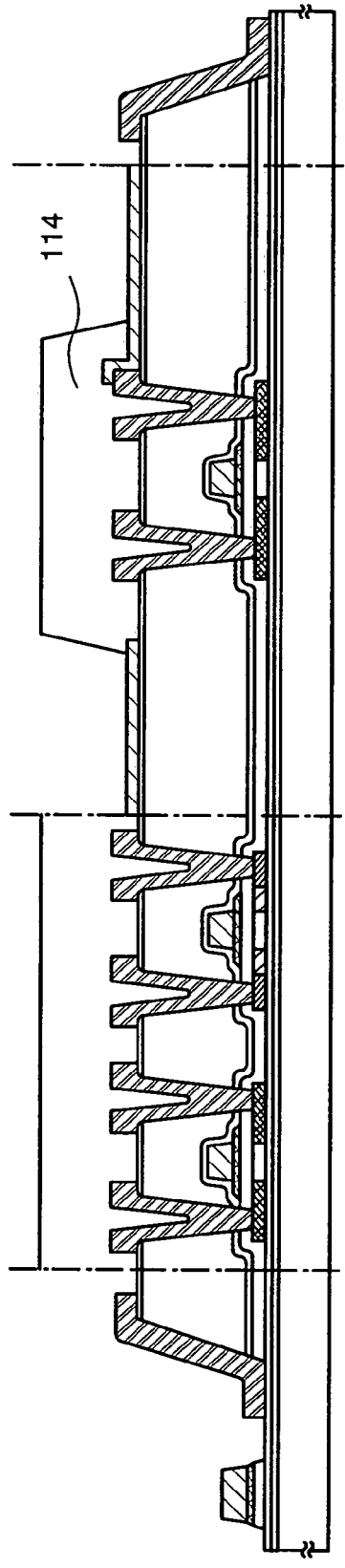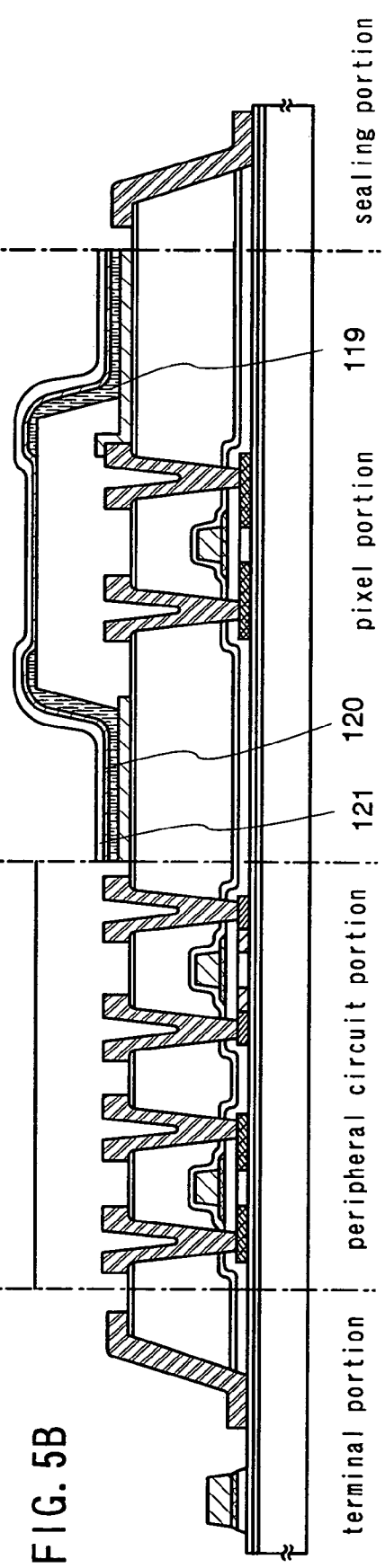
FIG. 5A
FIG. 5B

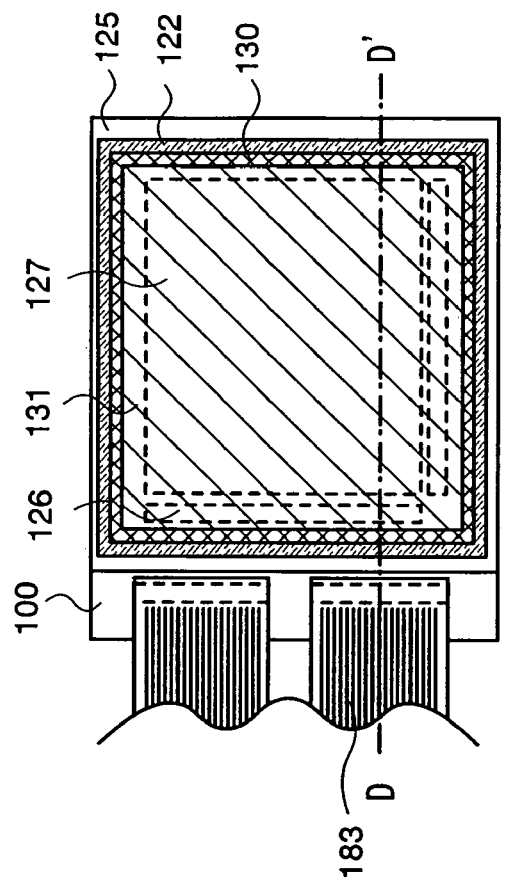
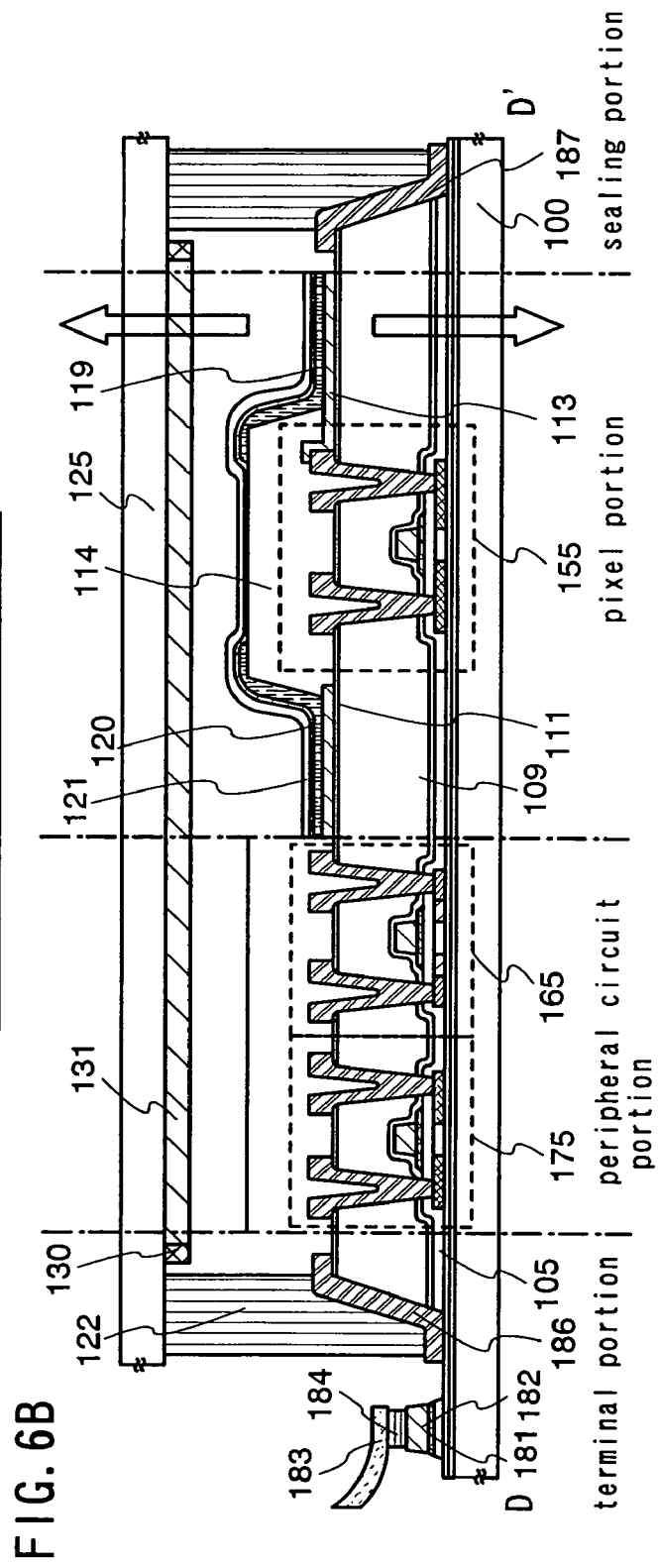
FIG. 6A
FIG. 6B

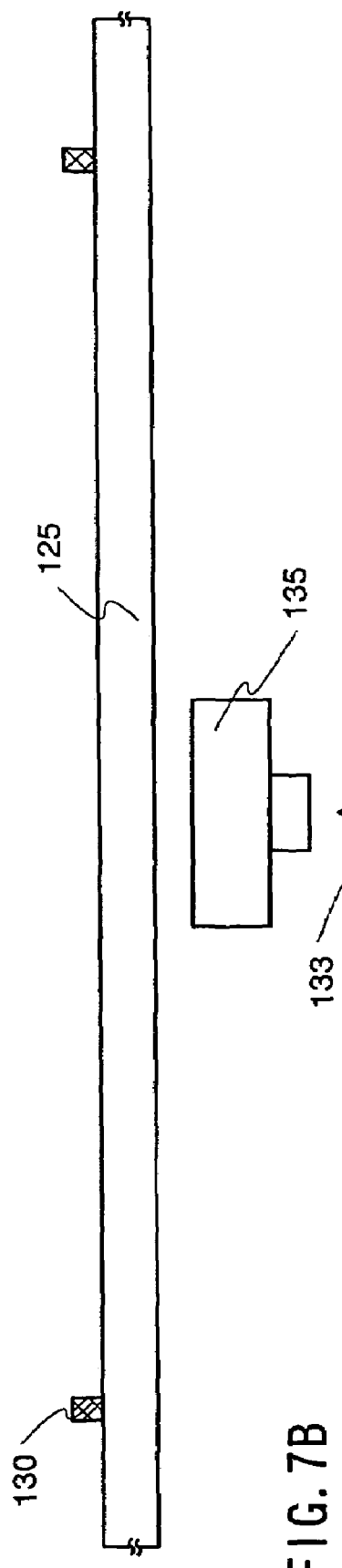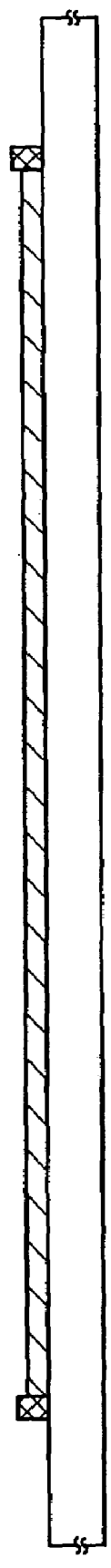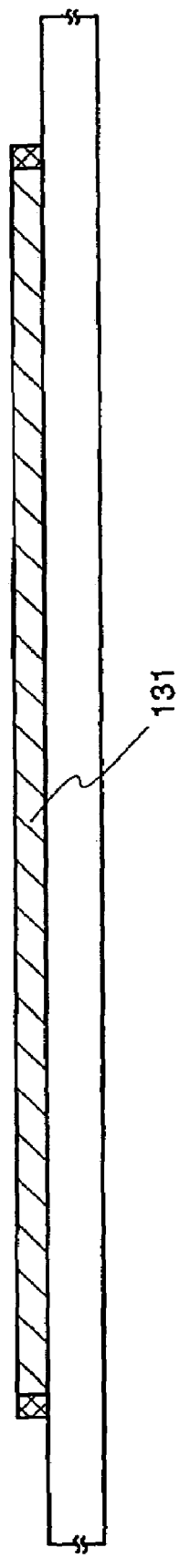

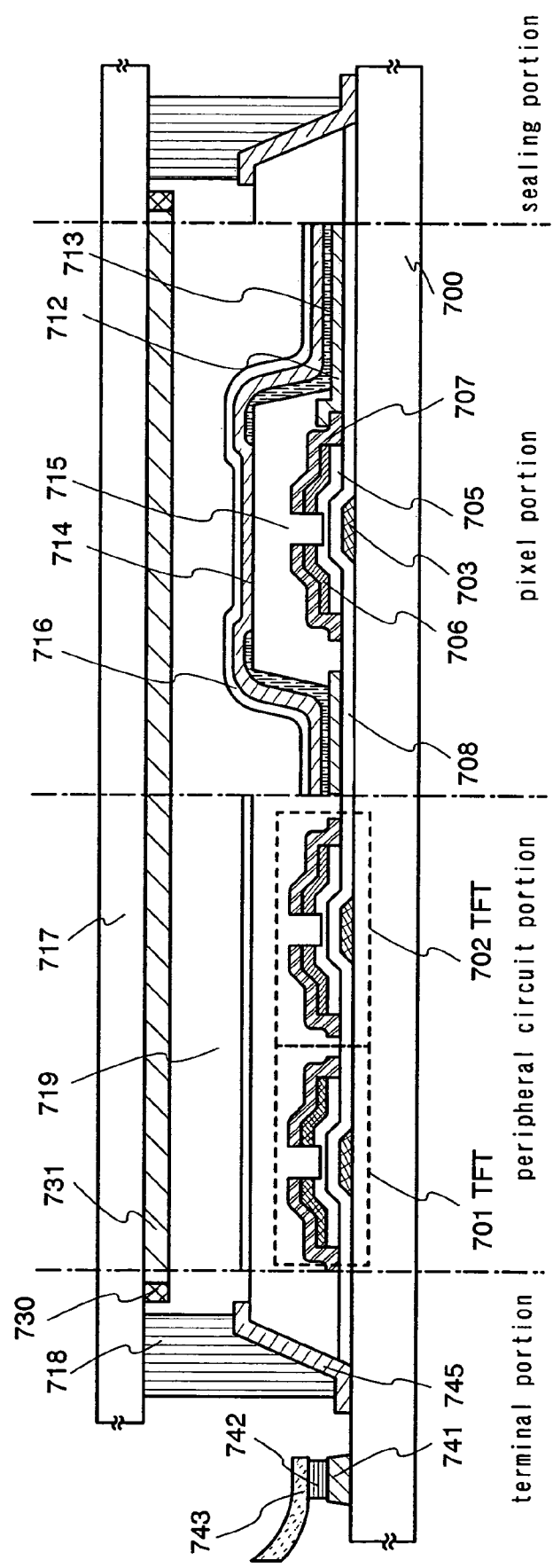

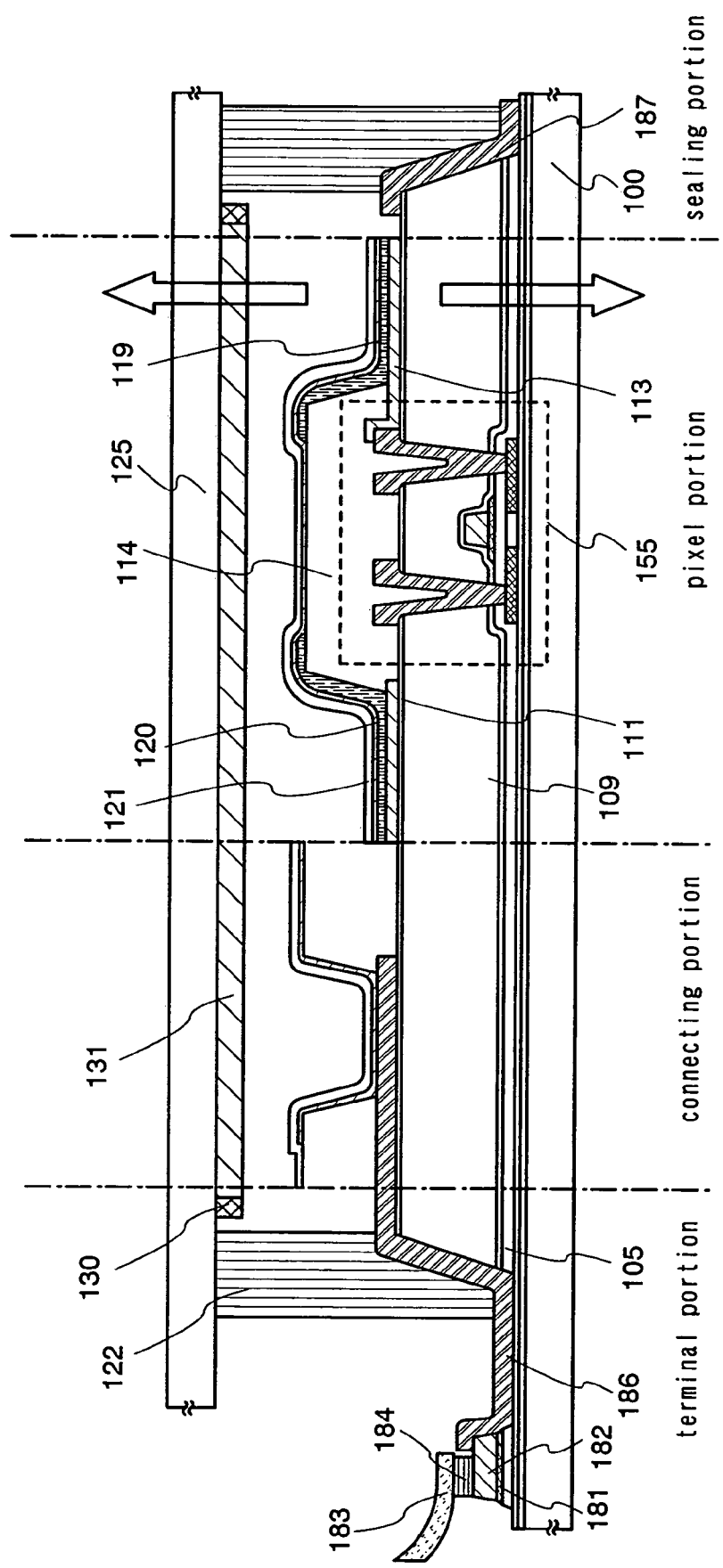

FIG. 14
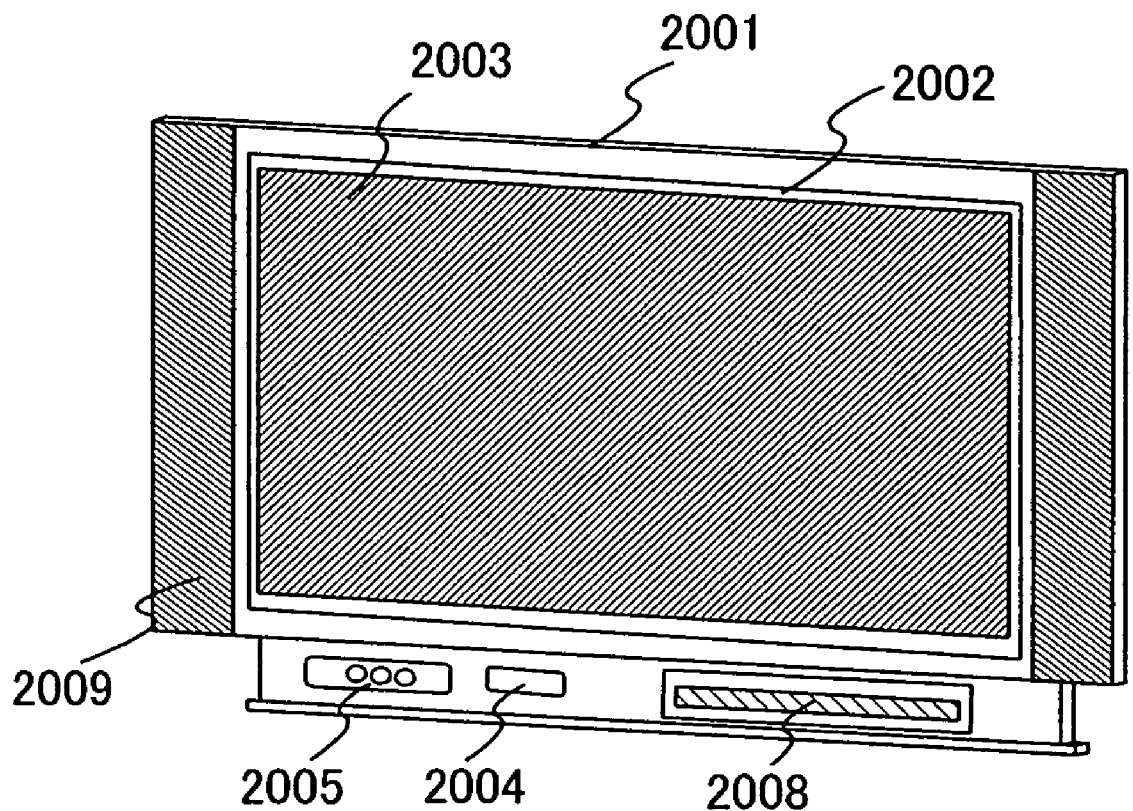
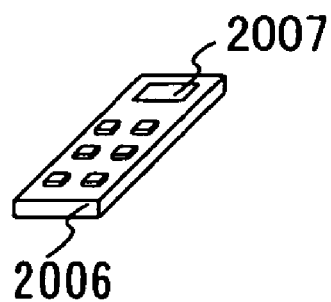

DISPLAY DEVICE AND METHOD FOR MANUFACTURING DISPLAY DEVICE

BACKGROUND OF THE INVENTION

1. Field of the Invention

The present invention relates to a display device having an element which sandwiches a light-emitting material between electrodes (hereinafter, a light-emitting element) and a method for manufacturing the same. Specifically, the invention relates to a display device using a light-emitting material from which EL (Electro Luminescence) can be obtained (hereinafter, an EL material).

2. Description of the Related Art

An EL material (particularly an organic EL material) constituting the principal part of an EL element has properties weak in moisture and tends to be deteriorated. Thus, a structure in which a desiccant is put in an EL display device (electroluminescence device) to seal is known (for example, Reference 1: Japanese Patent Laid-Open No. 2003-297558).

FIG. 2 is a conventional display device, and reference numeral 50 denotes an element substrate; 51, an element portion such as a driver circuit portion having a TFT or an element, or a pixel portion; 53, a desiccant; 54, a sealant; 55, a depression provided with the desiccant 53; and 60, a sealing substrate.

In order to provide the desiccant 53 in the conventional display device shown in FIG. 2, the sealing substrate 60 is processed to form the depression 55. This depression 55 is formed by a blast processing method, a mechanical processing method such as mill processing, a chemical processing method melting a glass substrate, or the like. The blast processing method is a processing method such as a sandblasting method by colliding abrasive grains such as sand. These methods have a problem such as dust or contamination of heavy metal in the manufacturing steps; therefore, it is required to tackle the problem by employing a cleaning method thereof or the like. In addition, since the depression is like ground glass and or has depression and projection with the use of mechanical processing or the like, the light extraction efficiency is decreased. Therefore, it is inappropriate for a top emission or dual emission type display device. Light extraction efficiency indicates the ratio of the amount of luminescence of an element emitted to the atmosphere through the top surface of a substrate, to the initial amount of luminescence of the element.

In the conventional methods, a processing step of forming a depression in a sealing substrate in such a manner is necessary and apparatus necessary for the step increases, and thus the step becomes complicated. There is possibility that a sealing substrate is damaged due to the processing step. Therefore, there is fear that light-transmitting properties of the sealing substrate is deteriorated by being roughed and by impairing the planarity or that a thin sealing substrate is damaged. In addition, it is difficult to form a depression in an element substrate as formed in the sealing substrate, and there is limitation on the place to provide a desiccant.

SUMMARY OF THE INVENTION

An object of the present invention is to provide a highly reliable display device capable of preventing the deterioration of a light-emitting element and a manufacturing method capable of manufacturing the display device with much ease.

According to one aspect of a display device of the invention, it comprises a pair of substrates; a light-emitting element; a layer containing a hygroscopic substance; and a frame, wherein the frame is provided to surround the layer containing the hygroscopic substance, and the pair of substrates are adhered to each other to seal inside the light-emitting element, the layer containing the hygroscopic substance, and the frame.

According to another aspect of a display device of the invention, it comprises a first substrate having a pixel portion provided with a light-emitting element; a second substrate; a layer containing a hygroscopic substance; and a frame surrounding the pixel portion, wherein the layer containing a hygroscopic substance is provided to be surrounded with the frame, and the first substrate and the second substrate are adhered to each other with a sealant to seal inside the pixel portion, the layer containing the hygroscopic substance, and the frame.

According to another aspect of a display device of the invention, it comprises a first substrate including a pixel portion provided with a light-emitting element and a circuit portion having a driver circuit; a second substrate; a layer containing a hygroscopic substance; a frame surrounding the pixel portion; and a sealant surrounding the pixel portion and the circuit portion, wherein the layer containing the hygroscopic substance is provided between the frame and the sealant, and the first substrate and the second substrate are adhered to each other with the sealant to seal inside the pixel portion, the circuit portion, the layer containing the hygroscopic substance, and the frame.

According to another aspect of a display device of the invention, it comprises a first substrate including a pixel portion provided with a light-emitting element and a circuit portion having a driver circuit; a second substrate; a layer containing a hygroscopic substance; and a frame surrounding a part of the pixel portion and the circuit portion, wherein the layer containing the hygroscopic substance is provided to be surrounded with the frame, and the first substrate and the second substrate are adhered to each other with a sealant to seal inside the pixel portion, the circuit portion, the layer containing a hygroscopic substance, and the frame.

According to another aspect of a display device of the invention, it comprises a first substrate including a pixel portion provided with a light-emitting element and a circuit portion having a driver circuit; a second substrate; a layer containing a hygroscopic substance; and a frame surrounding the pixel portion and the circuit portion, wherein the layer containing a hygroscopic substance is provided to be surrounded with the frame, and the first substrate and the second substrate are adhered to each other with a sealant to seal inside the pixel portion, the circuit portion, the layer containing the hygroscopic substance, and the frame.

According to another aspect of a display device of the invention, it comprises a first substrate including a pixel portion provided with a light-emitting element and a circuit portion having a driver circuit; a second substrate; a layer containing a hygroscopic substance; and a frame surrounding the circuit portion, wherein the layer containing a hygroscopic substance is provided to be surrounded with the frame, and the first substrate and the second substrate are adhered to each other with a sealant to seal inside the pixel portion, the circuit portion, the layer containing the hygroscopic substance, and the frame.

According to another aspect of a display device of the invention, it comprises a first substrate including a pixel portion provided with a light-emitting element and a circuit portion having a driver circuit; a second substrate; a layer containing a hygroscopic substance; a first frame surrounding the pixel portion and the circuit portion; and a second frame surrounding the pixel portion, wherein the layer containing the hygroscopic substance is provided between the first frame and the second frame, and the first substrate and the second substrate are adhered to each other with a sealant to seal inside the pixel portion, the circuit portion, the layer containing a hygroscopic substance, the first frame, and the second frame.

According to another aspect of a method for manufacturing a display device of the invention, it comprises the steps of forming a light-emitting element over a first substrate; forming a frame to surround the light-emitting element; dropping a composition containing a liquid hygroscopic substance in a region surrounded with the frame; and forming a layer containing a hygroscopic substance by solidifying the composition, wherein the first substrate and a second substrate are adhered to each other with a sealant to seal inside the light-emitting element, the layer containing a hygroscopic substance, and the frame.

According to another aspect of a method for manufacturing a display device of the invention, it comprises the steps of forming a light-emitting element and a driver circuit over a first substrate; forming a frame to surround the driver circuit; forming a sealant to surround the light-emitting element and the driver circuit; dropping a composition containing a liquid hygroscopic substance between the frame and the sealant; and forming a layer containing a hygroscopic substance by solidifying the composition, wherein the first substrate and a second substrate are adhered to each other with the sealant to seal inside the light-emitting element, the driver circuit, the layer containing the hygroscopic substance, and the frame.

According to another aspect of a method for manufacturing a display device of the invention, it comprises the steps of forming a light-emitting element and a driver circuit over a first substrate; forming a frame to surround the light-emitting element and the driver circuit; dropping a composition containing a liquid hygroscopic substance in a region surrounded with the frame; and forming a layer containing a hygroscopic substance by solidifying the composition, wherein the first substrate and a second substrate are adhered to each other with a sealant to seal inside the light-emitting element, the driver circuit, the layer containing a hygroscopic substance, and the frame.

According to another aspect of a method for manufacturing a display device of the invention, it comprises the steps of forming a light-emitting element and a driver circuit over a first substrate; forming a frame to surround the driver circuit; dropping a composition containing a liquid hygroscopic substance in a region surrounded with the frame; and forming a layer containing a hygroscopic substance by solidifying the composition, wherein the first substrate and a second substrate are adhered to each other with a sealant to seal inside the light-emitting element, the driver circuit, the layer containing a hygroscopic substance, and the frame.

According to another aspect of a method for manufacturing a display device of the invention, it comprises the steps of forming a light-emitting element and a driver circuit over a first substrate; forming a first frame to surround the light-emitting element and the driver circuit; forming a second frame to surround the light-emitting element; dropping a composition containing a liquid hygroscopic substance between the first frame and the second frame; and forming a layer containing the hygroscopic substance by solidifying the composition, wherein the first substrate and a second substrate are adhered to each other with a sealant to seal inside the light-emitting element, the driver circuit, the layer containing the hygroscopic substance, the first frame, and the second frame.

Since a display device provided with a desiccant made of a layer containing a hygroscopic substance can be widely provided without decreasing light extraction efficiency according to the invention, the deterioration of a light-emitting element can be prevented due to an adequate hygroscopic effect of the desiccant. In addition, a complicated manufacturing step is not necessary, either. Thus, a highly reliable display device capable of displaying images with high definition and high quality can be manufactured with a favorable yield.

These and other objects, features and advantages of the present invention will become more apparent upon reading of the following detailed description along with the accompanied drawings.

BRIEF DESCRIPTION OF THE DRAWINGS

FIGS. 5A and 5B are views illustrating a method for manufacturing a display device according to certain aspects of the invention;

FIGS. 6A and 6B are views illustrating a display device according to certain aspects of the invention;

FIGS. 7A to 7C are views illustrating a method for manufacturing a display device according to certain aspects of the invention;

FIG. 8 is a view illustrating a display device according to a certain aspect of the invention;

FIG. 11 is a view illustrating a display device according to a certain aspect of the invention;

FIG. 14 is a view illustrating an electronic device to which a certain aspect of the invention is applied;

DETAILED DESCRIPTION OF THE INVENTION

Embodiment Mode 1

Figure 1A:
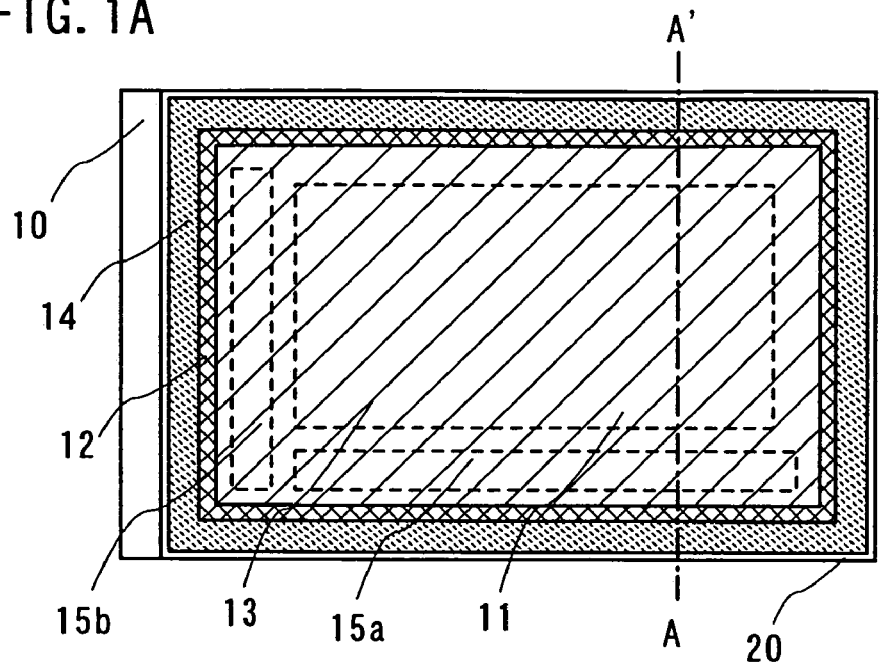
FIGS. 1A to 1C are views illustrating a display device according to certain aspects of the present invention.

Embodiment Mode of the present invention will be described in detail with reference to the accompanying drawings. However, it is to be understood that the invention is not limited to the description below and various changes and modifications will be apparent to those skilled in the art, unless such changes and modifications depart from the content and scope of the invention. Therefore, the invention is not interpreted with limiting to the description in this embodiment mode. Note that the same reference numerals denote the same parts or parts having the same function in different drawings and the explanation will not be repeated in a constitution of the invention hereinafter explained.

Figure 16:
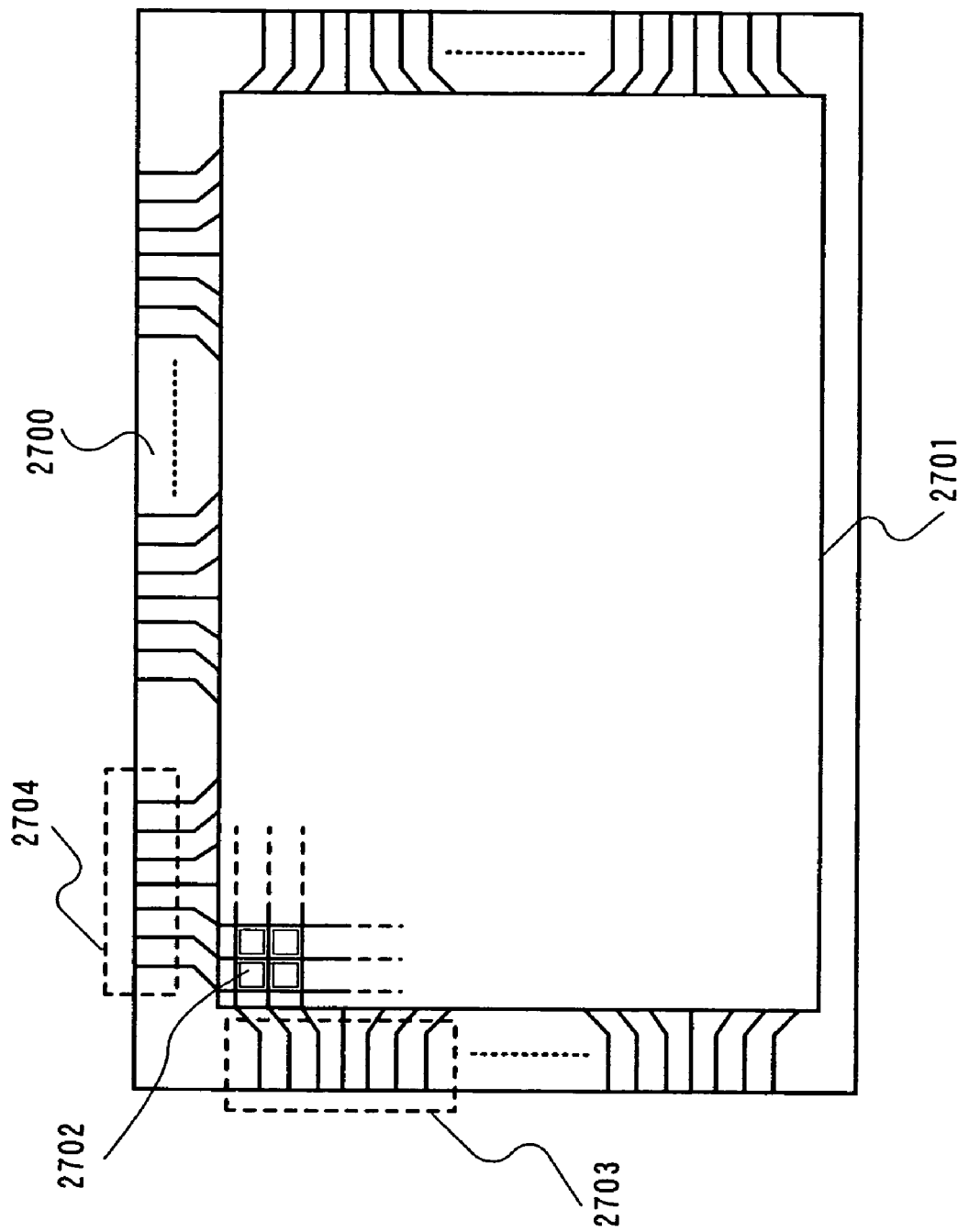
FIG. 16 is a top view of a display device according to a certain aspect of the invention.

FIG. 16 is a top view showing a structure of a display panel according to the invention, where a pixel portion 2701 in which pixels 2702 are arranged in a matrix, a scanning line input terminal 2703, and a signal line input terminal 2704 are formed over a substrate 2700 having an insulating surface. The number of pixels may be provided according to various standards. The number of pixels of XGA may be 1024×768×3 (RGB), that of UXGA may be 1600×1200×3 (RGB), and that of a full-speck high vision to correspond thereto may be 1920×1080×3 (RGB).

The pixels 2702 are arranged in a matrix by intersecting a scanning line extended from the scanning line input terminal 2703 with a signal line extended from the signal line input terminal 2704. Each pixel 2702 is provided with a switching element and a pixel electrode connected thereto. A typical example of the switching element is a TFT. A gate electrode side of the TFT is connected to the scanning line, and a source or drain side thereof is connected to the signal line; therefore, each pixel can be controlled independently by a signal to be inputted from outside.

A semiconductor layer, a gate insulating layer, and a gate electrode layer are given as main components of a TFT. A wiring layer connected to a source region and a drain region formed in the semiconductor layer is concomitant thereof. A top gate type in which a semiconductor layer, a gate insulating layer, and a gate electrode layer are sequentially arranged from the substrate side; a bottom gate type in which a gate electrode layer, a gate insulating layer, and a semiconductor layer are sequentially arranged from the substrate side; or the like is typically known as its structure. However, any one of structures may be applied to the invention.

An amorphous semiconductor (hereinafter also referred to as an "AS") manufactured by a vapor phase growth method using a semiconductor material gas typified by silane or germane or a sputtering method; a polycrystalline semiconductor that is formed by crystallizing the amorphous semiconductor by utilizing light energy or thermal energy; a semi-amorphous (also referred to as microcrystallite or microcrystalline, and hereinafter also referred to as an "SAS") semiconductor; or the like can be used for a material from which a semiconductor layer is formed.

An SAS is a semiconductor with an intermediate structure between an amorphous structure and a crystal structure (including a single crystal and a polycrystal). This is a semiconductor having a third condition that is stable with regard to a free energy, and a crystalline region having a short-range order and lattice distortion is included therein. A crystalline region of from 0.5 nm to 20 nm can be observed at least in a part of regions in the film. When silicon is contained as the main component, Raman spectrum is shifted to a lower frequency side less than 520 $cm^{-1}$. Diffraction peak of (111) or (220) to be caused from a crystal lattice of silicon is observed in X-ray diffraction. At least 1 atomic % or more of hydrogen or halogen is contained to terminate a dangling bond. An SAS is formed by carrying out grow discharge decomposition (plasma CVD) on a silicide gas. In addition to $SiH_4$, $Si_2H_6$, $SiH_2Cl_2$, $SiHCl_3$, $SiCl_4$, $SiF_4$, or the like can be used for the silicide gas. In addition, $GeF_4$ may be mixed. This silicide gas may be diluted with $H_2$ or $H_2$ and one or more of the rare gas element of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or less. It is desirable that an atmospheric constituent impurity such as oxygen, nitrogen, or carbon is $1\times10^{20}$ $cm^{-1}$ or less as an impurity element in the film, specifically an oxygen concentration is $5\times10^{19}$/$cm^3$ or less, preferably $1\times10^{19}$/$cm^3$ or less.

Figure 17:
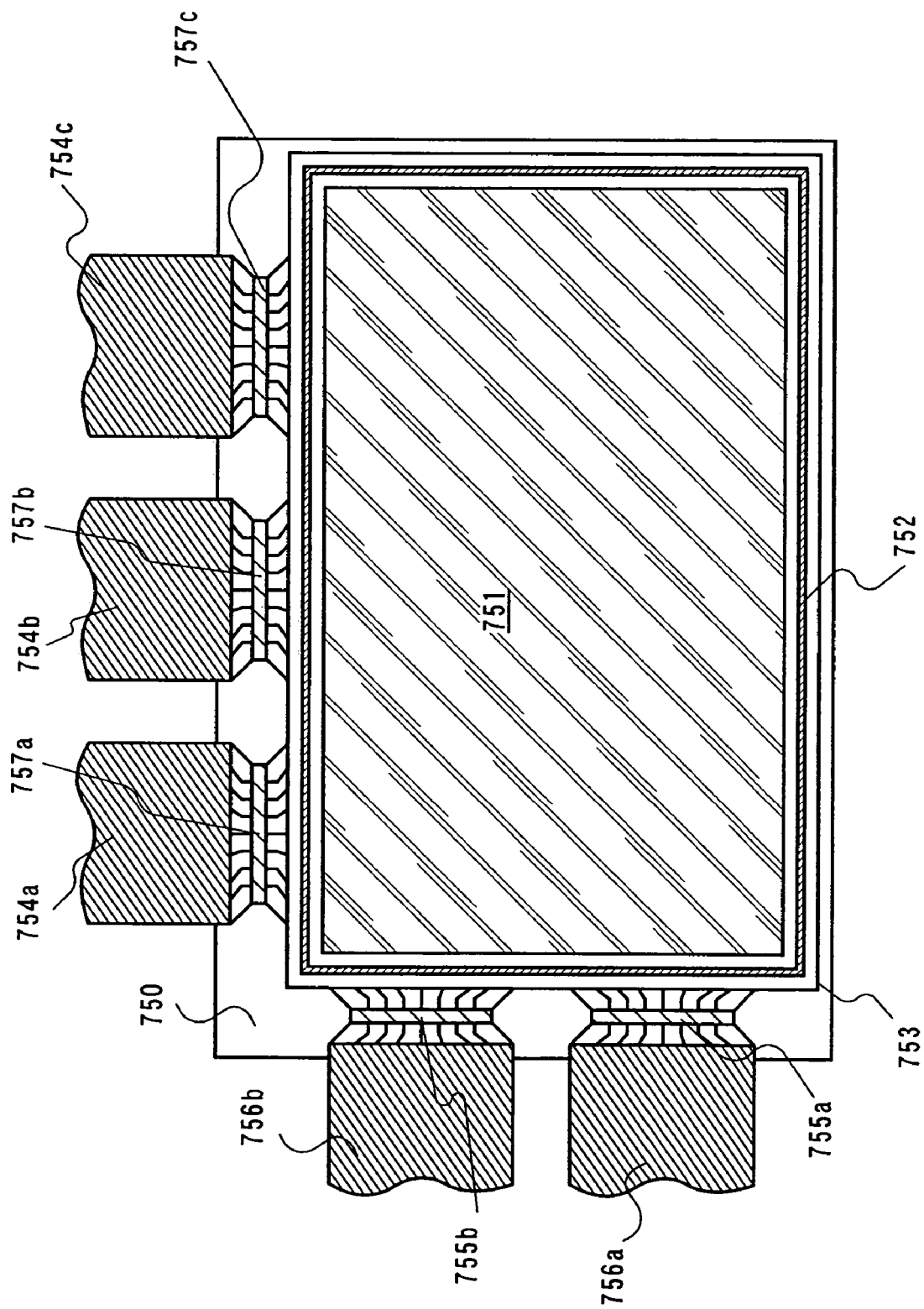
FIG. 17 is a top view of a display device according to a certain aspect of the invention.

FIG. 16 shows a structure of a display panel that controls a signal being inputted into a scanning line and a signal line by an external driver circuit. Driver ICs 755a, 755b, 757a, 757b, and 757c may be mounted on a substrate 750 by COG (Chip on Glass) as shown in FIG. 17. The driver ICs may be formed over a single crystal semiconductor substrate or may be one in which a circuit is formed over a glass substrate of a TFT. In FIG. 17, reference numeral 751 denotes a pixel portion, and the substrate 750 is adhered to a sealing substrate 753 with a sealant 752. The driver ICs 755a, 755b, 757a, 757b, and 757c are mounted on the substrate 750 by COG and are connected to FPCs 756a, 756b, 754a, 754b, and 754c.

Figure 18:
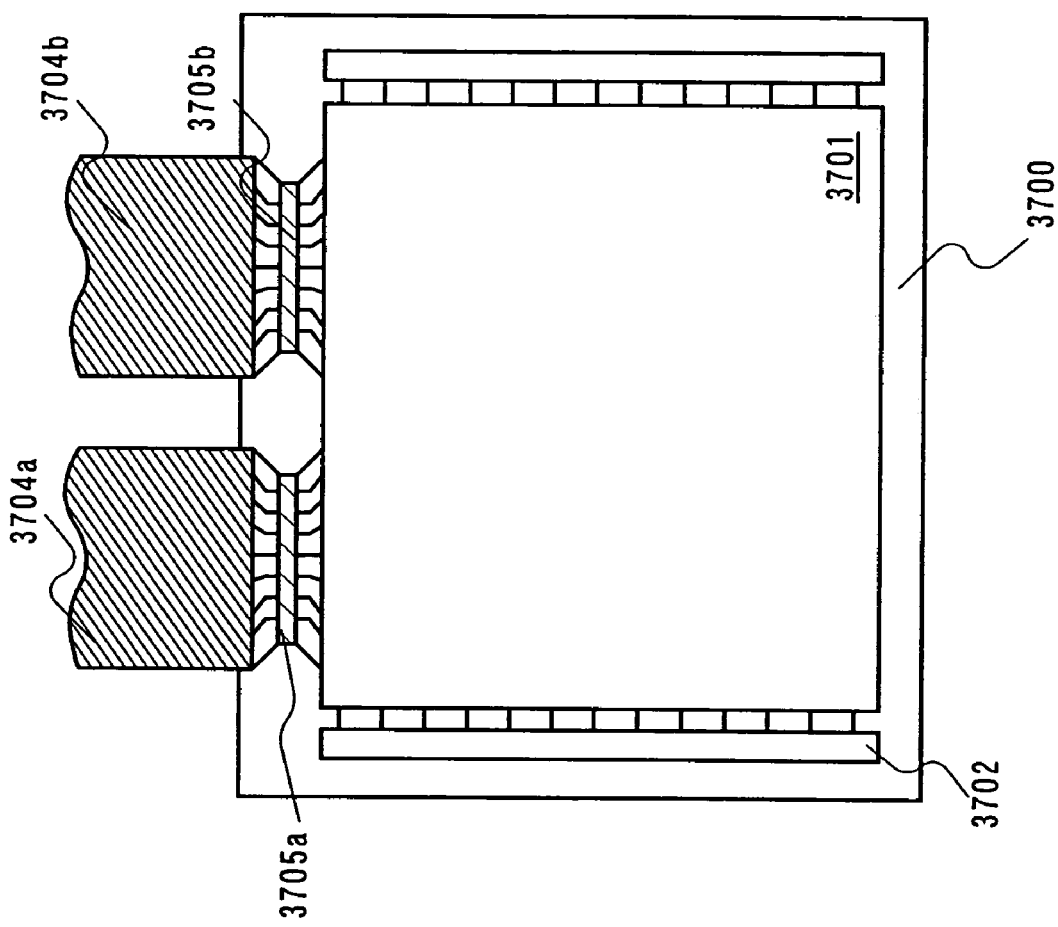
FIG. 18 is a top view of a display device according to a certain aspect of the invention.

In the case of forming a TFT provided for a pixel from an SAS, as shown in FIG. 18, a scanning line driver circuit 3702 can be integrally formed over a substrate 3700 and can be also integrated. In FIG. 18, reference numeral 3701 denotes a pixel portion, and a signal line driver circuit mounts driver ICs 3705a and 3705b by a COG and is connected to FPCs 3704a and 3704b.

Figure 1B:
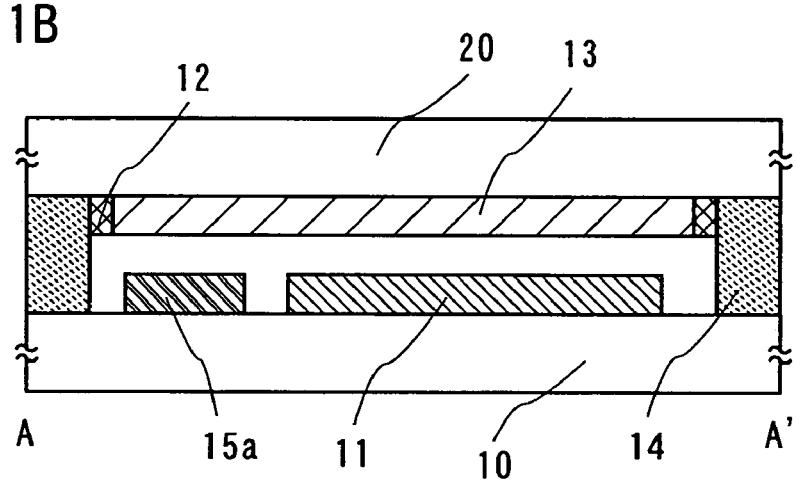
Figure 1C:
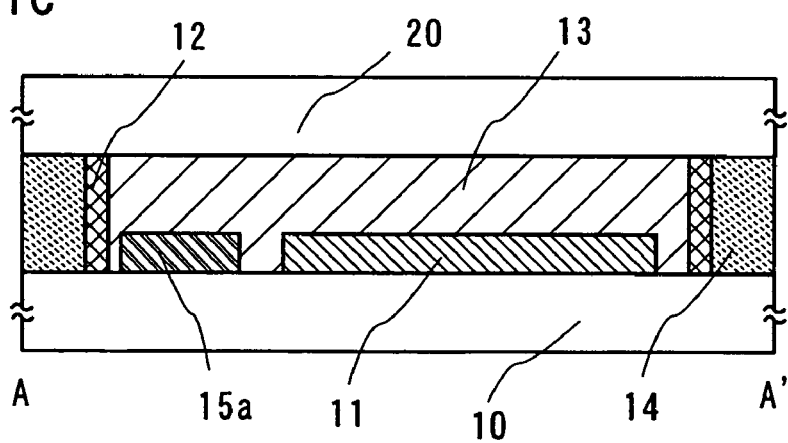

Embodiment mode of the invention is explained with reference to FIGS. 1A to 1C. FIG. 1A is a top view of a display device, FIGS. 1B and 1C are cross-sectional views taken along a line A-A' in FIG. 1A. In addition, FIGS. 1B and 1C are examples in which frames and shapes of a layer containing a hygroscopic substance are different with each other.

According to the invention, a drop method is used in forming a layer containing a hygroscopic substance within a display device. A hygroscopic substance is a substance having properties of absorbing moisture in an atmosphere such as air and has an advantageous effect of absorbing moisture that deteriorates a light-emitting element by being provided within the display device. Since the hygroscopic substance functions as a desiccant, the deterioration of a light-emitting element is prevented and reliability of a display device is improved. According to the invention, a hygroscopic substance is fixed to a sealing substrate or an element substrate, and a composition containing a liquid hygroscopic substance is dropped in a liquid state when a layer containing a hygroscopic substance is formed. For example, a hygroscopic substance dissolved or dispersed in a substance to be a fixing member may be used for a composition containing a liquid hygroscopic substance. At that time, a frame is formed in advance over a sealing substrate or an element substrate to determine a region to be dropped. The frame has a closed shape, and a hygroscopic substance is dropped to the frame.

FIGS. 1A to 1C are one example of a display device of the invention, and reference numeral 10 denotes an element substrate; 11, a pixel portion; 15a and 15b, driver circuit portions; 12, a frame; 13, a layer containing a hygroscopic substance; 14, a sealant; and 20, a sealing substrate.

As shown in FIGS. 1A to 1C, in a display device of the invention, depression is not formed in the sealing substrate, and the frame 12 is formed so as to surround the pixel portion 11 and the driver circuit portions 15a and 15b. The display device is formed so that the light-transmitting layer 13 containing a hygroscopic substance is filled in the surrounded frame. Note that an element portion including the pixel portion 11 and the driver circuit portions 15a and 15b is formed in the element substrate 10. In this embodiment mode, the frame 12 is formed so as to surround a formation region of the pixel portion 11 and the driver circuit portions 15a and 15b; therefore, the layer 13 containing a hygroscopic substance can be formed in a broad area and to be able to absorb moisture in a broad area and thus drying efficiency is high. In the display device of the invention, a layer containing a hygroscopic substance operating as a desiccant can be easily provided in a desired place when the frame 12 is selectively formed. A method for forming the layer containing a hygroscopic substance of the invention is shown in FIG. 3.

Figure 3:
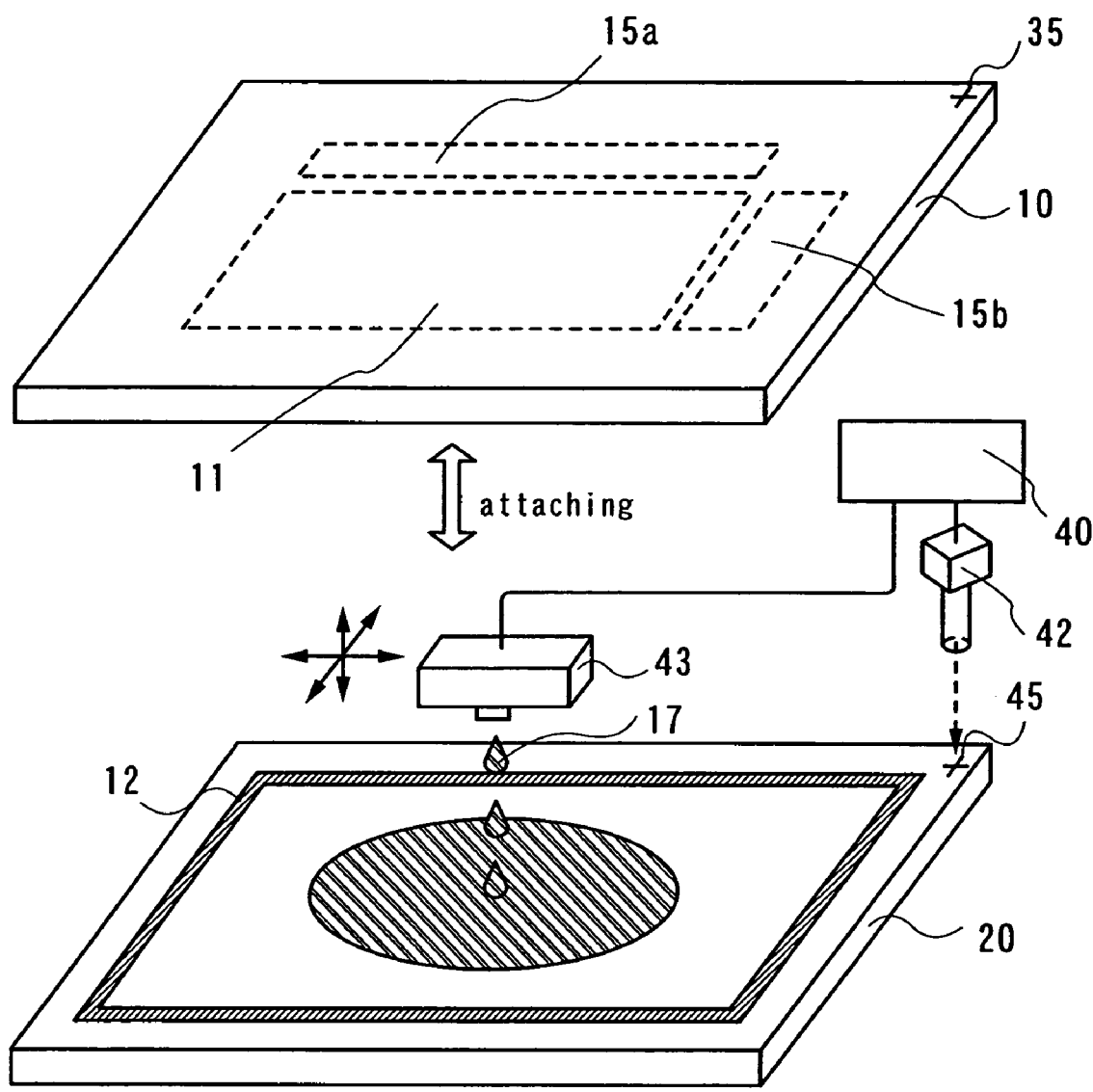
FIG. 3 is a view illustrating a structure of a drop device applicable to the invention.

FIG. 3 is one mode of a drop device of a hygroscopic substance applicable to the invention. Reference numeral 40 denotes a drop control circuit; 42, an imaging means such as a CCD; 45, a marker; and 43, a head. A composition 17 containing a liquid hygroscopic substance is dropped to a sealing substrate 20 from a nozzle of the drop head 43 by the drop control circuit 40. A frame 12 to determine the region of the composition 17 containing the liquid hygroscopic substance is formed over the sealing substrate 20. The composition 17 containing the liquid hygroscopic substance is dropped to the region surrounded with the frame 12, and a layer containing the hygroscopic substance is formed after drying by baking or the like. A composition containing a liquid hygroscopic substance can be dropped within the frame 12 as in this embodiment mode. However, since the liquid composition may be dropped to a region with a closed shape, it can be also dropped to a region surrounded with a frame and a sealant or the like to form a layer containing a hygroscopic substance which is to be a desiccant. In addition, the frame and the layer containing a hygroscopic substance can be formed either on an element substrate side or on a sealing substrate side. The shape of a layer containing a hygroscopic substance can be arbitrarily designed depending on the dimension or the height of a frame. In the display device of FIG. 1B, the frame 12 is formed over the sealing substrate 20 to be lower than the sealant and the layer containing the hygroscopic substance is formed in the frame; therefore, the frame 12 is formed not to be in contact with the element portion of the element substrate. However, when the height of a frame and a sealant is the same as in FIG. 1C, the layer 13 containing the hygroscopic substance can be formed to directly cover the element portion. In this case, the frame may be formed either on the element substrate side or on the sealing substrate side. It is also possible to press a frame and a layer containing a hygroscopic substance with a sealing substrate and an element substrate to be flattened.

In addition, a composition containing a liquid hygroscopic substance may be formed over a substrate by a dispenser method, a droplet discharge method, or a printing method such as a screen-printing method besides a drop method. This embodiment mode mainly describes a drop method in which a small amount of control is likely to be carried out. It is preferable to carry out a step of dropping under an inert gas atmosphere of nitrogen or argon (Ar) or under reduced pressure. There is an advantageous effect that, for example, moisture in a composition is easily removed and a solidifying step is simplified or a composition is easily spread out uniformly since the viscosity in the composition becomes less by dropping a composition under a reduced pressure.

A frame can be formed from silicon oxide, silicon nitride, silicon oxynitride, aluminum oxide, aluminum nitride, aluminum oxynitride, or other inorganic material; acrylic acid, methacrylic acid, and a derivative thereof; an organic material such as polyimide, aromatic polyamide, polybenzimidazole, benzocyclobutene, parylene, flare, or epoxy; an inorganic siloxane based material including a Si—O—Si bond, among the compound made from silicon, oxygen, and hydrogen, formed by using a siloxane-based material as a start material; or an organic siloxane based material in which hydrogen over silicon is substituted by an organic group such as methyl or phenyl. Either a conductive material such as metal or an insulating material such as resin may be adopted since the frame serves as a frame portion of a composition containing a liquid hygroscopic substance. As for the resin material, a resin material such as an epoxy resin, an acrylic resin, a phenol resin, a novolac resin, a polyimide amide resin, a melamine resin, or a urethane resin can be used. In the above resin, either a photosensitive substance such as a photosensitive acrylic or photosensitive polyimide or a non-photosensitive substance such as non-photosensitive acrylic or non-photosensitive polyimide can be used. Alternatively, a commercial available resist material containing a photosensitive agent may be used. For example, a typical positive type resist, that is, a novolac resin and a naphthquinon azide compound which is a photosensitive agent; or a typical negative type resist, that is, base resin, diphenylsilane diol, an acid generation agent, or the like may be used.

Any one of materials is formed to be a closed frame-shape pattern, which is a desired shape. Alternatively, a closed frame-shaped pattern is formed by forming the material to be in contact with a sealant. Patterning can be carried out by dry etching, wet etching, ashing, or the like. In addition, when a resist or a photosensitive substance such as photosensitive acrylic is used as a frame, a resist mask or the like is not necessarily used during patterning; therefore, the step is simplified. In the case of a non-photosensitive substance, a pattern may be formed by dry etching or ashing by using a resist mask or the like. In addition, a frame may be directly formed over a substrate by a dispenser method, a droplet discharge method, or a printing method such as a screen-printing method, and the step is simplified since a patterning step is not necessary.

In addition, the frame may be formed from the same material as the sealant. As the sealant, for example, epoxy resin such as bisphenol A type liquid resin, bisphenol A type solid resin, resin containing bromo-epoxy, bisphenol F type resin, bisphenol AD type resin, phenol type resin, cresol type resin, novolac type resin, cyclic aliphatic epoxy resin, epibis type epoxy resin, glycidyl ether resin, glycidyl amine resin, heterocyclic epoxy resin, or modified epoxy resin can be used.

A hygroscopic substance is dropped in a liquid state having flowability and capable of dropping, that is, in a state of liquid or in a state dissolved in other solvent. The hygroscopic substance is solidified and formed by baking, drying, or the like after being dropped to the frame. Here, solidification refers to losing the flowability. Therefore, a hygroscopic substance may have hygroscopicity in a state fixed over a substrate after dropping. The state fixed to a substrate is that the hygroscopic substance is formed by being fixed over a substrate or the gelled substance losing the flowability may be accepted, too.

In the case of using a light-transmitting layer containing a hygroscopic substance, the light extraction efficiency is not decreased even in a display device in which light is extracted from the sealing substrate side. The layer containing a hygroscopic substance may have light-transmitting properties at the time of a completed mode used as a desiccant in a display device, in other words, at the time of a state where it loses the flowability. Therefore, the layer containing a hygroscopic substance may have not light-transmitting properties at the time of a liquid state having the flowability during being dropped. For example, even a substance dropped in a state of a composition dissolved in a not light-transmitting solvent can be used as long as a hygroscopic substance provided for a sealing substrate as a desiccant has light-transmitting properties, eventually due to the volatilization of the solvent by being baked after being dropped.

Figure 2:
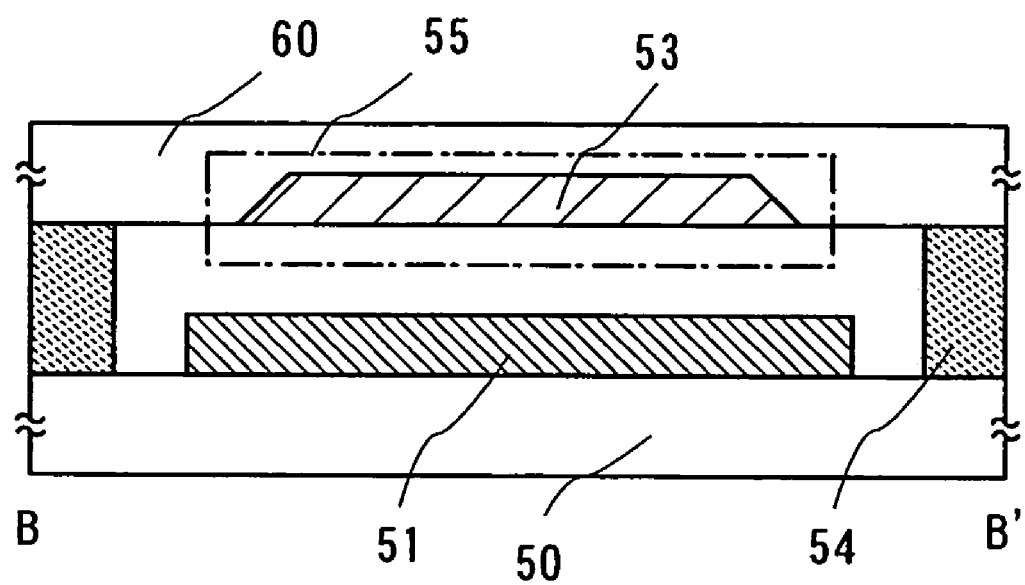
FIG. 2 is a view illustrating a conventional display device.

When a solid desiccant 53 not having light transmitting properties is provided over a pixel portion like in a conventional display device shown in FIG. 2, light extraction efficiency from a sealing substrate side is decreased. Accordingly, when the desiccant is provided except for the pixel portion, the casing of a display device is enlarged, which cause to narrow an area for providing a desiccant resulting in decreasing an adequate effect of a desiccant. In addition, since the distance between a light-emitting layer and a substrate is not constant within the display device due to depression, there is possibility that variation is generated in a display image.

The layer containing a hygroscopic substance in this embodiment mode has light-transmitting properties. Since the light-transmitting layer containing a hygroscopic substance is used, light from a light-emitting layer is not shielded even when the layer containing a hygroscopic substance is formed to cover a pixel portion of a top emission type or dual emission type display device in which light is extracted from a sealing substrate side. Thus, since a hygroscopic substance can be extensively formed in a desired place inside a display device, an adequate absorption effect can be achieved. In addition, the distance between the light-emitting layer and the sealing substrate is constant since depression is not formed in the sealing substrate and thus variation of a display image due to light interference or the like is not generated.

As mentioned above, according to the invention, a display device extensively provided with a hygroscopic substance can be manufactured without decreasing light extraction efficiency; therefore, the deterioration of a light-emitting element can be prevented by an adequate hygroscopic effect of a hygroscopic substance. In addition, a complicated manufacturing step is not necessary either. Thus, a highly reliable display device capable of displaying images with high definition and high quality can be manufactured with a favorable yield.

Embodiment Mode 2

A method for manufacturing a display device of the present invention is explained in detail with reference to FIGS. 4A and 4B, FIGS. 5A and 5B, FIGS. 6A and 6B, and FIGS. 7A to 7C.

A silicon nitride oxide film (SiNO) 101a is formed to have film thicknesses of from 10 nm to 200 nm (preferably, from 50 nm to 100 nm) and a silicon oxynitride film (SiON) 101b is laminated to have film thicknesses of from 50 nm to 200 nm (preferably, from 100 nm to 150 nm) as a base film 101 over a substrate 100 having an insulating surface by a plasma CVD method. A substrate such as a glass substrate, a quartz substrate or a silicon substrate, or a metal substrate or a stainless steel substrate, in which an insulating film is formed on a surface thereof, may be used for the substrate 100. Alternatively, a plastic substrate having a heat resistance that can withstand processing temperature of this embodiment mode may be used, or a flexible substrate like a film may be also used. In addition, a double-layered structure may be used as a base film, or a single-layered film or a structure in which more than two layers of the base (insulating) film are laminated may be used.

Then, a semiconductor film is formed over the base film. The semiconductor film may be formed by a known means (a sputtering method, an LPCVD method, a plasma CVD method, or the like) to have film thicknesses of from 25 nm to 200 nm (preferably, from 30 nm to 150 nm). Materials of the semiconductor film are not limited; however, it is preferably formed from silicon or silicon germanium (SiGe) alloy.

An amorphous semiconductor (typically, hydrogenated amorphous silicon) or a crystalline semiconductor (typically, poly-silicon) is used as a raw material of the semiconductor film. Poly-silicon includes a so-called high temperature poly-silicon using polycrystalline silicon formed through processing temperatures over 800° C. as a main material, a so-called low temperature poly-silicon using polycrystalline silicon formed through processing temperatures under 600° C. as a main material, crystallized silicon crystallized by adding an element which promotes crystallization, or the like.

In addition, a semi-amorphous semiconductor or a semiconductor partly containing a crystal phase in a semiconductor film can be also used for other materials. A semi-amorphous semiconductor is a semiconductor with an intermediate structure between an amorphous and a crystal structure (including a single crystal and a polycrystal). This is a semiconductor having a third condition that is stable with respect to a free energy, and a crystalline semiconductor having a short-range order and lattice distortion. Typically, it is a semiconductor film, containing silicon as the main component and in which Raman spectrum is shifted to a lower frequency side less than 520 cm$^{-1}$ with lattice distortion. In addition, at least 1 atomic % or more of hydrogen or halogen is contained to terminate a dangling bond. Here, such a semiconductor is referred to as a semi-amorphous semiconductor (hereinafter, an "SAS"). This SAS is also referred to as a so-called a microcrystal semiconductor (typically, microcrystal silicon).

This SAS can be obtained by carrying out glow discharge decomposition (plasma CVD) of a silicide gas. A typical silicide gas is $SiH_4$, and besides, $Si_2H_6$, $SiH_2Cl_2$, $SiHCl_3$, $SiCl_4$, $SiF_4$, or the like can be used. In addition, $GeF_4$ and $F_2$ may be mixed. The SAS can be easily formed by using this silicide gas by being diluted with hydrogen or hydrogen and one or more kinds of a rare gas element of helium, argon, krypton, and neon. The dilution ratio of hydrogen to the silicide gas preferably ranges from 2 times to 1000 times, for example, in flow rate. Of course, a SAS may be preferably formed by grow discharge decomposition under a reduced pressure; however, it may be also formed by utilizing the discharge in an atmospheric pressure. Typically, it may be carried out ranging from 0.1 Pa to 133 Pa. A power supply frequency for forming glow discharge ranges from 1 MHz to 120 MHz, preferably from 13 MHz to 60 MHz. High-frequency power may be appropriately set. Heating temperatures of a substrate is preferably 300° C. or less and an SAS can be manufactured at heating temperatures of a substrate from 100° C. to 200° C. Here, an impurity derived from an atmospheric constituent such as oxygen, nitrogen, or carbon as an impurity element mainly taken in during film formation is preferably $1 \times 10^{20}$ cm$^{-3}$ or less, and specifically an oxygen concentration is preferably $5 \times 10^{19}$ cm$^{-3}$ or less, preferably $1 \times 10^{19}$ cm$^{-3}$ or less. Promoting lattice distortion further by making contain a rare gas element such as helium, argon, krypton, or neon increases stability and thus a satisfactory SAS can be obtained. In addition, an SAS layer formed by a hydrogen-based gas may be laminated in an SAS layer formed by a fluorine-based gas as a semiconductor layer.

When a crystalline semiconductor film is used for the semiconductor film, a known method (a laser crystallization method, a thermal crystallization method, or a thermal crystallization method using an element promoting crystallization of nickel or the like) may be used for a method for manufacturing the crystalline semiconductor film. In the case of not introducing an element promoting crystallization, a contained hydrogen concentration in an amorphous silicon film is discharged up to $1 \times 10^{20}$ atoms/cm$^3$ or less by being heated at 500° C. for an hour under the nitrogen atmosphere before irradiating the amorphous silicon film with laser light. This is carried out since an amorphous silicon film containing a plenty of hydrogen is damaged when it is irradiated with laser light.

As a way of introducing a metal element into an amorphous semiconductor film, it is not limited as long as it is a method in which the metal element can be existed in a surface of the amorphous semiconductor film or in an inside thereof. For example, a sputtering method, a CVD method, a plasma treatment method (including a plasma CVD method), an adsorption method, or a method for applying a solution of metal salt can be applied. A method for using a solution among these methods is simple and easy, and useful in respect that a concentration of a metal element is easily adjusted. In addition, at this time, it is desirable to form an oxide film by irradiation of UV light, a thermal oxidation method, treatment by ozone water containing a hydroxyl radical or by hydrogen peroxide, in the oxygen atmosphere, or the like to improve wettability of the surface of the amorphous semiconductor film and to spread out a solution over the entire surface of the amorphous semiconductor film.

In addition, in crystallizing an amorphous semiconductor film, heat treatment and crystallization by laser irradiation may be combined or heat treatment or laser light irradiation may be carried out independently for several times. In the case of carrying out crystallization with two steps of heat treatment and laser light irradiation, heat treatment is carried out at temperatures from 500° C. to 550° C. for 4 hours to 20 hours to crystallize the amorphous semiconductor film (hereinafter, a first crystalline semiconductor film).

Next, a second crystalline semiconductor film is obtained by promoting crystallization by irradiating the first crystalline silicon film with laser light. A laser crystallization method irradiates a semiconductor film with laser light. It is desirable to use a solid-state laser, a gas laser, or a metal laser of a pulsed oscillation or continuous oscillation. Note that a YAG laser, a YVO$_4$ laser, a YLF laser, a YAlO$_3$ laser, a glass laser, a ruby laser, an alexandrite laser, a Ti: sapphire laser, or the like is given as the solid-state laser; an excimer laser, an Ar laser, a Kr laser, a CO$_2$ laser, or the like is given as the gas laser; and a helium cadmium laser, a copper vapor laser, a gold vapor laser, or the like is given as the metal laser. A laser beam may be converted to a harmonic by a nonlinear optical element. As a crystal used for the nonlinear optical element, the one called, for example, LBO, BBO, or KDP; KTP or KB5; or CLBO is superior in terms of conversion efficiency when they are used. The conversion efficiency can be substantially increased by inserting these nonlinear optical elements into a laser resonator. Generally, Nd, Yb, Cr, or the like is doped to the harmonic laser and this is excited and oscillates a laser. A kind of a dopant may be appropriately selected by a practitioner.

In addition, a crystalline semiconductor layer may be formed by directly on the substrate by a linear plasma method. The crystalline semiconductor layer may be selectively formed over the substrate by using a linear plasma method.

An organic semiconductor film using an organic material may be used for the semiconductor. A low molecular weight material, a high molecular weight material, or the like is used for an organic semiconductor and a material such as an organic coloring matter or a conductive high molecular weight material can be used, too.

Doping of a very small amount of an impurity element (boron or phosphorus) is carried out on the semiconductor film thus obtained to control a threshold voltage of a TFT. A crystalline semiconductor layer is used in this embodiment mode.

A first photomask is formed, and semiconductor layers 150, 160, and 170 are formed by patterning treatment using a photolithography method.

A gate insulating film 105 covering the semiconductor layers 150, 160, and 170 is formed. The gate insulating film 105 is formed of an insulating film containing silicon to have film thicknesses of from 40 nm to 150 nm by using a plasma CVD method or a sputtering method. The gate insulating film 105 may be formed from a known material such as an oxide material or nitride material of silicon and it may be either a lamination or a single layer. A three-layered lamination of a silicon nitride film, a silicon oxide film, and a silicon nitride film is used in this embodiment mode. Alternatively, either a single layer of a silicon oxynitride film or a double-layered lamination may be accepted, too. Preferably, a silicon nitride film having a dense film quality is used. Note that a rare gas element such as argon may be contained in a reactive gas and mixed into an insulating film to be formed in order to form a dense insulating film with little gate leak current at a low deposition temperature.

Then, a first conductive film having film thicknesses of from 20 nm to 100 nm and a second conductive film having film thicknesses of 100 nm to 400 nm are laminated as a gate electrode over the gate insulating film 105. The first conductive film and the second conductive film may be formed from an element selected from Ta, W, Ti, Mo, Al, and Cu, or an alloy material or a compound material containing the element as the main component. In addition, a semiconductor film typified by a polycrystalline silicon film in which an impurity element such as phosphorus is doped or an AgPdCu alloy may be used for the first conductive film and the second conductive film. Not being limited to the double-layered structure, for example, a three-layered structure in which a tungsten film having a 50 nm film thickness, an alloy film of aluminum and silicon (Al—Si) having a 500 nm film thickness, and a titanium nitride film having a 30 nm film thickness are sequentially laminated may be used, too. In the case of a three-layered structure, tungsten nitride may be used instead of tungsten of the first conductive film, an alloy film of aluminum and titanium (Al—Ti) may be used instead of an alloy film of aluminum and silicon (Al—Si) of the second conductive film, or a titanium film may be used instead of a titanium nitride film of the third conductive film. Alternatively, a single-layered structure may be applied, too.

Next, a second photomask made from a resist is formed by using a photolithography method and first etching treatment for forming an electrode and a wiring is carried out. The first conductive film and the second conductive film can be etched in a desired taper shape by appropriately adjusting an etching condition (an amount of electric power applied to a coil-shaped electrode, an amount of electric power applied to an electrode of a substrate side, an electrode temperature of a substrate side, or the like) by using an ICP (Inductively Coupled Plasma) etching method. Note that a chlorine-based gas such as $Cl_2$, $BCl_3$, $SiCl_4$ or $CCl_4$; a fluorine-based gas such as $CF_4$, $SF_6$, or $NF_3$; or $O_2$ can be appropriately used as the etching gas.

A first-shaped conductive layer made of the first conductive layer and the second conductive layer (the first conductive layer and the second conductive layer) is formed according to the first etching treatment.

Then, second etching treatment is carried out without removing the resist mask. Here, the W film is selectively etched. At this time, the second conductive layer is formed by the second etching treatment. On the other hand, a second-shaped conductive layer is formed with the first conductive layer which is hardly etched. Accordingly, conductive layers 151, 152, 161, 162, 171, and 172 are formed. In addition, conductive layers 181, 182 are also formed in a terminal portion in which external electrical connection is carried out in the same step. The conductive layers are formed by dry etching in this embodiment mode; however, they may be formed by wet etching.

Then, a resist mask is newly formed by using a third photomask after removing the resist mask. Since an n-channel type TFT is to be formed, a first doping step to dope an impurity element imparting n-type conductivity to a semiconductor (typically, phosphorus (P) or As) in a low concentration is carried out. The resist mask covers a region to be a p-channel type TFT and a vicinity of the conductive layers. Through dope is carried out through an insulating layer by this first doping step, and a low concentration impurity region is formed. One light-emitting element is driven with a plurality of TFTs; however, the above doping step is not particularly necessary when it is driven only with a p-channel type TFT.

Then, a resist mask is newly formed by using a fourth photomask after removing the resist mask. A second doping step to dope an impurity element imparting p-type conductivity to a semiconductor (typically, boron (B)) in a high concentration is carried out. Through dope is carried out through the gate insulating layer 105 by this second doping step, and p-type impurity regions 153 and 173 are formed.

Then, a resist mask is newly formed by using a fifth photomask. Here, since an n-channel type TFT is to be formed, a third doping step to dope an impurity element imparting n-type conductivity to a semiconductor (typically, phosphorus or As) in a high concentration is carried out. An ion doping method in the third doping step is carried out under a condition of dose amounts of from $1 \times 10^{13}$ to $5 \times 10^{15}/cm^2$ and accelerating voltages of from 60 keV to 100 keV. A region to be a p-channel type TFT is covered with the resist mask. Through dope is carried out through the gate insulating layer 105 by this third doping step, and an n-type low concentration impurity region 163 and a high concentration impurity region 164 are formed.

An impurity region is formed in each semiconductor layer according to the above-mentioned steps.

Then, an insulating film 108 containing hydrogen is formed as a passivation film after removing the resist mask. This insulating film 108 is formed of an insulating film containing silicon to have film thicknesses of from 100 nm to 200 nm by using a plasma CVD method or a sputtering method. The insulating film 108 is not limited to a silicon nitride film, and a silicon nitride oxide (SiNO) film using plasma CVD may be used or an insulating film containing other silicon may be used as a single layer or a laminated structure.

Furthermore, a step of hydrogenating the semiconductor layers is carried out by carrying out heat treatment at temperatures from 300° C. to 550° C., preferably from 400° C. to 500° C., for from an hour to 12 hours in the nitrogen atmosphere. This is a step of terminating a dangling bond of the semiconductor layers by hydrogen contained in the insulating film 108.

The insulating film 108 can be formed from the material selected from the substance containing silicon nitride, silicon oxide, silicon oxynitride (SiON), silicon nitride oxide (SiNO), aluminum nitride (AlN), aluminum oxynitride (AlON), aluminum nitride oxide (AlNO) of which oxygen content is larger than nitrogen content, aluminum oxide, diamond like carbon (DLC), and a carbon film containing nitrogen (CN). In addition, a material, in which a framework structure is constituted by bonding silicon (Si) and oxygen (O), at least containing hydrogen in a substituent or a material at least one kind of fluorine, alkyl, or aromatic hydrocarbon is included in the substituent may be used.

Heat treatment, irradiation of intense light, or irradiation of laser light may be carried out to activate the impurity elements. Plasma damage to the gate insulating film or plasma damage to the interface between the gate insulating film and the semiconductor layers can be recovered simultaneously with the activation.

Then, an insulating layer 109 to be as an interlayer insulating film is formed. According to the invention, an interlayer insulating film provided for planarizing is required to have high heat resistance and insulation and to have a high planarizing ratio. Thus, a heat-resistant planarizing film is preferable. It is preferable to use an application method typified by a spin coating method as a method for forming such an insulating layer.

In this embodiment mode, an application film using a material, in which a framework structure is constituted by bonding silicon (Si) and oxygen (O), at least one kind of hydrogen, fluorine, alkyl, or aromatic hydrocarbon may be included in the substituent is used as the material of the insulating layer 109. The film after bake can be referred to as a silicon oxide film containing alkyl (SiOx). This silicon oxide film containing alkyl (SiOx) has high light transmitting properties and even can withstand heat treatment of 300° C. or more.

In this embodiment mode, as a method for forming the insulating layer 109 by an application method, first, thinner pre-wet treatment is carried out to improve wettability after carrying out cleaning with deionized water. Then, a liquid law material referred to as varnish in which a low molecular weight component (precursor) having a bond of silicon (Si) and oxygen (O) is dissolved in a solvent is applied over a substrate by a spin coating method or the like. Thereafter, a thin film can be obtained by heating the varnish as well as the substrate and progressing vaporization (evaporation) of the solvent and cross-linking reaction of the low molecular weight component. Then, the application film of the periphery portion on the edge of the substrate where the application film is formed is removed. In addition, when an insulating layer (bank) is formed, it may be patterned to obtain a desired shape. The film thickness is controlled depending on the number of spin rotations, a period of rotation, a concentration of varnish, and viscosity.

Here, a procedure of forming the insulating layer 109 is explained in detail.

First, pure water washing of a substrate to be treated is carried out. Megasonic washing may be carried out. Next, a temperature of the substrate is kept constant by cooling for 120 seconds with a water-cooled plate after carrying out dehydrate baking for 110 seconds at 140° C. Next, the substrate is transferred to and placed in a spinning applying apparatus.

The spinning applying apparatus has a nozzle and an application cup. It has a mechanism in which the solution of material to be applied is dropped to the substrate, the substrate is placed horizontally in the application cup, and the entire apparatus rotates by each cup. In addition, the application cup has a mechanism in which the pressure of atmosphere therein can be controlled.

Next, pre-wet application is carried out to improve wettability by using an organic solvent such as thinner (a volatile mixture solvent formed by mixing aromatic hydrocarbon (toluene or the like), alcohols, ester acetate or the like). Thinner is thrown off by spinning the substrate with high speed (rotation rate, 450 rpm), after spreading the thinner thoroughly with centrifugal force by spinning the substrate (rotation rate 100 rpm) while dropping 70 ml of the thinner.

Subsequently, the solution of the material to be applied prepared by dissolving siloxane system polymer in a solvent (propylene glycolmonomethyl ether) is thoroughly spread by centrifugal force with gradually spinning (rotation rate from 0 rpm to 1000 rpm) the substrate and dropping the solution of the material to be applied from the nozzle. Siloxane can be classified into, for example, silica glass, an alkyl siloxane polymer, an alkyl silsesquioxane polymer, a hydrogenated silsesquioxane polymer, a hydrogenated alkyl silsesquioxane polymer, or the like, according to the structure thereof. As examples of the siloxane polymer, there are a coating material for an insulating film such as #PSB-K1 and #PSB-K31 manufactured by Toray Industries, Inc., and a coating material for an insulating film such as #ZRS-5PH manufactured by Catalysts & Chemicals Industries Co., Ltd. The substrate is left for about 30 minutes. Then, the substrate is gradually spun again (the rotation number is increased from 0 rpm to 1,400 rpm) so as to level the surface of the coating film.

Then, inside of the application cup is exhausted to decompress, then reduced-pressure drying is carried out for within 1 minute.

Then, edge-removing treatment is carried out by an edge remover equipped in the spinning applying apparatus. The edge remover is equipped with a means for driving which moves in parallel along the periphery of the substrate. In the edge remover, a thinner spraying nozzle is provided to sandwich one side of the substrate, and a circumference of the application film is dissolved by the thinner. Accordingly, the application film in the circumference of the substrate edge face is removed by exhausting liquid and gas.

Thereafter, pre-baking is carried out by carrying out baking at 110° C. for 170 seconds.

Then, the substrate is transferred from the spinning applying apparatus and cooled. Then, baking is further carried out at 270° C. for an hour.

Thus, the insulating layer 109 is formed.

In addition, the insulating layer 109 may be formed by a droplet discharge method. A material solution can be saved when a droplet discharge method is applied. In addition, according to the invention, not only the insulating layer 109 but also a conductive layer, which forms a wiring or an electrode, and a pattern necessary for manufacturing a display panel such as a mask for forming a predetermined pattern may be formed by a method capable of selectively forming a pattern like a droplet discharge method. A predetermined pattern (a conductive layer, an insulating layer, or the like) can be formed by a droplet discharge method (also referred to as a ink-jet method by the system to be applied) by selectively discharging a droplet of a composition of a particular object. At this time, pretreatment to form a titanium oxide film or the like in a region to be formed may be carried out. In addition, a method in which the pattern can be transferred or drawn, for example, a printing method (a method in which a pattern is formed such as screen printing or offset printing) or the like can be also used.

In addition to an insulating film in which a framework structure is constituted by bonding silicon (Si) and oxygen (O), the insulating layer 109 can be also formed by using a film made from a kind or a plurality of kinds or a lamination thereof of an inorganic material (silicon oxide, silicon nitride, silicon oxynitride, silicon nitride oxide, or the like), a photosensitive or non-photosensitive organic material (organic resin material) (polyimide, acrylic, polyamide, polyimidamide, resist, or benzocyclobutene), or a Low k material having low dielectric constant, as long as they have high heat resistance and satisfactory planarity.

Figure 4A:
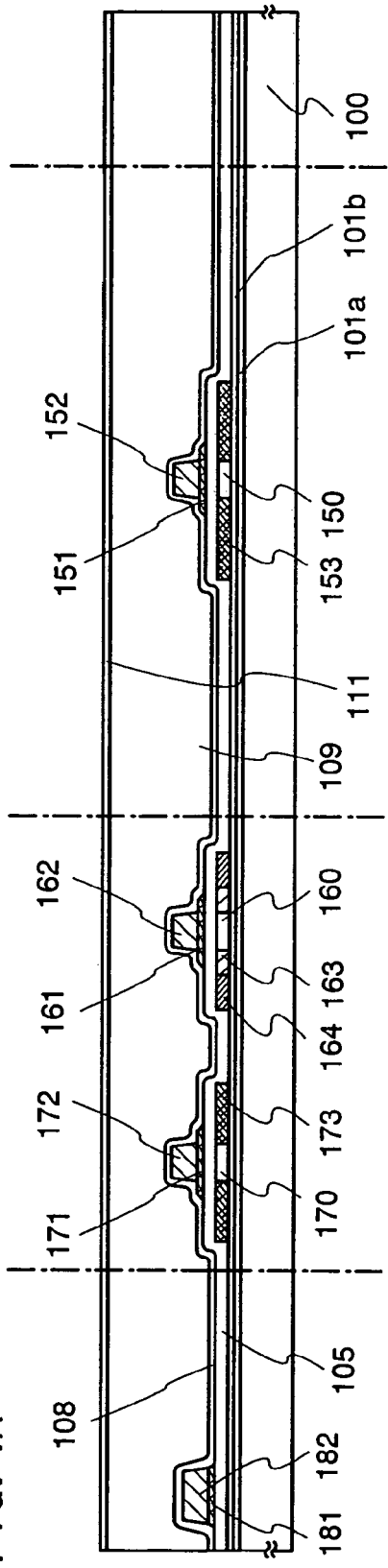
FIGS. 4A and 4B are views illustrating a method for manufacturing a display device according to certain aspects of the invention.

Then, an insulating layer 111 is formed as a passivation film (see FIG. 4A). This insulating layer 111 is formed of an insulating layer containing silicon to have film thicknesses of from 100 nm to 200 nm by using a plasma CVD method or a sputtering method. This insulating layer 111 also functions as an etching stopper film to protect the insulating layer 109 which is an interlayer insulating film while patterning an electrode layer 112 (also used as a drain electrode or a source electrode) in the latter steps.

Of course, the insulating layer 111 is not limited to a silicon oxynitride film, and an insulating film containing other silicon may be also used as a single layer or a laminated structure. In this embodiment mode, a silicon nitride film formed by a plasma CVD method is used; however, a silicon nitride oxide (SiNO) film formed by a plasma CVD method may be also used. In this embodiment mode, Ar in the film has a concentration of approximately from $5 \times 10^{18}$ atoms/cm$^3$ to $5 \times 10^{20}$ atoms/cm$^3$.

The insulating layer 111 can be formed from silicon nitride, silicon oxide, silicon oxynitride (SiON), silicon nitride oxide (SiNO), aluminum nitride (AlN), aluminum oxynitride (AlON), aluminum nitride oxide (AlNO) of which oxygen content is larger than nitrogen content, or the material selected from the substance containing aluminum oxide, diamond like carbon (DLC), and a carbon film containing nitrogen (CN). In addition, as like in this embodiment mode, a material, in which a framework structure is constituted by bonding silicon (Si) and oxygen (O), at least containing hydrogen in a substituent or a material at least one kind of fluorine, alkyl, or aromatic hydrocarbon is included in the substituent may be used.

Then, a contact hole (an opening) is formed in the insulating film 108, the insulating layer 109, and the insulating layer 111 by using a resist mask and at the same time the insulating layer at a periphery portion is removed. Inert gas may be added to an etching gas to be used. An element of one of more of He, Ne, Ar, Kr, and Xe can be used for an inert element to be used. Specifically, it is preferable to use argon having a comparatively large atomic radius and which is inexpensive. In this embodiment mode, $CF_4$, $O_2$, He, and Ar are used. An etching condition during dry etching is set that a flow rate of $CF_4$ to be 380 sccm; a flow rate of $O_2$, 290 sccm; a flow rate of He, 500 sccm; a flow rate of Ar, 500 sccm; a RF power, 3000 W; and a pressure, 25 Pa. According to the above condition, an etching residue can be decreased.

Here, a contact hole in the insulating layer 109 may be formed to have a taper shape. The taper shape may be formed by etching the insulating layer 109 just once or by etching it for several times. A taper shape is formed by carrying out second dry etching, further using $CF_4$, $O_2$, and He setting a flow rate of $CF_4$ to be 550 sccm; a flow rate of $O_2$, 450 sccm; a flow rate of He, 350 sccm; a RF power, 3000 W; and a pressure, 25 Pa. A taper angle θ on the edge of the insulating layer 109 is preferable to be more than 30° and less than 75°.

The gate insulating film 105 is etched to form an opening that reaches a source region and a drain region. The opening may be formed by forming a mask again after etching the insulating layer 109 or by etching the insulating film 108 and the gate insulating film 105 by using the etched insulating layer 109 as a mask. Etching treatment of the gate insulating film 105 is carried out by using $CHF_3$ and Ar as an etching gas. According to the etching under the above condition, an etching residue can be decreased and a contact hole with high planarity and less depression and projection can be formed. Note that an etching time may be increased by approximately from 10% to 20% to carry out etching without leaving residue over the semiconductor layer.

The electrode layer 112 electrically connected to each impurity region is formed by forming a conductive film and etching the conductive film. The electrode layer 112 also functions as a source electrode and a drain electrode. A film made from an element of aluminum (Al), titanium (Ti), molybdenum (Mo), tungsten (W), or silicon (Si) or an alloy film using these elements may be used for the conductive film 112. Note that, after sequentially laminating TiN, Al, and TiN each to have film thicknesses of 100 nm, 350 nm, and 100 nm, the electrode layer 112 is formed to have a pattern in a desired shape. TiN is one of the materials having satisfactory adhesiveness with the insulating layer. Thus, the film is unlikely to be peeled off. In addition, it is preferable to set an N content in TiN to be less than 44 atomic % to be in contact with the source region or the drain region of the TFT. More preferably, an N content in TiN is more than 7 atomic % and less than 44 atomic %. In addition, the step may be simplified with a double-layered structure of TiN/Al of the conductive film.

Using $BCl_3$ and $Cl_2$ by applying an ICP (Inductively Coupled Plasma) etching method, etching is carried out under an etching condition under which an amount of an electric power applied to a coil-shaped electrode is 450 W; an amount of electric power applied to an electrode of a substrate side, 100 W; and a pressure, 1.9 Pa. At this time, the insulating layer 111 that is formed first serves as an etching stopper. The electrode layer 112 and the insulating layer 111 are chosen to have a high selection ratio. Accordingly, there is no residue on the surface of the insulating layer 111 and can have good planarity thereof even after etching the electrode layer Disconnection, short-circuit, or the like of an electrode can be prevented and thus reliability of a display device is improved by having good planarity of the insulating layer 111 even when a first electrode 113 is formed over the insulating layer 111 as a pixel electrode.

Figure 4B:
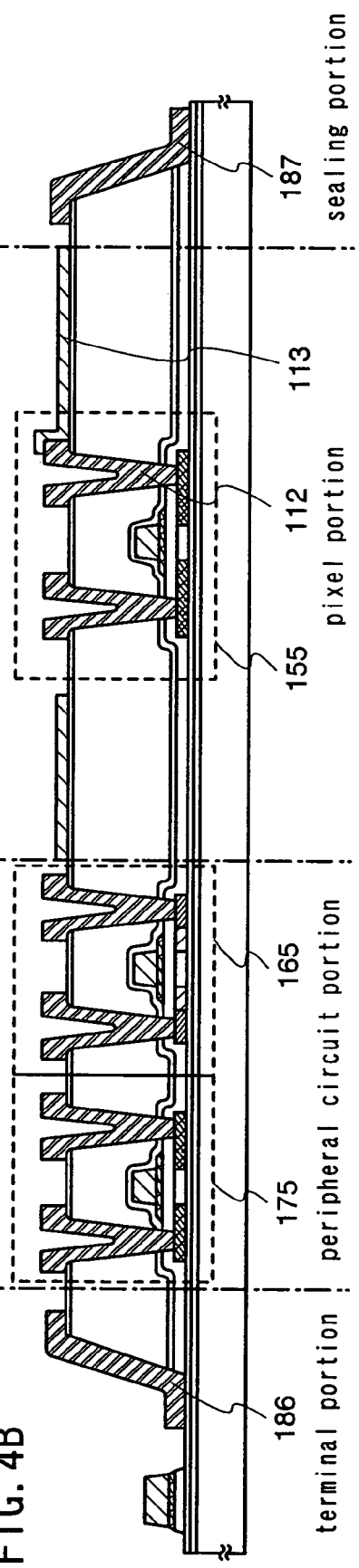

In addition, the insulating layer of the terminal portion is simultaneously removed by etching during patterning of the insulating film 108 and the insulating layers 109 and 111, and thus, the conductive layers 181 and 182 are exposed. Wiring layers 186 and 187 are simultaneously formed from the same material in a step of forming the electrode layer 112 in this embodiment mode. At that time, as shown in FIGS. 4A and 4B, the wiring layers 186 and 187 are formed in the terminal portion and the sealing portion to cover the outside end faces of the insulating film 108 and the insulating layers 109 and 111. Accordingly, a display device can be prevented from penetrating exterior moisture therein by the wiring layers 186 and 187. When the outside end faces of the insulating film 108, the insulating layer 109, and the insulating layer 111 are formed to have inclination (a taper shape), the coverage of the wiring layers 186 and 187 is improved. A taper angle thereof is preferable to be more than 30° and less than 70°.

Through the above-mentioned steps, an (active matrix) element substrate provided with TFTs 155, 165, and 175 is completed. In this embodiment mode, only the p-channel TFT is shown in a pixel region; however, it may have an n-channel type TFT. Alternatively, the TFT may be a single-gate structure in which one channel-formation region is formed, a double-gate structure in which two channel-formation regions are formed, or a triple-gate structure in which three channel-formation regions is formed. In addition, the TFT in a driver circuit portion may be a single-gate structure, a double-gate structure, or a triple-gate structure, too.

Note that a method for manufacturing a TFT is not limited to the one shown in this embodiment mode, and the invention is also applicable to a top gate type (a planar type), a bottom gate type (a reverse stagger type), a dual-gate type having two gate electrodes over and below a channel region through an insulating film, or other structures.

Next, the first electrode (also referred to as pixel electrode) 113 is formed to be in contact with the electrode layer 112. The first electrode functions as an anode or a cathode, and a film containing an element selected from Ti, TiN, $TiSi_xN_y$, Ni, W, $WSi_x$, $WN_x$, $WSi_xN_y$, NbN, Cr, Pt, Zn, Sn, In, and Mo or an alloy material containing the elements as the main component or the compound material or a laminated film thereof may be used ranging from 100 nm to 800 nm. The first electrode 113 can be also selectively formed over the insulating layer 109 before forming the electrode layer 112. In this case, in this embodiment mode, a connection structure of the electrode layer 112 and the first electrode 113 is a structure in which the electrode layer 112 is laminated over the first electrode 113. By forming the first electrode 113 before the electrode layer 112, a planar formation region can be formed; therefore, the first electrode 113 can be formed with good planarity since good coverage and deposition properties can be obtained and polishing treatment such as CMP can be carried out sufficiently. In addition, the first electrode 113 functions as an etching stopper while patterning the electrode layer 112; therefore, there is an advantageous effect that it is not necessary to provide an etching stopper separately and thus the step can be simplified.

The first electrode 113 has light-transmitting properties since it has a structure in which a light-emitting element is used as a display element and light from the light-emitting element is extracted from the side of the first electrode in this embodiment mode. The first electrode 113 is formed by forming a transparent conductive film and etching to have a desired shape. In addition to ITO, IZO, or ITSO, a transparent conductive film in which 2 wt. % to 20 wt. % of zinc oxide (ZnO) is mixed into indium oxide can be used as the first electrode 113. In addition to the above transparent conductive film, a titanium nitride film or a titanium film may be used as the first electrode 113. In this case, the titanium nitride film or the titanium film is formed in a film thickness that transmits light (preferably, approximately from 5 nm to 30 nm) after forming the transparent conductive film. In this embodiment mode, ITSO is used as the first electrode 113. Like ITO, ITSO is not crystallized even bake is carried out and is kept in an amorphous state. Therefore, ITSO has high planarity than ITO and thus short-circuit with a cathode is unlikely to be generated even when a layer containing an organic compound is thin. The first electrode 113 may be cleaned or polished with a CMP method and a polyvinyl alcohol-based porous material so that the surface thereof is flattened. In addition, after polishing using a CMP method, ultraviolet ray irradiation, oxygen plasma treatment, or the like may be carried out on the surface of the first electrode 113.

Next, an insulator (an insulating layer) 114 covering the edge of the first electrode 113 and the electrode layer 112 (also referred to as a bank, a sidewall, a barrier, an embankment, or the like) is formed. A SOG film (for example, a $SiO_X$ film containing alkyl) obtained by an application method is used ranging from 0.8 μm to 1 μm. Either dry etching or wet etching can be used, and here the insulator 114 is formed by dry etching using a mixed gas of $CF_4$, $O_2$, and He (see FIG. 5A). The dry etching is carried out under a pressure of 5 Pa, a RF power of 1500 W, a flow rate of $CF_4$ to be 25 sccm, a flow rate of $O_2$ to be 25 sccm, and a flow rate of He to be 50 sccm. In this dry etching, an etching rate of a $SiO_X$ film containing alkyl is 500 nm/min to 600 nm/min, and, on the other hand, an etching rate of an ITSO film is 10 nm/min or less and thus an adequate selection ratio can be obtained. In addition, since the electrode layer 112 is covered with the insulator 114 made from the SiOx film containing alkyl, a TiN film with good adhesiveness serves as the top surface. In addition to an insulating film in which a framework structure is constituted by bonding silicon (Si) and oxygen (O), the insulator 114 can be also formed by using a film made from a kind or a plurality of kinds or a lamination thereof of an inorganic material (silicon oxide, silicon nitride, silicon oxynitride, silicon nitride oxide, or the like), a photosensitive or non-photosensitive organic material (organic resin material) (polyimide, acrylic, polyamide, polyimidamide, resist, or benzocyclobutene), or a Low k material having low dielectric constant, as long as they have high heat resistance and satisfactory planarity. When the same material used for the insulating layer 109 which is to be an interlayer insulating film and the insulator 114 to be a bank, a manufacturing cost can be reduced. In addition, cost down can be achieved by communizing an apparatus such as application coating apparatus, an etching apparatus, or the like.

It is preferable to deaerate before forming a light-emitting layer (organic compound layer) 119 by carrying out vacuum-heating to improve reliability. For example, it is desirable to carry out heat treatment at temperatures from 200° C. to 300° C. under a reduced pressure atmosphere or an inert atmosphere before carrying out vapor deposition of an organic compound material in order to remove gas contained in the substrate. Since the interlayer insulating film and the insulating layer (bank) are formed from a SiOx film having high heat resistance, there is no problem even heat treatment at a high temperature is applied. Therefore, a step for improving reliability by heat treatment can be carried out adequately.

According to the invention, a light-emitting element made from EL materials (also refereed to as an Electroluminescence element) is used as a display element of a display device. It is said that an EL element emits luminescence by recombining a hole injected from an anode and an electron injected from a cathode at the luminescence center in an organic compound layer to form a molecular exciton and discharging energy when the molecular exciton returns to a ground state by applying voltage between a pair of electrodes. A singlet excitation state and a triplet excitation state are known as an excited state, and it is considered that luminescence can be obtained by undergoing either excited state.

The light-emitting layer 119 is formed over the first electrode 113. Note that although only one pixel is shown in FIGS. 5A and 5B, light-emitting layers corresponding to each color of R (red), G (green), and B (blue) are separately formed in this embodiment mode. In this embodiment mode, as the light-emitting layer 119, materials which show luminescence of each color of red (R), green (G), and blue (B), are selectively formed by a vapor deposition method using a vapor-deposition mask for each, or the like. The materials, which show luminescence of each color red (R), green (G), and blue (B), can be also formed by a droplet discharge method (a low molecular or high molecular weight materials or the like) and, in this case, separate coating of RGB can be preferably carried out as the light-emitting layer without using a mask. In addition, all of each luminescence may be luminescence returning from a singlet excitation state to a ground state (fluorescence), may be luminescence returning from a triplet excitation state to a ground state (phosphorescence), or may have combination in which one color is fluorescence (or phosphorescence) and the other two colors are phosphorescence (or fluorescence). Phosphorescence may be used only for R and fluorescence may be used for G and B, too. Specifically, a laminated structure in which a copper phthalocyanine (CuPc) film having a 20 nm film thickness is provided and tris-8-quinolinolatoaluminum complex ($Alq_3$) film having a 70 nm film thickness is provided thereover as a light-emitting layer may be also applied. A luminescent color can be controlled by adding a fluorescent dye such as quinacridon, perylene, or DCM1 into $Alq_3$.

However, the above-mentioned example is one example of the organic light-emitting material that can be used as a light-emitting layer, and there is no necessity at all to be limited thereto. A light-emitting layer (a layer to emit luminescence and to move a carrier for it) may be formed by arbitrarily combining a light-emitting layer, a charge transport layer, or a charge injection layer. For example, an example in which a low molecular weight organic light-emitting material is used as a light-emitting layer is shown in this embodiment mode; however, a middle molecular weight organic light-emitting material or a high molecular weight organic light emitting material may be used. Throughout this specification, an organic light-emitting material which does not sublimate and a number of molecules of 20 or less or having a chained molecule length of 10 μm or less is defined as the intermediate molecular weight organic light-emitting material. In addition, as an example of using a high molecular weight organic light-emitting material, a laminated structure having a polythiophene (PEDOT) film provided by spin coating with a film thickness of 20 nm as the hole injection layer and a paraphenylene-vinylene (PPV) film with a thickness of approximately 100 nm provided thereover as the light emitting layer may be given. In addition, emission wavelength can be selected from red through blue by using π-conjugated polymer of PPV. An inorganic material such as silicon carbide can be used for the charge transport layer or the charge injection layer. The organic light-emitting materials and inorganic materials can use known materials.

Specifically, the above-mentioned CuPc or PEDOT is used as the charge injection layer; α-NPD, a hole transport layer; BCP or $Alq_3$, an electron transport layer; and BCP: Li or $CaF_2$, an electron injection layer are used each. When light-transmitting ITO or ITSO is used for the second electrode in the case of a dual emission type or a top emission type like in this embodiment mode, BzOS—Li in which Li is added into a benzoxazole derivative (BzOS), or the like can be used. In addition, Alq$_3$ doped with dopant corresponding to each luminescent color of R, G, and B (DCM or the like in the case of R and DMQD or the like in the case of G) may be used for, for example, EML.

As the light-emitting layer, hole injectability can be improved by carrying out co-evaporation on oxide such as molybdenum oxide (MoOx: x=2 to 3) or the like and α-NPD or rubrene instead of CuPc or PEDOT. In such a way, an organic material (containing low molecular weight or high molecular weight material) or a composite material of an organic material and an inorganic material can be used for the material of the light-emitting layer In addition, although not shown, a color filter may be formed in an opposite substrate. The color filter can be formed by a droplet discharge method or a vapor deposition method. High-definition display can be also carried out with the use of a color filter. It is because emission spectrums of each RGB can be compensated so that a broad peak gets sharp by using the color filter.

As mentioned above, the case of forming the materials showing luminescence of each RGB is explained; however, full color display can be achieved by forming materials showing monochromatic luminescence to be combined with a color filter and a color conversion layer. For example in the case of forming an electroluminescent layer showing luminescence of white or orange, full color display can be achieved by separately providing a color filter, a color conversion layer, or a color filter combined with a color conversion layer. A color filter and a color conversion layer may be formed in, for example, a second substrate (a sealing substrate) and may be attached to the substrate. As mentioned above, any one of materials showing monochromatic luminescence, a color filter, or a color conversion layer can be formed by a droplet discharge method.

Of course, monochromatic luminescence display may be carried out. For example, an area collar type display device may be formed by using monochromatic luminescence. A passive matrix type display portion is suitable for the area collar type and can mainly display characters or symbols.

In addition to ITO, IZO, or ITSO, a transparent conductive film in which 2 wt. % to 20 wt. % of zinc oxide (ZnO) is mixed into indium oxide can be used as the first electrode 113. In addition to the above transparent conductive film, a titanium nitride film or a titanium film may be used as the first electrode 113. In this case, the titanium nitride film or the titanium film is formed with a film thickness enough to transmit light (preferably, approximately from 5 nm to 30 nm) after forming the transparent conductive film. In this embodiment mode, ITSO is used as the first electrode 113.

Next, a second electrode 120 made from a conductive film is provided over the light-emitting layer 119. As the second electrode 120, a material with a small work function (Al; Ag; Li; Ca; or an alloy thereof, MgAg, MgIn, AlLi, CaF$_2$, or CaN) may be used. In this embodiment mode, lamination of a metal thin film whose film thickness is thinned (MgAg: a 10 nm film thickness) as the second electrode 120 and ITSO having a 100 nm film thickness as a transparent conductive film 121 is used. A target in which 1 wt. % to 10 wt. % of silicon oxide (SiO$_2$) is mixed into indium tin oxide is for the ITSO film, which is formed by a sputtering method under an Ar gas flow rate of 120 sccm, an O$_2$ gas flow rate of 5 sccm, a pressure of 0.25 Pa, and a power of 3.2 kW. Then, heat treatment is carried out at 200° C. for an hour after forming the ITSO film. On the other hand, ITO (indium tin oxide), indium zinc oxide, zinc oxide, tin oxide, or indium oxide can be used as the transparent conductive film 121.

In the case of applying a structure shown in FIG. 5B, light emitted from a light-emitting element is emitted by transmitting through both sides of the first electrode 113, and the second electrode 120 and the transparent conductive film 121.

Although not shown, a passivation film is effective to be provided to cover the transparent conductive film 121 functioning as an electrode. The passivation film is formed of an insulating film including silicon nitride, silicon oxide, silicon oxynitride (SiON), silicon nitride oxide (SiNO), aluminum nitride (AlN), aluminum oxynitride (AlON), aluminum nitride oxide (AlNO) of which oxygen content is larger than nitrogen content, or the material selected from the substance containing aluminum oxide, diamond like carbon (DLC), and a carbon film containing nitrogen (CN), and a single layer of the insulating film or the lamination combining them can be used. In addition, a material, in which a framework structure is constituted by bonding silicon (Si) and oxygen (O), at least containing hydrogen in a substituent or a material at least one kind of fluorine, alkyl, or aromatic hydrocarbon is included in the substituent may be used.

In this case, it is preferable to use a film with satisfactory coverage as the passivation film, and the carbon film, the DLC film is specifically effective to be used. Since the DLC film can be formed at a temperature ranging from a room temperature to 100° C. or less, it can be easily formed even over the light-emitting layer 119 with low heat resistance. The DLC film can be formed by a plasma CVD method (typically, a RF plasma CVD method, a microwave CVD method, an electron cyclotron resonance (ECR) CVD method, a hot-filament CVD method, or the like), a combustion flame method, a sputtering method, an ion beam deposition method, a laser vapor deposition method, or the like. As a reactive gas used for deposition, a hydrogen gas and a hydrocarbon-based gas (for example, CH$_4$, C$_2$H$_2$, C$_6$H$_6$, or the like) is used and ionized by glow discharge, and then deposition is carried out with accelerative collision of ion with a cathode to which a negative self-bias is applied. In addition, the CN film may be formed by using C$_2$H$_4$ gas and N$_2$ gas as a reactive gas. The DLC film has high blocking effect to oxygen and thus can control oxidation of the light-emitting layer 119. Therefore, a problem that the light-emitting layer 119 oxidizes can be prevented during a subsequent sealing step.

The light-emitting element is sealed by adhering a substrate 100 where the light-emitting element is formed in such a manner and a sealing substrate 125 with a sealant. According to the invention, a layer containing a hygroscopic substance is formed in the sealing substrate 125. In FIG. 7A, reference numeral 125 is the sealing substrate. A frame 130 for determining a region of the liquid hygroscopic substance to be dropped is formed over the sealing substrate 125 (see FIG. 7A). In this embodiment mode, since a composition 133 containing the liquid hygroscopic substance has light-transmitting properties, it can be formed in a wide range above a pixel portion and a peripheral circuit of the substrate 100 where the frame 130 is adhered by opposing thereto.

As explained in Embodiment Mode 1, the frame 130 can be formed from silicon oxide, silicon nitride, silicon oxynitride, aluminum oxide, aluminum nitride, aluminum oxynitride, or other inorganic material; acrylic acid, methacrylic acid, and a derivative thereof; a high molecular weight material and other organic materials such as polyimide, aromatic polyamide, or polybenzimidazole or other organic material; inorganic siloxane including a Si—O—Si bond, among the compound made from silicon, oxygen, and hydrogen, formed by using a siloxane-based material as a start material; or organic siloxane material in which hydrogen over silicon is substituted by an organic group such as methyl or phenyl. The material may be either a conductive material such as metal or an insulating material such as resin since the frame 130 is a means which is to be a frame portion of the liquid hygroscopic substance. A resin material such as epoxy resin, acrylic resin, phenol resin, novolac resin, acrylic resin, melamine resin, or urethane resin; an organic material such as benzocyclobutene, parylene, flare, or light-transmitting polyimide; or a compound material made from polymerization such as siloxane-based polymer can be used. Alternatively, a commercially available resist material including a photosensitizer may be used and, for example, a typical positive type resist such as a novolac resin and naphthoquinonedi azide compound that is a photosensitizer, a negative type resist such as a base resin, diphenylsilane diol, an acid generation agent, or the like may be used.

A pattern of the closed flame in a desired shape is formed from any one of materials. Patterning can be carried out by dry etching, wet etching, or ashing. In addition, the frame 130 may be directly formed on the sealing substrate 125 by a printing method such as a dispenser method, a droplet discharge method, or a screen printing method and thus the step is simplified since a patterning step is unnecessary.

In addition, the frame 130 may be formed with the same material as the sealant. As the sealant, for example, epoxy resin such as bisphenol A type liquid resin, bisphenol A type solid resin, resin containing bromo-epoxy, bisphenol F type resin, bisphenol AD type resin, phenol type resin, cresol type resin, novolac type resin, cyclic aliphatic epoxy resin, epibis type epoxy resin, glycidyl ether resin, glycidyl amine resin, heterocyclic epoxy resin, or modified epoxy resin can be used.

In this embodiment mode, the frame 130 is formed by using an insulating layer of which framework structure is constituted by bonding silicon (Si) and oxygen (O) used for the insulating layer 109. A detailed formation method thereof is skipped here since it may be referred to the above description.

Next, the composition 133 containing a liquid hygroscopic substance is dropped to a region surrounded with the frame 130 over the sealing substrate 125 by a head 135 of a drop device (see FIG. 7B). The composition 133 containing a liquid hygroscopic substance is filled within the frame 130 and is formed as a layer 131 containing a hygroscopic substance after drying such as bake (see FIG. 7C). This layer containing a hygroscopic substance has properties to absorb moisture by chemical or physical reaction.

Then, the light-emitting element is sealed by attaching a sealing substrate 125 and a substrate 100 with a sealant 122 (see FIGS. 6A and 6B). FIG. 6A is a top view of a display device of this embodiment mode, and FIG. 6B is a cross-sectional view taken along a line D-D' in FIG. 6A. In FIG. 6A, reference numeral 126 denotes a driver circuit portion; and 127, a pixel portion. The sealing substrate 125 and the substrate 100 are attached and then adhered so that the edges of an insulating layer 109 and wiring layers 186 and 187 are covered by the sealant 122. Since penetration of moisture from the cross section is interrupted by the sealant, the deterioration of the light-emitting element can be prevented and thus reliability of the display device is improved. Note that a filler may be filled in a region surrounded with the sealant, and nitrogen or the like may be filled by sealing the light-emitting element under a nitrogen atmosphere. In the case of a structure in which light is extracted by transmitting the filler as like in this embodiment mode, the filler needs to have light trans-mitting properties. Typically, visible light curing, ultraviolet curing, or heat curing epoxy resin may be used. As the sealing substrate 125, a substrate in which an insulating film is formed over a surface of a glass substrate, a quartz substrate or silicon substrate, a metal substrate or stainless steel substrate may be used. Alternatively, a plastic substrate having a heat resistance that can withstand processing temperature of this embodiment mode may be used, or a cover member such as a flexible substrate or a film may be used.

In this embodiment mode, a terminal portion has a structure electrically connected to exterior by connecting an FPC 183 to terminal electrodes 181 and 182 by an anisotropic conductive layer 184.

FIG. 11 shows a cross-sectional view showing a part of a lead wiring connecting to the above-mentioned terminal portion. A conductive film of a second electrode 120 and a transparent conductive film 121 are connected to a wiring layer 186 in a connection portion of FIG. 11 and terminal electrodes 181 and 182 are connected to the wiring layer 186 in a terminal portion thereof. Electrical connection to exterior is achieved by the terminal electrodes through an anisotropic conductive layer 184 and the FPC 183.

The circuit as like in the above is formed in this embodiment mode; however, the invention is not limited thereto. Either a passive matrix circuit or an active matrix circuit may be applied, or a circuit on which an IC chips is mounted as a peripheral driver circuit by a COG method or a TAB method may be applied, too. In addition, a gate line driver circuit and a source line driver circuit may be in plural or in single.

In addition, a method for driving a screen display is not specifically limited in a display device of the invention and, for example, a dot-sequential driving method, a line-sequential driving method, an area-sequential driving method, or the like may be used. The line-sequential driving method is typically applied, and a time division gradation driving method or an area gradation driving method may be appropriately used. In addition, a video signal inputted into a source line of a display device may be either an analog signal or a digital signal, and a driver circuit or the like may be appropriately designed depending on the video signal.

Furthermore, a light-emitting display device using a digital video signal includes one in which a video signal is inputted into a pixel at a constant voltage (CV), and one in which a video signal is inputted into a pixel at a constant current (CC). The light-emitting device in which a video signal is inputted into a pixel at a constant voltage (CV) is further classified into one in which a constant voltage is applied to a light-emitting element (CVCV), and others in which a constant current is applied to a light-emitting element (CVCC). Also, the light-emitting device in which a video signal is inputted into a pixel at a constant current (CC) is classified into one in which a constant voltage is applied to a light-emitting element (CCCV), and others in which a constant current is applied to a light-emitting element (CCCC).

The layer containing a hygroscopic substance in this embodiment mode has light-transmitting properties. Since the light-transmitting layer containing a hygroscopic substance is used, light from a light-emitting layer is not to be shielded even the layer containing a hygroscopic substance is formed to cover a pixel portion of a dual emission type display device in which light is extracted from a sealing substrate side. Thus, a hygroscopic substance can be formed over a large desired area inside the display device, and thus, an absorption effect can be sufficiently achieved. In addition, a distance between the light-emitting layer and the sealing substrate is constant and variation of a display image due to interference of light or the like is not generated since a depression is not formed in the sealing substrate.

As mentioned above, according to the invention, the deterioration of a light-emitting element can be prevented by an adequate absorption effect of a hygroscopic substance since a display device in which a hygroscopic substance is provided in a wide range can be manufactured without decreasing the light extraction efficiency. In addition, a complicated manufacturing step is not necessary either. Thus, a display device having high reliability capable of displaying a high definition and high quality image can be manufactured with a favorable yield.

Embodiment Mode 3

Figure 9:
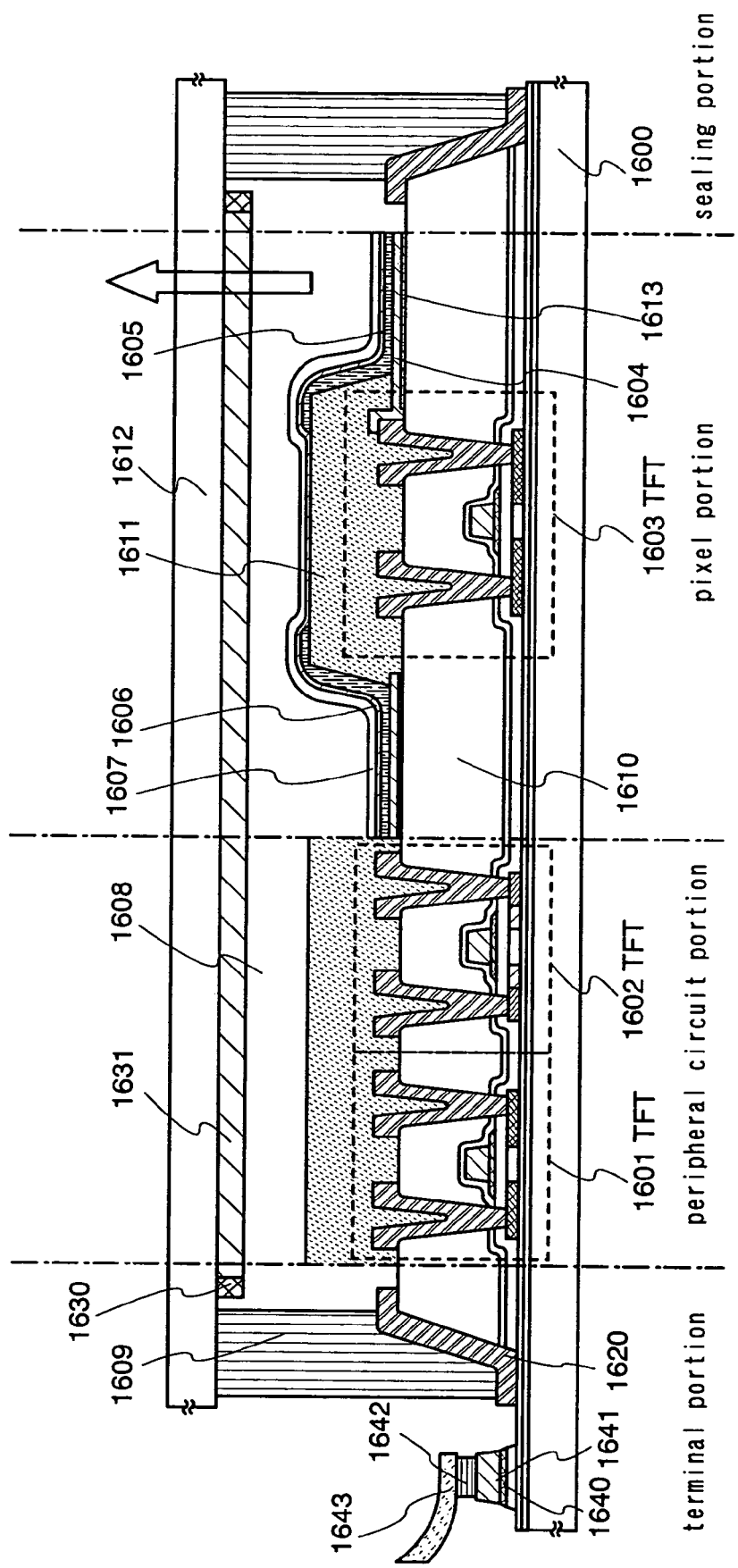
FIG. 9 is a view illustrating a display device according to a certain aspect of the invention.
Figure 10:
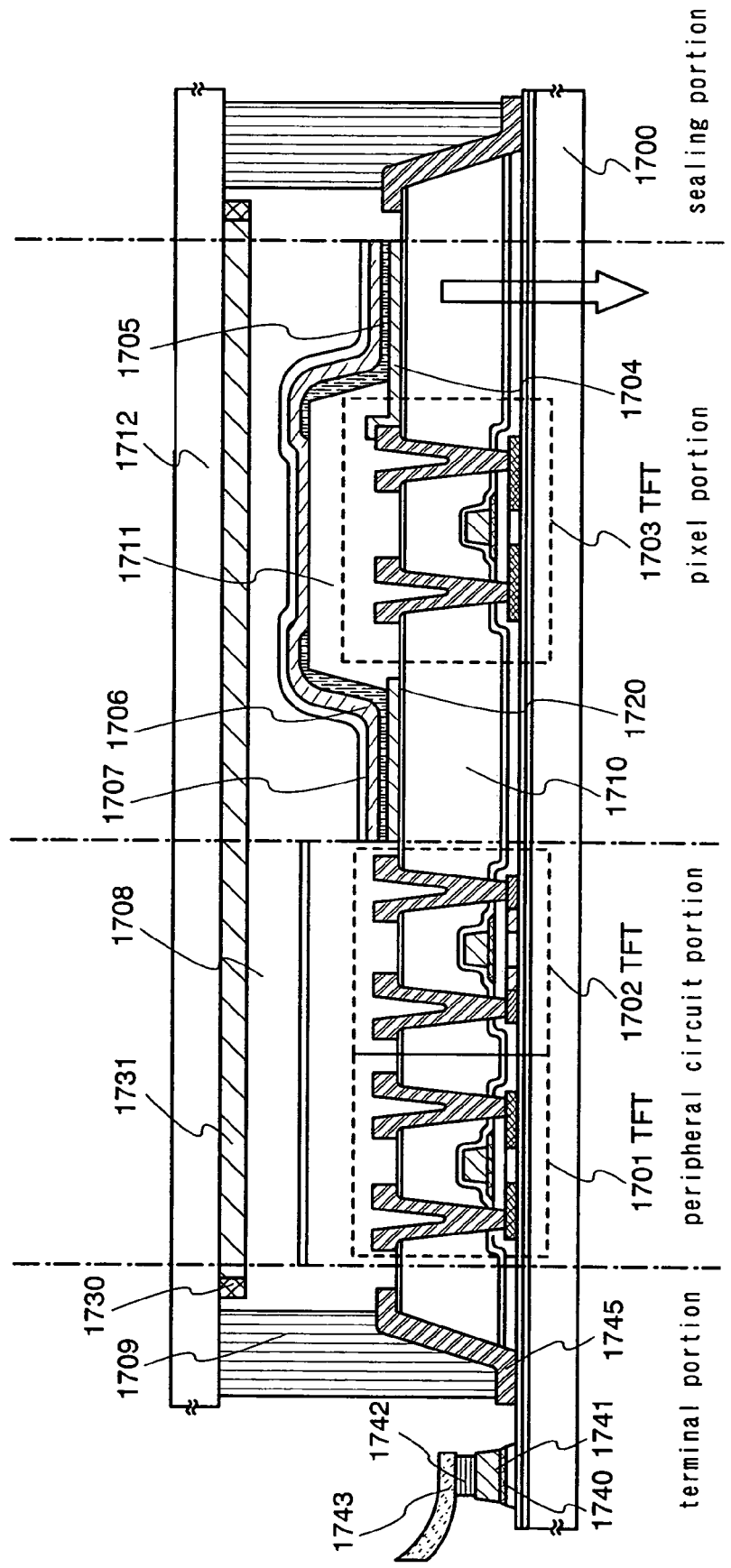
FIG. 10 is a view illustrating a display device according to a certain aspect of the invention.

Examples of a top emission type and a bottom emission type that are one-sided emission types in a display device manufactured in Embodiment Mode 2 are explained in this embodiment mode with reference to FIG. 9 and FIG. 10.

In FIG. 10, reference numeral 1700 denotes an element substrate; 1701, 1702, and 1703, TFTs; 1704, a first electrode; 1705, a light-emitting layer; 1706, a second electrode; 1707, a protective film; 1708, a filler; 1730, a frame; 1731, a layer containing a hygroscopic substance; 1709, a sealant; 1710, an insulating layer; 1711, a bank; 1712, a sealing substrate; 1720, an insulating film; 1745, a wiring layer; 1740 and 1741, terminal electrodes; 1742, an anisotropic conductive layer; and 1743, an FPC.

A display device of FIG. 10 is a bottom emission type and has a structure in which light is emitted on an element substrate side 1700 in a direction of an arrow. Note that the first electrode 1704 is formed by forming a transparent conductive film and etching it in a desired shape in this embodiment mode. In addition to ITO, IZO, or ITSO, a transparent conductive film in which 2 wt. % to 20 wt. % of zinc oxide (ZnO) is mixed into indium oxide can be used as the first electrode 1704. In addition to the above transparent conductive film, a titanium nitride film or a titanium film may be used as the first electrode 1704. In this case, the titanium nitride film or the titanium film is formed with a film thickness enough to transmit light (preferably, approximately from 5 nm to 30 nm) after forming the transparent conductive film. In this embodiment mode, ITSO is used as the first electrode 1704.

Next, the second electrode 1706 made of a conductive film is provided over the light-emitting layer 1705. As the second electrode 1706, a material with small work function (Al; Ag; Li; Ca; or an alloy thereof, MgAg, MgIn, AlLi, $CaF_2$, or CaN) may be used.

In the case of a structure shown in FIG. 10, light emitted from the light-emitting element is emitted by transmitting through the side of the first electrode 1704. In the case of a bottom emission type as shown in FIG. 10, the layer 1731 containing a hygroscopic substance does not need to have light transmitting properties; therefore, a fixing member in which a hygroscopic substance such as calcium oxide (CaO) is dispersed can be also used.

In addition, it is preferable to use a substance that adsorbs water ($H_2O$) by chemical adsorption like oxide of an alkaline earth metal such as calcium oxide (CaO) or barium oxide (BaO) as the hygroscopic substance to be dispersed. However, not limiting thereto, a substance that adsorbs water by physical adsorption such as zeolite or silica gel can be also used.

In addition, resin or the like can be used as a fixing member that fixes the hygroscopic substance. As the resin, the following can be given: acrylic resin or the like such as ester acrylate, ether acrylate, ester urethane acrylate, ether urethane acrylate, butadiene urethane acrylate, special urethane acrylate, epoxy acrylate, amino resin acrylate, or acrylic resin acrylate. In addition, epoxy resin such as bisphenol A type liquid resin, bisphenol A type solid resin, resin containing bromo-epoxy, bisphenol F type resin, bisphenol AD type resin, phenol type resin, cresol type resin, novolac type resin, cyclic aliphatic epoxy resin, epibis type epoxy resin, glycidyl ether resin, glycidyl amine resin, heterocyclic epoxy resin, or modified epoxy resin can be used. For example, an inorganic substance or the like such as siloxane of which framework structure is constituted by bonding silicon (Si) and oxygen (O), at least containing hydrogen in a substituent may be also used.

FIG. 9 is a one-sided emission type display device, of which structure is top emission which emits light in a direction of an arrow. In FIG. 9, reference numeral 1600 denotes an element substrate; 1601, 1602, and 1603, TFTs; 1613, a metal film having reflectiveness; 1604, a first electrode; 1605, a light-emitting layer; 1606, a second electrode; 1607, a transparent conductive film; 1608, a filler; 1630, a frame; 1631, a layer containing a hygroscopic substance; 1609, a sealant; 1610, an insulating layer; 1611, a bank; 1612, a sealing substrate; 1620, a wiring; 1640 and 1641, terminal electrodes; 1642, an anisotropic conductive film; and 1643, an FPC. In this case, a metal film 1613 having reflectiveness is formed below the first electrode 1604 in the above dual emission type display device shown in FIG. 11. The first electrode 1604 functioning as an anode is formed over the metal film 1613 having reflectiveness. Ta, W, Ti, Mo, Al, Cu, or the like may be used as the metal film 1613 since it may have reflectiveness. Preferably, a substance having high reflectiveness in a visible light region is used and an Al film is used in this embodiment mode.

The second electrode 1606 made of a conductive film is provided over the light-emitting layer 1605. As the second electrode 1606, since it is operated as a cathode, a material with small work function (Al; Ag; Li; Ca; or an alloy thereof, MgAg, MgIn, AlLi, $CaF_2$, or CaN) may be used. In this embodiment mode, lamination of a metal thin film whose film thickness is thinned (MgAg: a 10 nm film thickness) as the second electrode 1606 and ITSO having a 110 nm film thickness as the transparent conductive film 1607 is used. As the transparent conductive film 1607, ITO (indium tin oxide), indium zinc oxide, zinc oxide, tin oxide, indium oxide, or the like can be used.

As mentioned above, a display device provided with a hygroscopic substance in a desired region can be manufactured according to the present invention; therefore, the deterioration of the light-emitting element can be prevented by an adequate hygroscopic effect of a hygroscopic substance. In addition, a complicated manufacturing step is not necessary either. Thus, a display device having high reliability capable of displaying a high definition and high quality image can be manufactured with a favorable yield.

Embodiment Mode 4

Figure 28:
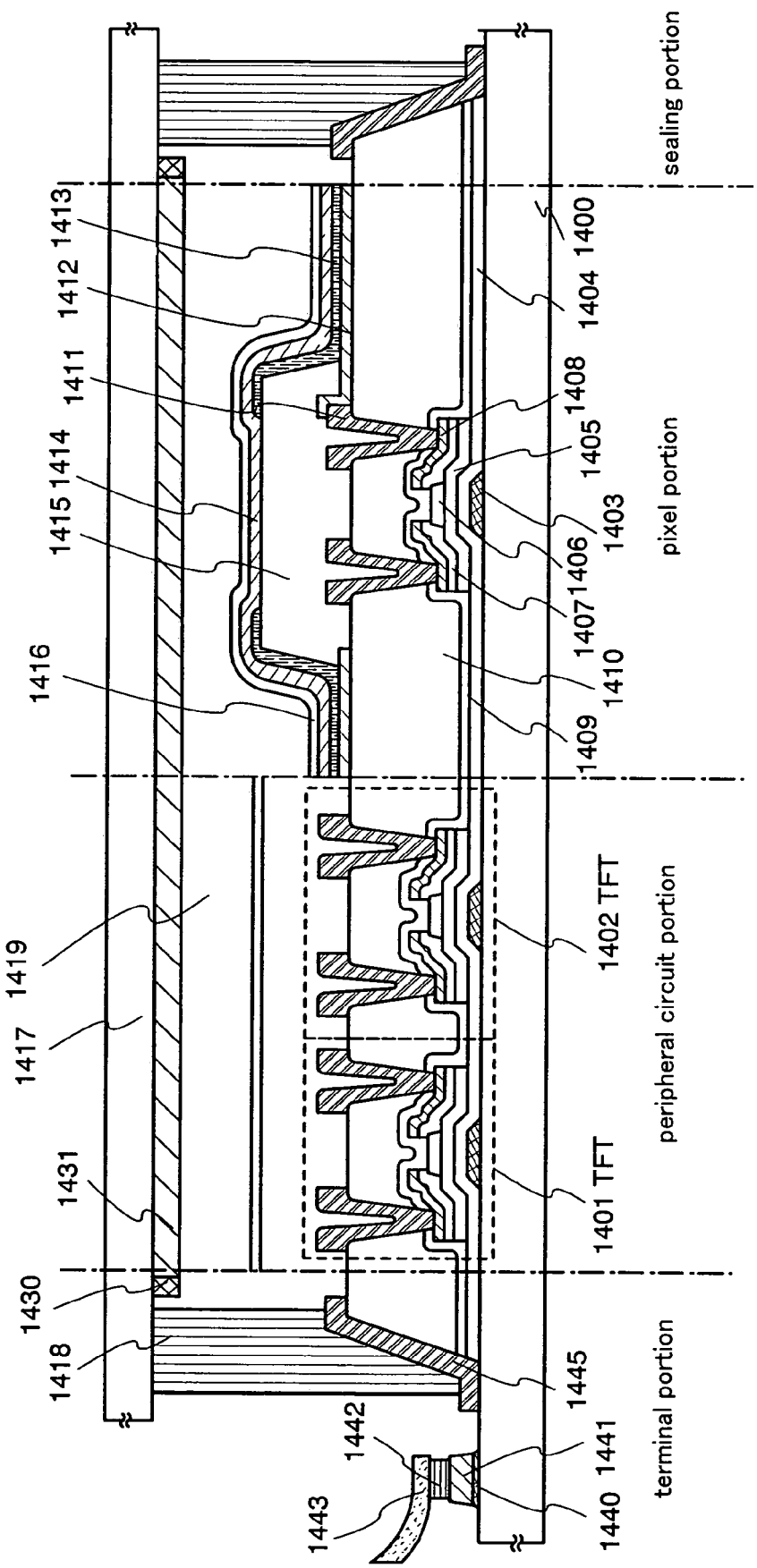
FIG. 28 is a view illustrating a method for manufacturing a display device according to a certain aspect of the invention.
Figure 29A:
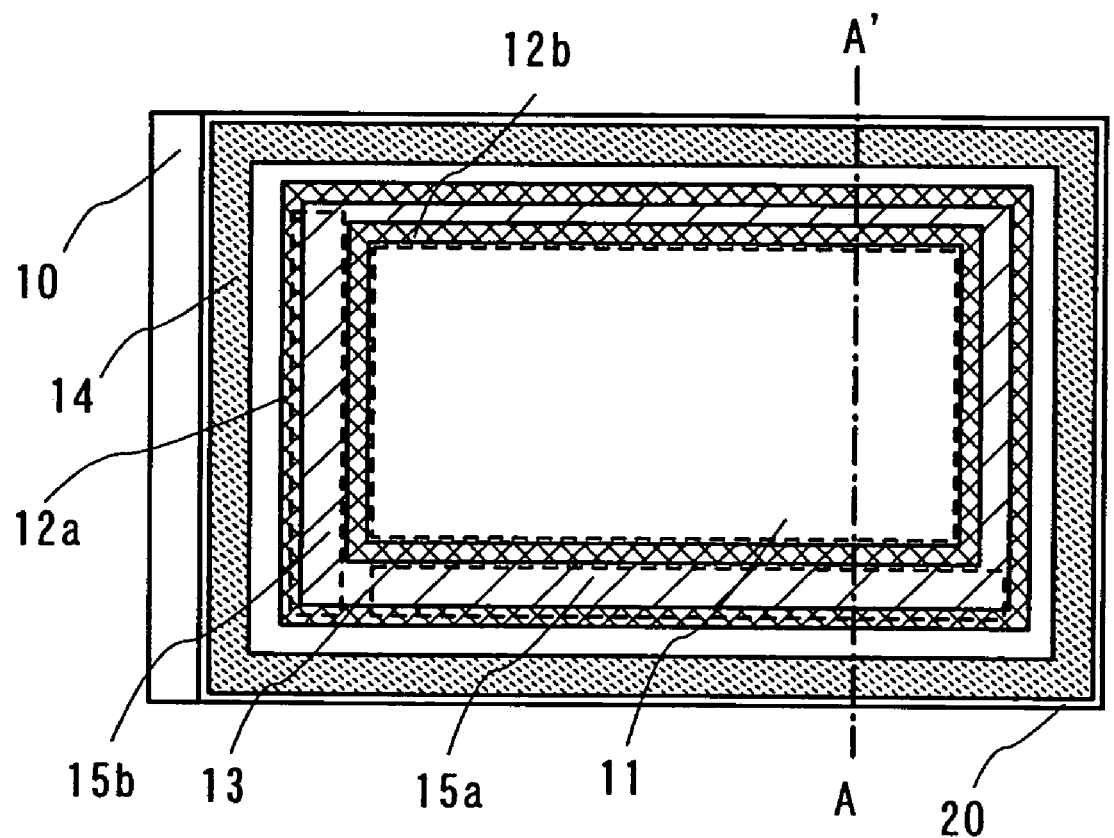
FIGS. 29A and 29B are views illustrating a display device according to certain aspects of the invention.
Figure 29B:
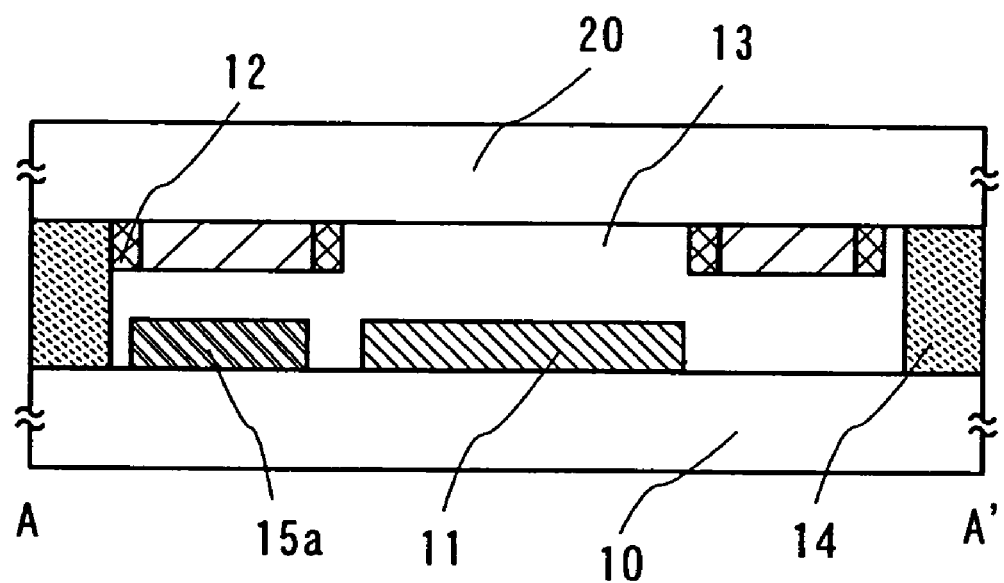

In this embodiment mode, an example of a reverse stagger type TFT is shown with reference to FIG. 8 and FIG. 28. The detailed explanation of portions besides the TFT is omitted here since they are the same as those of a display device shown in Embodiment Mode 2.

TFTs shown in FIG. 28 are channel protective types. Reference numeral 1400 denotes an element substrate; and 1401 and 1402, TFTs of a driver circuit portion. A gate insulating film 1404, a semiconductor layer 1405, an N-type semiconductor layer 1407 as a semiconductor having one conductivity type, and a metal layer 1408 are laminated over a gate electrode 1403. A channel protective film 1406 and an electrode layer 1411 are formed above a portion to be a channel formation region of the semiconductor layer 1405. Reference numeral 1412 denotes a first electrode; 1413, a light-emitting layer; 1414, a second electrode; 1416, a passivation film; 1418, a sealant; 1409, an insulating layer; 1410, an insulating layer; 1415, a bank; 1417, a sealing substrate; 1430, a frame; 1431, a layer containing a hygroscopic substance; 1445, a wiring layer; 1440 and 1441, terminal electrodes; 1442, an anisotropic conductive film; and 1443, an FPC. In the light-emitting device of this embodiment mode, nitrogen is filled in a space 1419 between the layer 1431 containing a hygroscopic substance and the light-emitting element by carrying out a sealing step under a nitrogen atmosphere. Alternatively, a resin filler may be filled therein, too.

In addition, TFTs shown in FIG. 8 are channel etch types. Reference numeral 700 denotes an element substrate; and 701 and 702, TFTs of a driver circuit portion. A gate insulating film 708, a semiconductor layer 705, an N-type semiconductor layer 706 as a semiconductor having one conductivity type, and an electrode layer 707 are laminated over a gate electrode 703. A portion to be a channel formation region of the semiconductor layer 705 is etched to be thin. Reference numeral 712 denotes a first electrode; 713, a light-emitting layer; 714, a second electrode; 716, a passivation film; 718, a sealant; 719, a filler; 715, an insulating layer; 717, a sealing substrate; 730, a frame; 731, a layer containing a hygroscopic substance; 741, a terminal electrode; 742, an anisotropic conductive film; 743, an FPC; and 745, a wiring layer. The display device in FIG. 8 has a structure in which the insulating layer 715 is combined with an interlayer insulating layer and an insulating layer to be a bank in a display device of Embodiment Mode 1.

A semi-amorphous semiconductor film in Embodiment Mode 1 can be also used as the semiconductor layer. In addition, the semiconductor layer having one conductivity type may be formed, if necessary.

The TFTs in the pixel portion of this embodiment mode are n-channel type TFTs. The first electrodes (pixel electrodes) 712 and 1412 function as cathodes and the second electrodes 714 and 1414 function as anodes. In this embodiment mode, ITSO which is a transparent conductive layer is used for the first electrode and the second electrode. The light-emitting element is made to be the first electrode (ITSO)/an electron injection layer (BzOS—Li in which Li is added into a benzoxazole derivative (BzOS))/an electron transport layer (Alq)/a light-emitting layer (Alq doped with a quinacridone derivative (DMQd))/a hole transport layer (4,4'-bis[N-(1-naphthyl)-N-phenyl-amino]-biphenyl (α-NPD))/a hole injection layer (molybdenum oxide (MoOx))/the second electrode (ITSO). Materials of an anode, a cathode, and an electron injection layer, an electron transport layer, a light-emitting layer, a hole transport layer, a hole injection layer, or the like are not limited to this embodiment mode and may be combined by appropriately selecting them.

As mentioned above, according to the invention, the deterioration of a light-emitting element can be prevented by an adequate absorption effect of a hygroscopic substance since a display device in which a hygroscopic substance is provided in a wide range thereof can be manufactured without decreasing light extraction efficiency. In addition, a complicated manufacturing step is not necessary either. Thus, a display device having high reliability capable of displaying a high definition and high quality image can be manufactured with a favorable yield.

Embodiment Mode 5

Figure 30A:
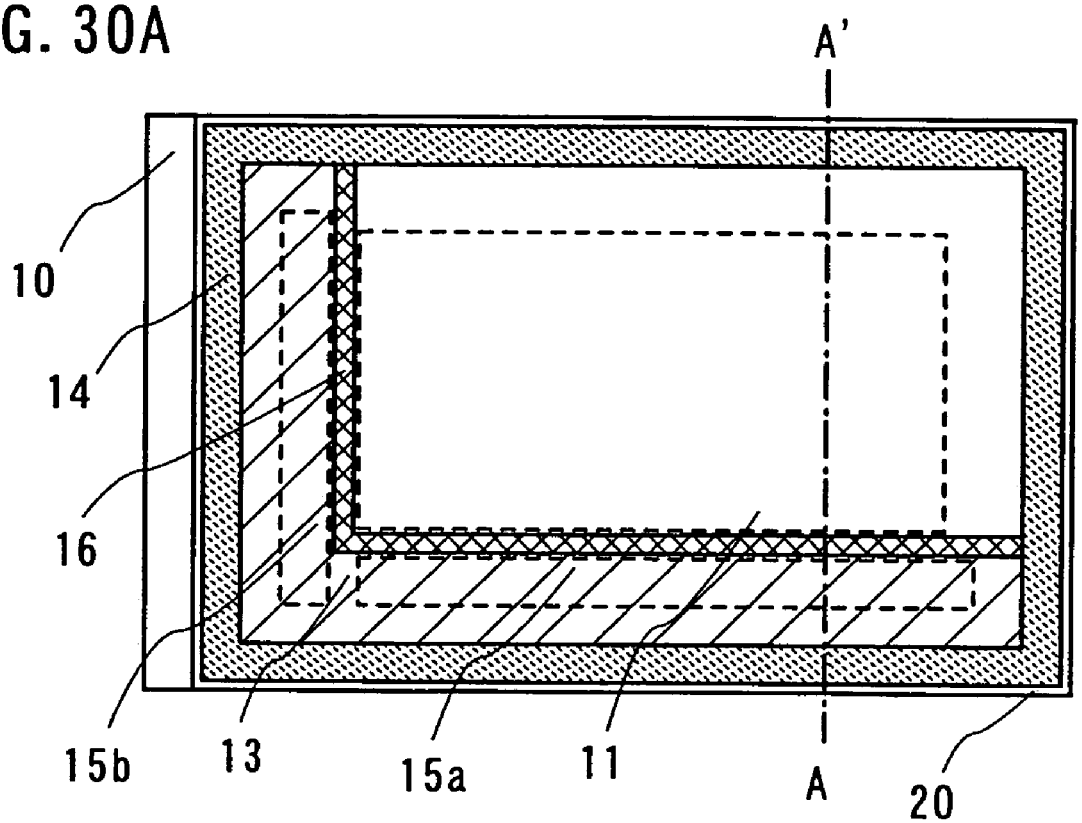
FIGS. 30A and 30B are views illustrating a display device according to certain aspects of the invention.
Figure 30B:
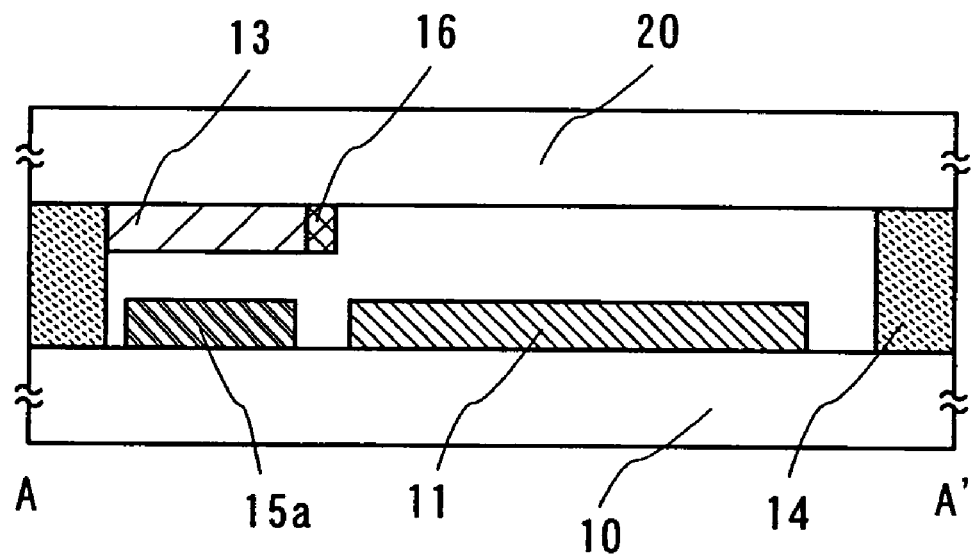
Figure 31A:
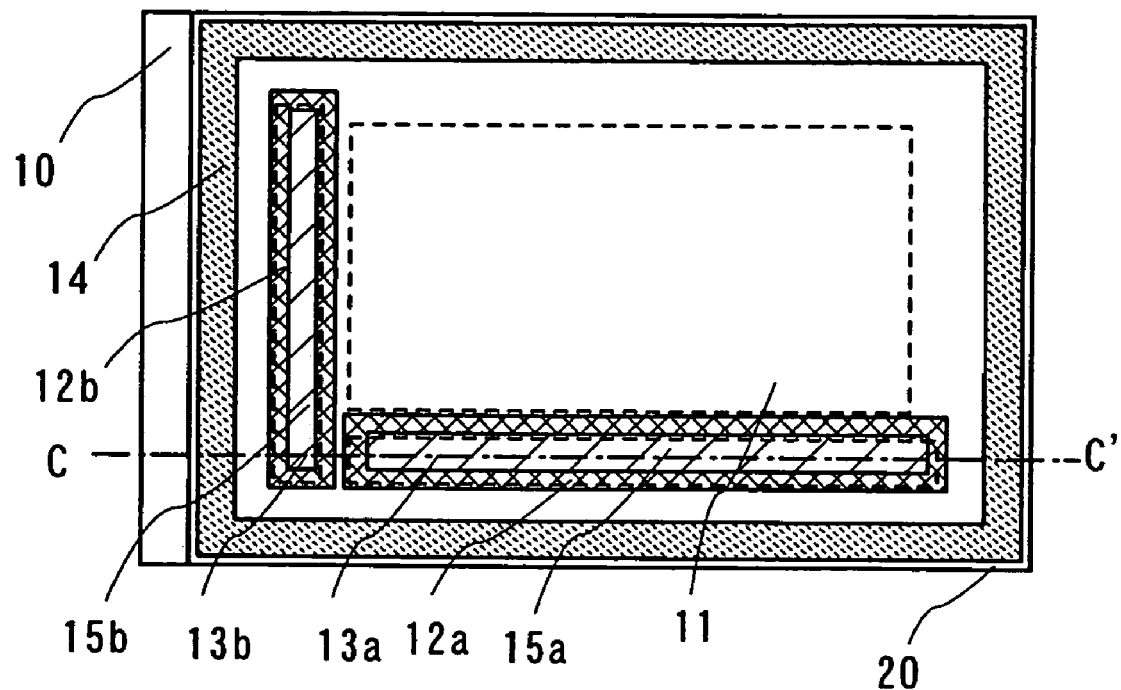
FIGS. 31A and 31B are views illustrating a display device according to certain aspects of the invention.
Figure 31B:
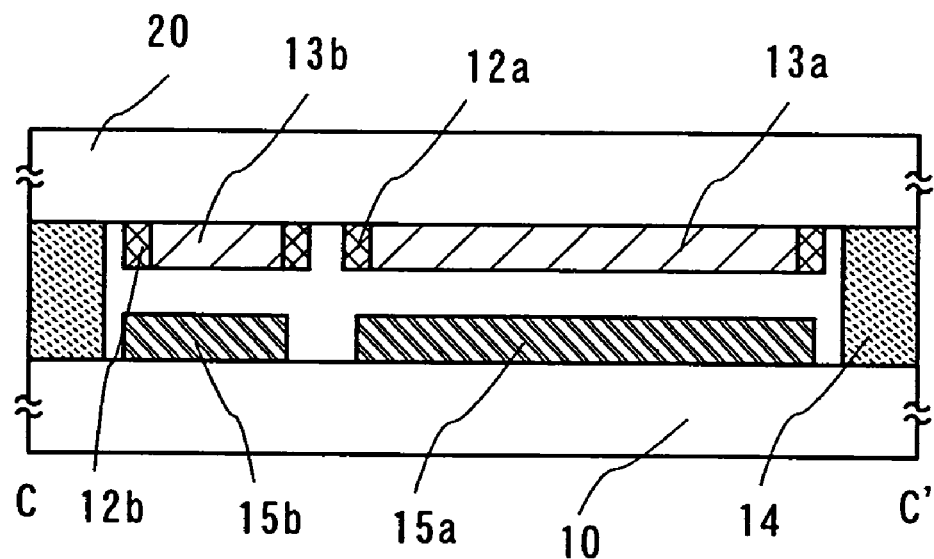

In this embodiment mode, another display device of the present invention is explained with reference to FIGS. 22A and 22B to FIGS. 25A and 25B and FIGS. 29A and 29B to 32A and 32B. FIGS. 22A, 23A, 24A, and 25A and FIGS. 29A, 30A, 31A and 32A are top views of the display device of this embodiment mode. FIGS. 22B, 23B, 24B, and 25B and FIGS. 29B, 30B and 32B are cross-sectional views taken along lines A-A' in FIGS. 22A, 23A, 24A, and 25A and FIGS. 29A, 30A and 32A. FIG. 31B is a cross-sectional view taken along a line C-C' in FIG. 31A. The display device of this embodiment mode is different from a display device explained with reference to FIG. 1 of Embodiment Mode 1 in a structure in which a frame and a layer containing a hygroscopic substance are provided.

Figure 22A:
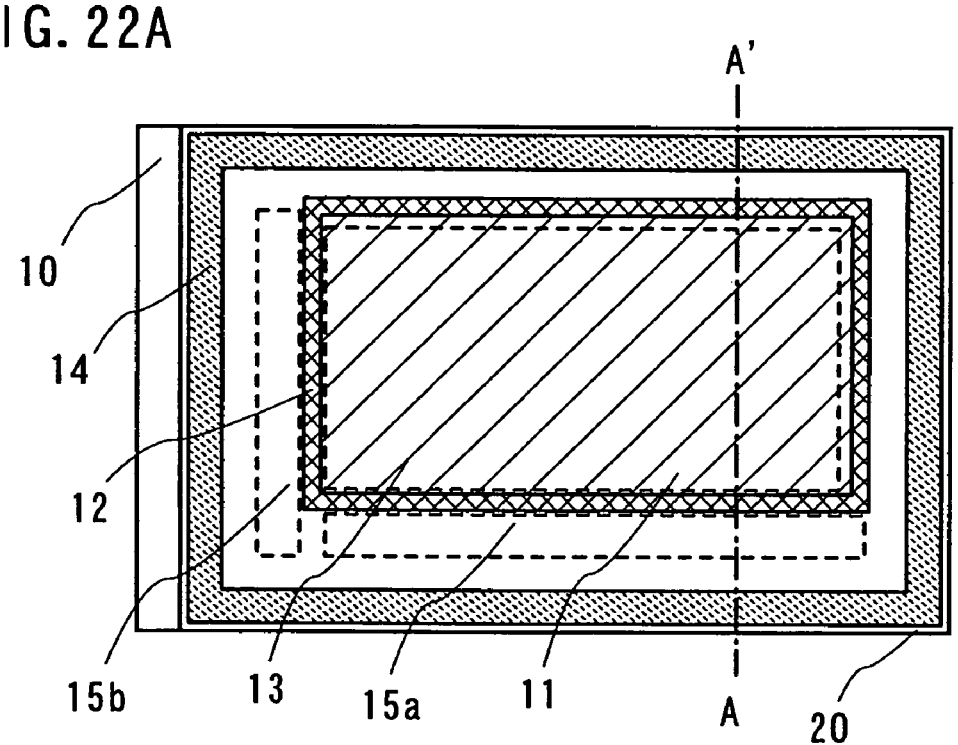
FIGS. 22A and 22B are views illustrating a display device according to certain aspects of the invention.
Figure 22B:
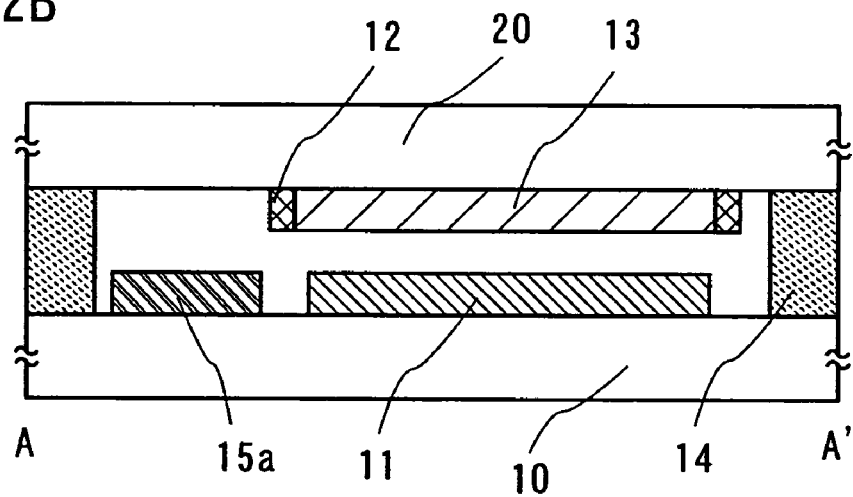
Figure 23A:
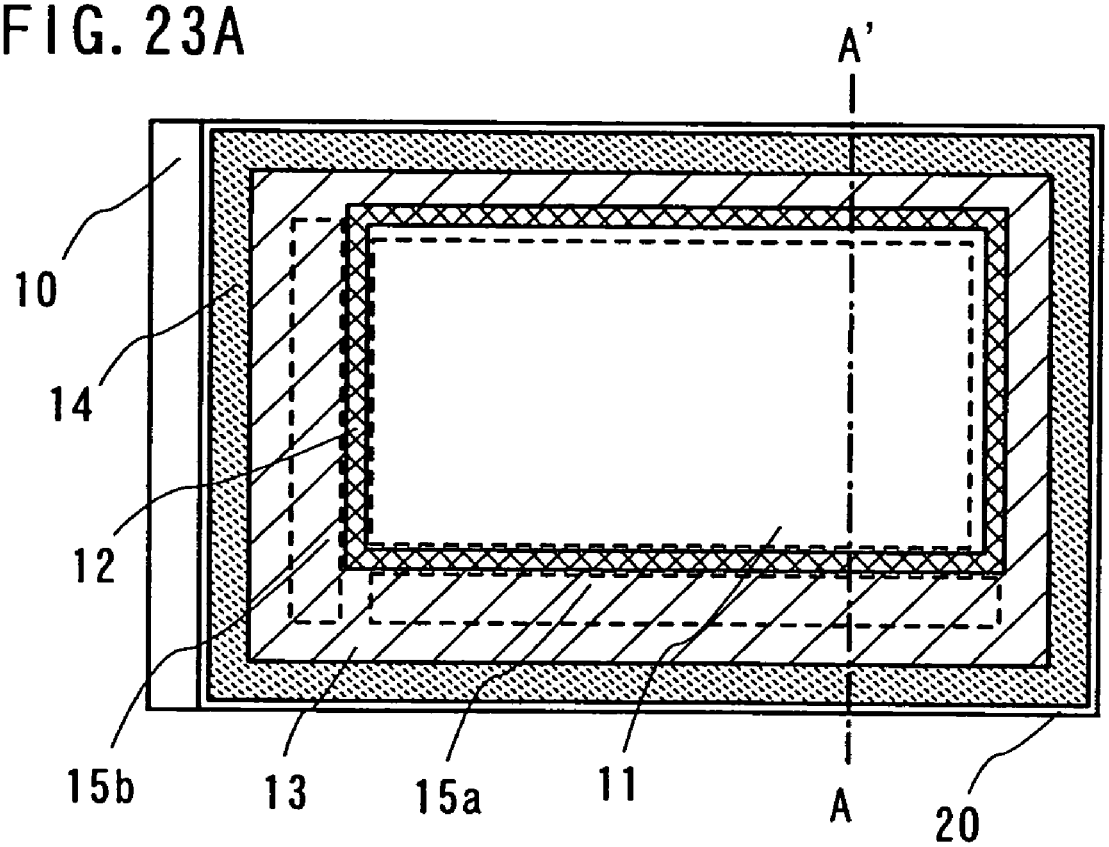
FIGS. 23A and 23B are views illustrating a display device according to certain aspects of the invention.
Figure 23B:
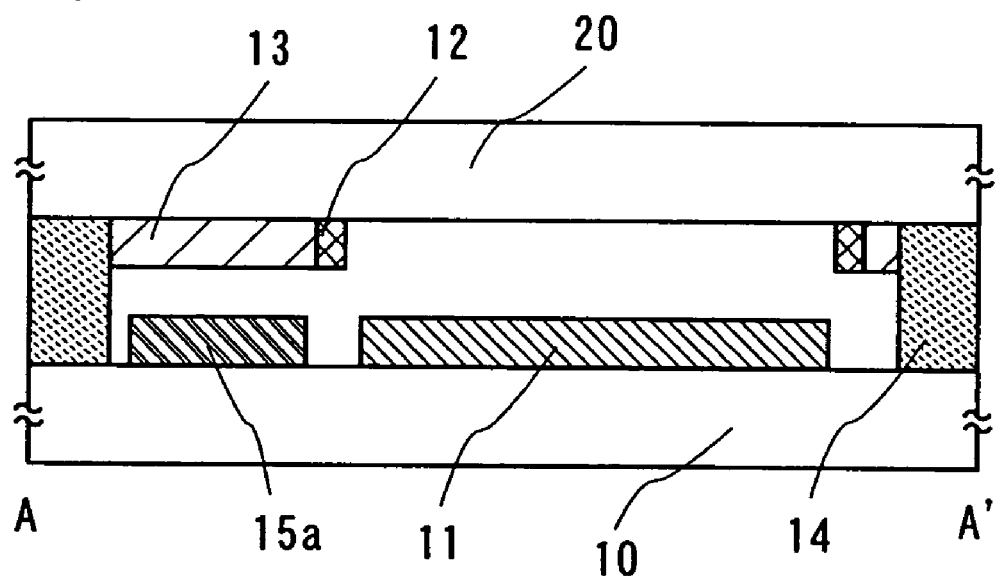

A layer 13 containing a hygroscopic substance is provided to oppose only to a pixel portion in a display device shown in FIGS. 22A and 22B. A frame 12 is formed surrounding only the pixel portion. This embodiment mode shows an example in which the frame 12 is formed in a sealing substrate 20. In order to provide the layer 13 containing a hygroscopic substance is provided over the pixel portion having a light-emitting element likely to be deteriorated by moisture, the frame 12 is formed and a hygroscopic substance is dropped to a region surrounded with the frame 12 to form the layer containing a hygroscopic substance. The deterioration of the light-emitting element can be prevented by the hygroscopic effect of the layer 13 containing a hygroscopic substance. A desired pattern sometimes cannot be formed due to generation of reaction or the like between materials from which a sealant and a desiccant is formed. Accordingly, when defect is generated with so-called incompatibility with each other, it is preferable to form them separately. A sealant is separately formed from a frame and a layer containing a hygroscopic substance in a structure like FIGS. 22A and 22B; therefore, defect is not generated even the materials incompatible are used.

Figure 24A:
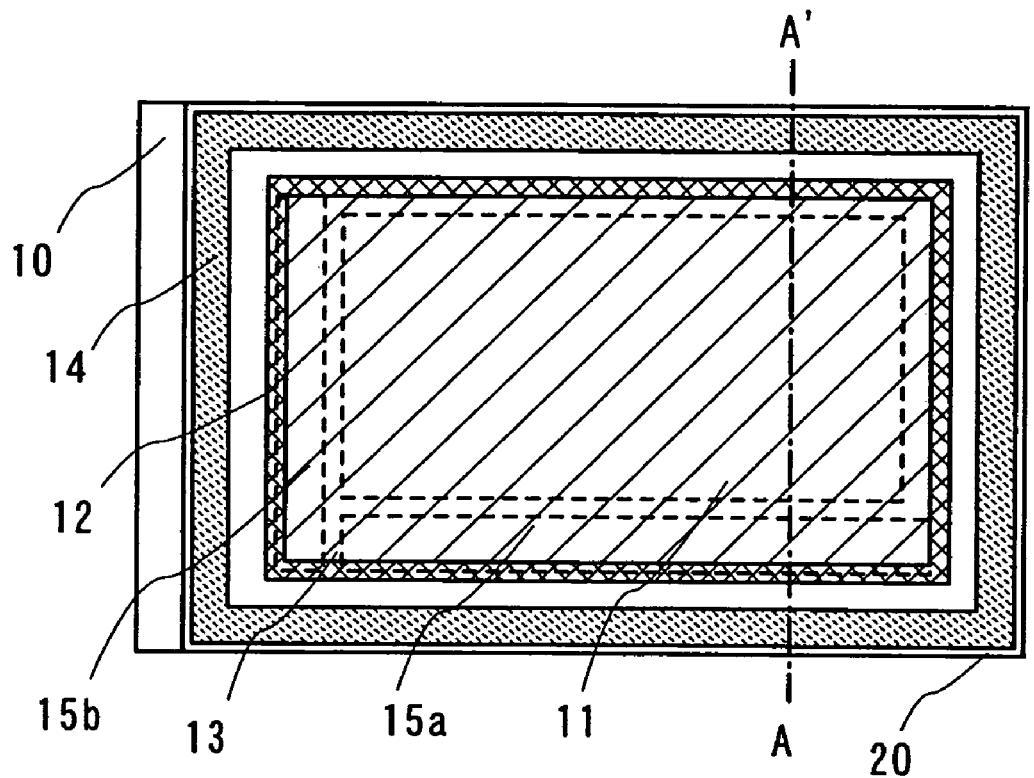
FIGS. 24A and 24B are views illustrating a display device according to certain aspects of the invention.
Figure 24B:
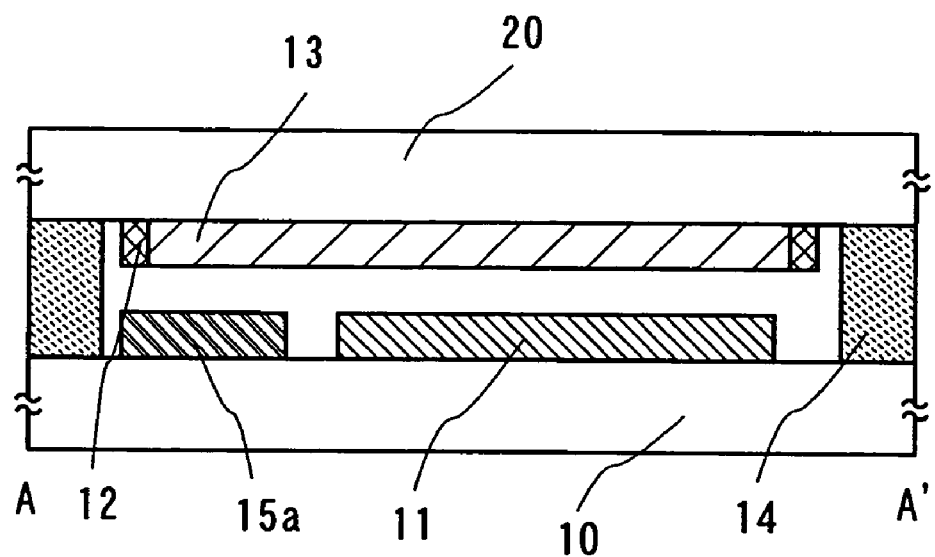

Of course, as shown in FIGS. 24A and 24B, the frame 12 is much enlarged than that in FIGS. 22A and 22B, and it may be formed to surround not only a pixel portion but also a part of a driver circuit portion provided in a periphery thereof. In this case, since a hygroscopic substance can be provided in a larger area without a sealant 14 being in contact with a frame 12 and a layer 13 containing a hygroscopic substance, the hygroscopic effect is improved.

Figure 32A:
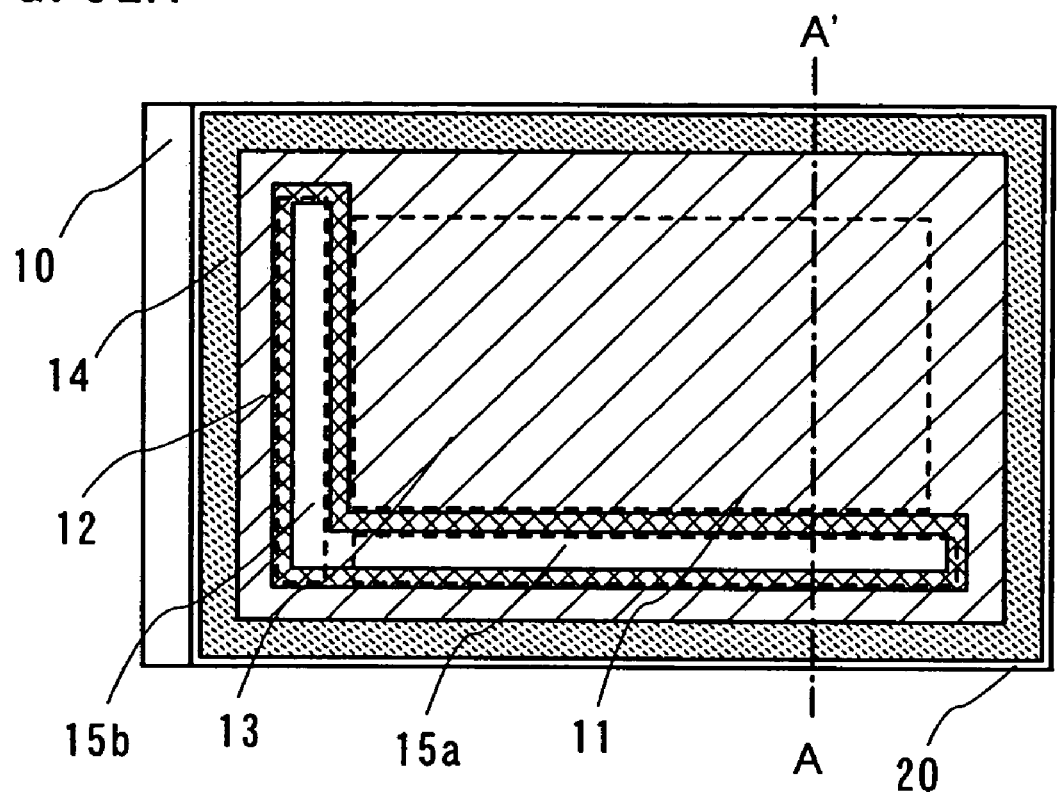
FIGS. 32A and 32B are views illustrating a display device according to certain aspects of the invention.
Figure 32B:
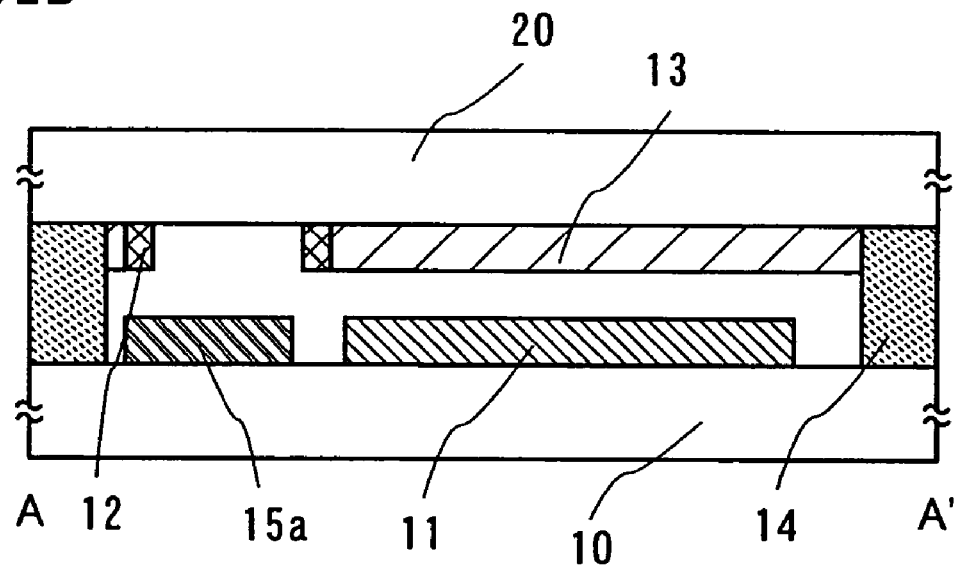

Also, a frame 12 can be formed to surround driver circuit portions 15a and 15b as shown in FIGS. 32A and 32B. A layer 13 containing a hygroscopic substance can be formed in a region between the frame 12 and a sealant 14.

The layer 13 containing a hygroscopic substance is preferable to have light transmitting properties since the above-mentioned FIGS. 1A and 1B, FIGS. 22A and 22B, FIGS. 24A and 24B, and FIGS. 32A and 32B are the structures in which the layers containing a hygroscopic substance are provided above the pixel portions. An adequate drying effect can be achieved without decreasing light extraction efficiency by having light transmitting properties even in the case of a top emission type or a dual emission type in which light is extracted from the sealing substrates 20 side.

Next, the layer containing a hygroscopic substance does not need to have light transmitting properties if they are provided over the driver circuit portions. As shown in FIGS.

23A and 23B, a frame 12 is formed to surround a pixel portion 11, and a sealant 14 is formed to surround the pixel portion and driver circuit portions 15a and 15b. Thus, a liquid hygroscopic substance can be dropped to a region between the frame 12 and the sealant 14, and a layer 13 containing a hygroscopic substance can be formed over the driver circuit portions 15a and 15b.

In addition, a second frame 12a is formed outside of a first frame 12b surrounding a pixel portion as like in FIG. 29 to be doubled when defect due to reaction or the like is generated depending on properties of each material of the sealant, the frame, and the desiccant as mentioned above. By dropping a liquid hygroscopic substance in a region between the first frame and the second frame and by forming a layer 13 containing a hygroscopic substance, the layer 13 containing the hygroscopic substance can be provided over driver circuit portions 15a and 15b without generating defect even when the desiccant and the sealant are incompatible and the layer 13 containing the hygroscopic substance does not have light transmitting properties.

Figure 25A:
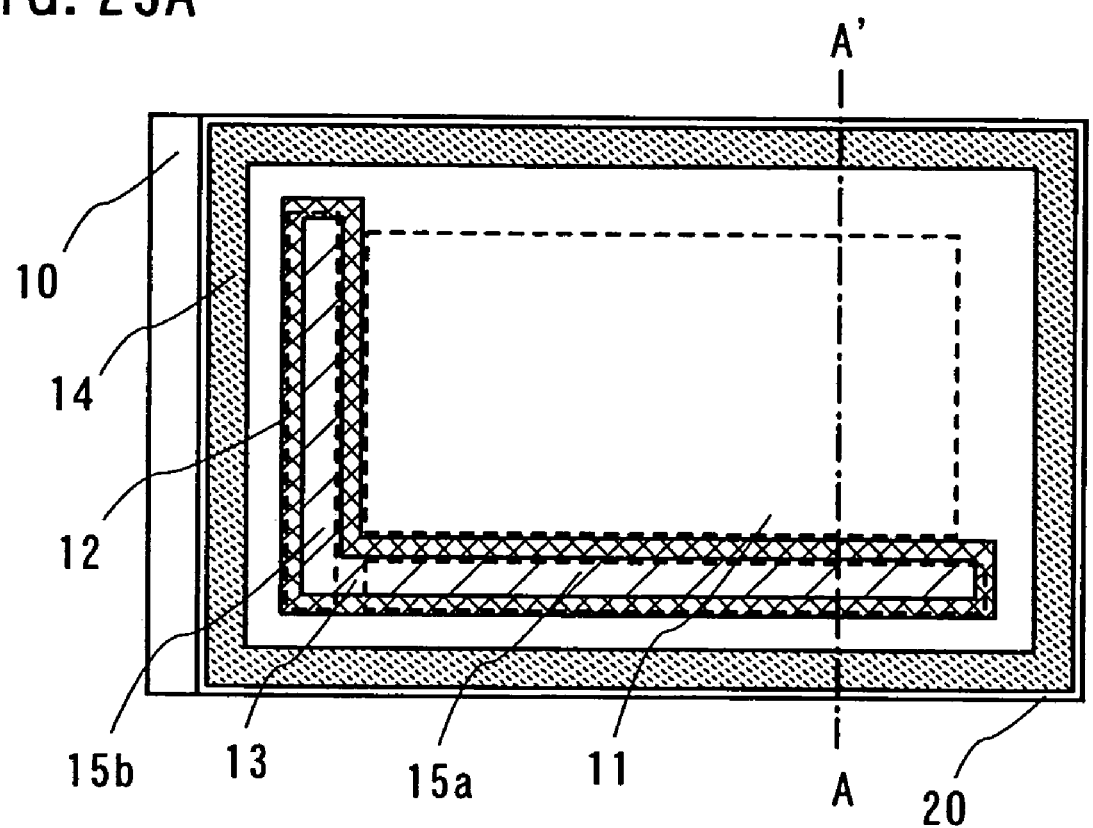
FIGS. 25A and 25B are views illustrating a display device according to certain aspects of the invention.
Figure 25B:
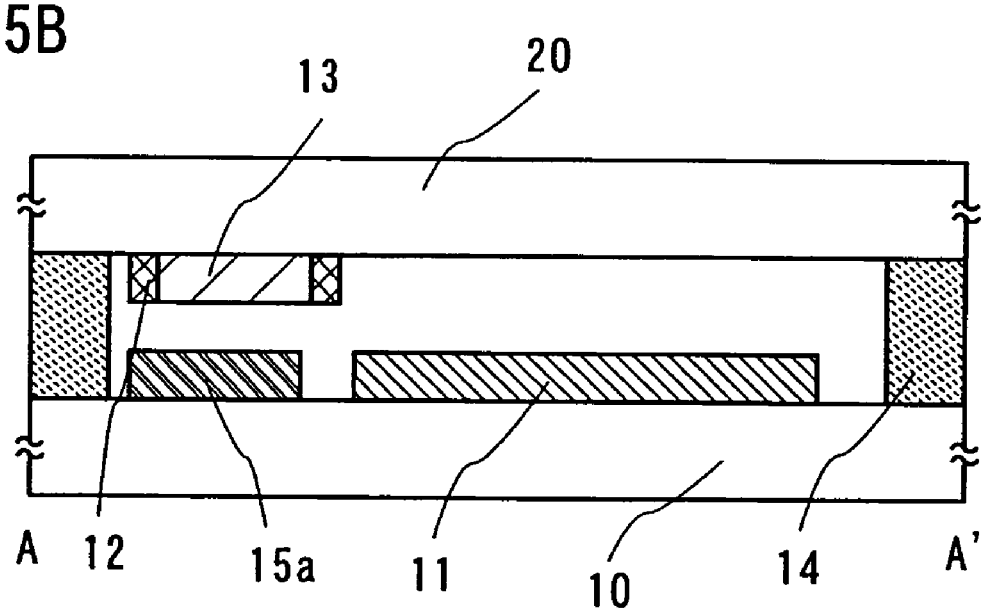

In addition, as the layer 13 containing the hygroscopic substance is formed by surrounding a pixel portion 11 in FIGS. 22A and 22B, a frame 12 can be formed to surround driver circuit portions 15a and 15b like in FIGS. 25A and 25B. A layer 13 containing a hygroscopic substance can be also formed in a region surrounded with the frame 12. A plurality of the layers containing the hygroscopic substance surrounded with this frame 12 may be provided. As shown in FIGS. 31A and 31B, two places of an absorption substance 13a surrounded with a frame 12a and an absorption substance 13b surrounded with a frame 12b may be provided.

According to the invention, in order to determine and fix a region of forming a liquid hygroscopic substance, it may be provided by dropping the liquid hygroscopic substance in a frame of which shape is closed. As shown in FIGS. 30A and 30B, this frame forms a closed shape by a wall 16 which is to be a barrier and a sealant 14, and a layer 13 containing a hygroscopic substance can be also formed between the wall 16 and the sealant 14.

Note that this embodiment mode shows a structure in which a hygroscopic substance is formed on a side of a sealing substrate; however, a layer containing a hygroscopic substance can be also provided to cover a pixel portion and a driver circuit portion directly by forming a frame over an element substrate.

As mentioned above, according to the invention, a hygroscopic substance can be provided easily in a desired region of a display device. Therefore, absorption effect of moisture can be achieved and thus a light-emitting element can be prevented from being deteriorated due to moisture. Accordingly, a display device having high reliability can be manufactured with a favorable yield with simple steps.

Embodiment Mode 6

A structure of pixels of a display panel shown in this embodiment mode is explained with reference to equivalent circuit diagrams shown in FIGS. 20A to 20F.

Figure 20A:
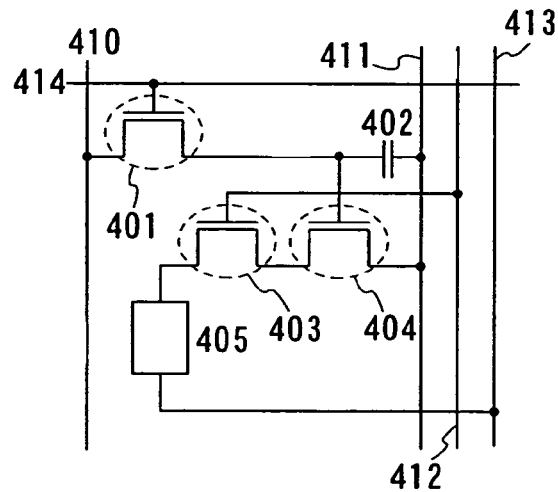
FIGS. 20A to 20F are circuit diagrams illustrating structures of pixels applicable to an EL display panel according to certain aspects of the invention.

In a pixel shown in FIG. 20A, a signal line 410 and power supply lines 411 to 413 are arranged in a column direction and a scanning line 414 is arranged in a row direction. In addition, a TFT 401 which is a switching TFT, a TFT 403 which is a driving TFT, a TFT 404 which is a current control TFT, a capacitor element 402, and a light-emitting element 405 are included.

Figure 20B:
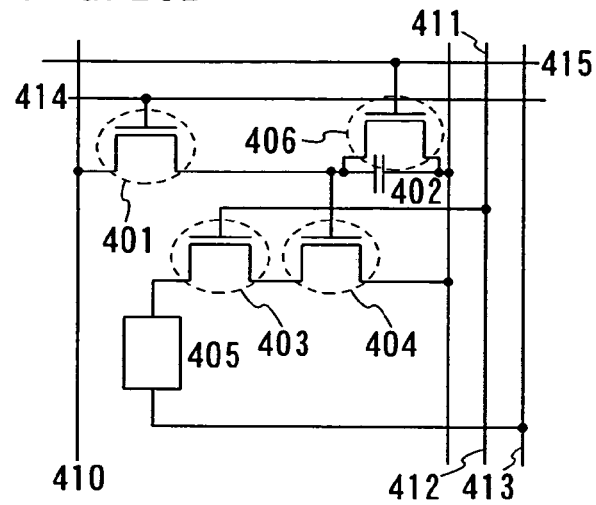
Figure 20C:
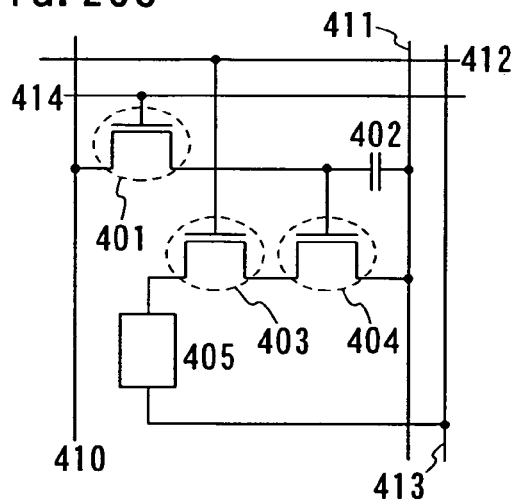
Figure 20D:
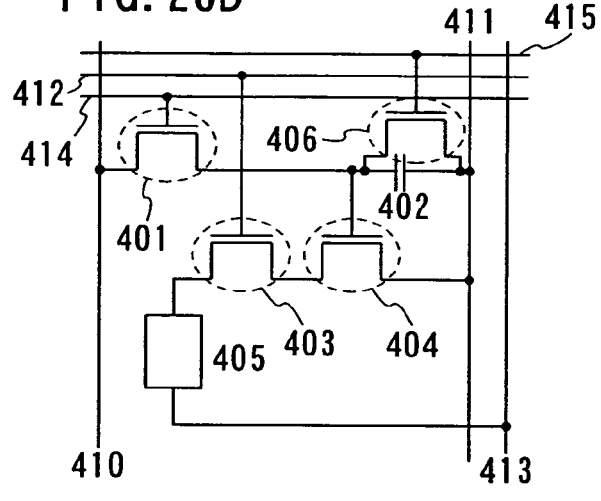

A pixel shown in FIG. 20C has the same structure as the pixel shown in FIG. 20A besides the difference that the gate electrode of the TFT 403 is connected to a power supply line 412 arranged in a row direction. In other words, the pixels shown in FIG. 20A and 20C show the same equivalent circuit diagram. However, in the case of arranging the power supply line 412 in a column direction (FIG. 20A) and in the case of arranging the power supply line 412 in a row direction (FIG. 20C), each power supply line is formed of a conductive layer in a different layer. Here, with attention to a wiring to which the gate electrode of the driving TFT 403 is connected, the figures are separately illustrated in FIGS. 20A and 20C to show that the wirings are formed in different layers.

As a characteristic of the pixels shown in FIGS. 20A and 20C, the TFTs 403 and 404 are serially connected in the pixels, and a channel-length $L_3$ and a channel-width $W_3$ of the TFT 403, a channel-length $L_4$ and a channel width $W_4$ of the TFT 404 are provided to satisfy $L_3/W_3$: $L_4/W_4$=5 to 6000:1. As an example of satisfying 6000:1, there is a case where $L_3$ is 500 μm; $W_3$, 3 μm; $L_4$, 3 μm; and $W_4$, 100 μm.

Note that the TFT 403 operates in a saturation region and has a role in which a current value flowed through the light-emitting element 405 is controlled and the TFT 404 operates in a liner region and has a role in which supply of a current to the light-emitting element 405 is controlled. It is preferable from the viewpoint of a manufacturing step if both TFTs have the same conductivity type. In addition, not only an enhancement mode but also a depletion mode may be also used for the TFT 403. In the present invention having the above structure, slight fluctuation of $V_{GS}$ in the TFT 404 does not affect the current value of the light-emitting element 405 since the TFT 404 operates in a liner region. In other words, the current value of the light-emitting element 405 is depends on the TFT 403 operated in a saturation region. According to the invention having the above structure, it is possible to provide a display device of which image quality is enhanced by improving luminance unevenness of a light-emitting element due to the variations in characteristic of a TFT.

In the pixels shown in FIGS. 20A to 20D, the TFT 401 controls input of a video signal to a pixel, and a video signal is held in the capacitor element 402 when the TFT 401 is turned ON and the video signal is inputted into a pixel. Note that FIGS. 20A and 20C show a structure in which the capacitor element 402 is provided; however, the invention is not limited thereto, and the capacitor element 402 may not be expressly provided when a gate capacitor or the like can be substituted for a capacitor holding a video signal.

The light-emitting element 405 has a structure in which an electroluminescent layer is sandwiched between two electrodes, and potential difference is provided between a pixel electrode and an opposite electrode (between an anode and a cathode) so that a voltage in a forward-bias direction is applied. The electroluminescent layer is composed of wide variety of materials such as an organic material or an inorganic material, and luminescence in this electroluminescent layer includes fluorescence when an electron returns from a singlet excited state to a ground state and phosphorescence when an electron returns from a triplet excited state to a ground state.

Except that a TFT 406 and a scanning line 415 are additionally provided, the pixel shown in FIG. 20B has the same pixel structure as that shown in FIG. 20A. In the same manner, except that a TFT 406 and a scanning line 415 are additionally provided, the pixel shown in FIG. 20D has the same pixel structure as that shown in FIG. 20C.

ON or OFF of the TFT 406 is controlled by the scanning line 415 newly arranged. When the TFT 406 is turned ON, an electric charge held in the capacitor element 402 discharges and thus the TFT 406 is turned OFF. In other words, it can be made forced not to flow current to the light-emitting element 405 by arranging the TFT 406. Thus, in the structure of FIGS. 20B and 20D, a lighting period can be started at the same time as or just after a start of a writing period without waiting for signal writing in all pixels; therefore, the duty ratio can be improved.

Figure 20E:
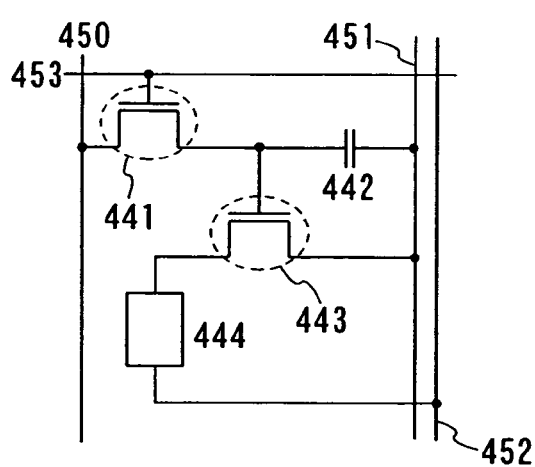
Figure 20F:
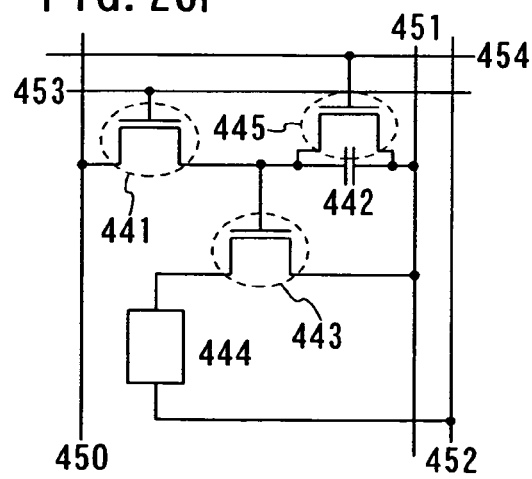

In a pixel shown in FIG. 20E, a signal line 450 and power supply lines 451 and 452 are arranged in a column direction and a scanning line 453 is arranged in a row direction. In addition, a switching TFT 441, a driving TFT 443, a capacitor element 442, and a light-emitting element 444 are included. Except that a scanning line 454 is additionally provided, a pixel shown in FIG. 20F has the same pixel structure as that shown in FIG. 20E. In the structure of FIG. 20F, it is also possible to improve the duty ratio by arranging a TFT 445.

Embodiment Mode 7

Figure 21:
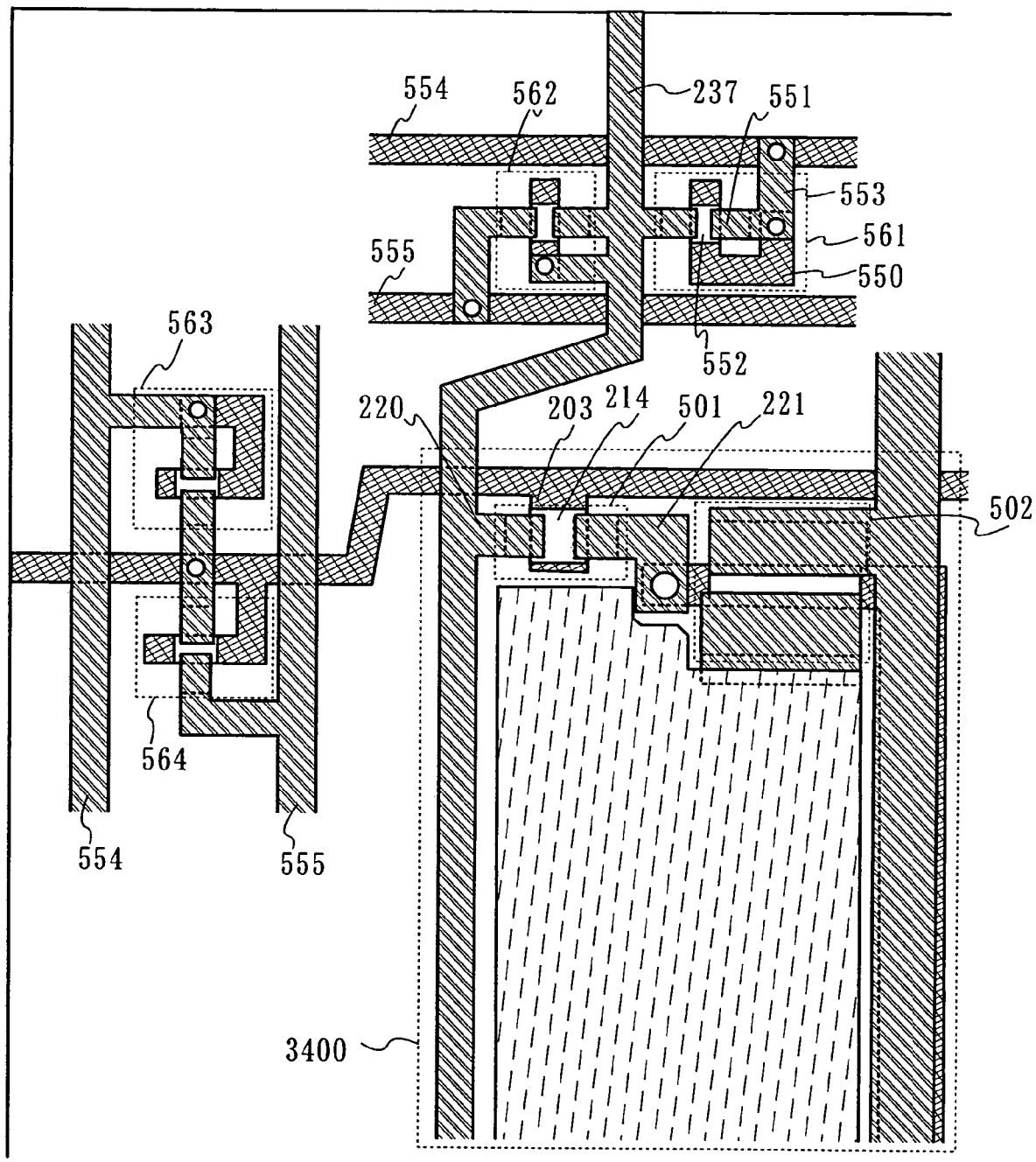
FIG. 21 is an equivalent circuit diagram of an EL display panel illustrated in FIG. 19.

One mode in which a protective diode is provided for a scanning line input terminal portion and a signal line input terminal portion is explained with reference to FIG. 21. In FIG. 21, a pixel 3400 is provided with TFTs 501 and 502. These TFTs have the same structure as that in Embodiment Mode 4.

Figure 19:
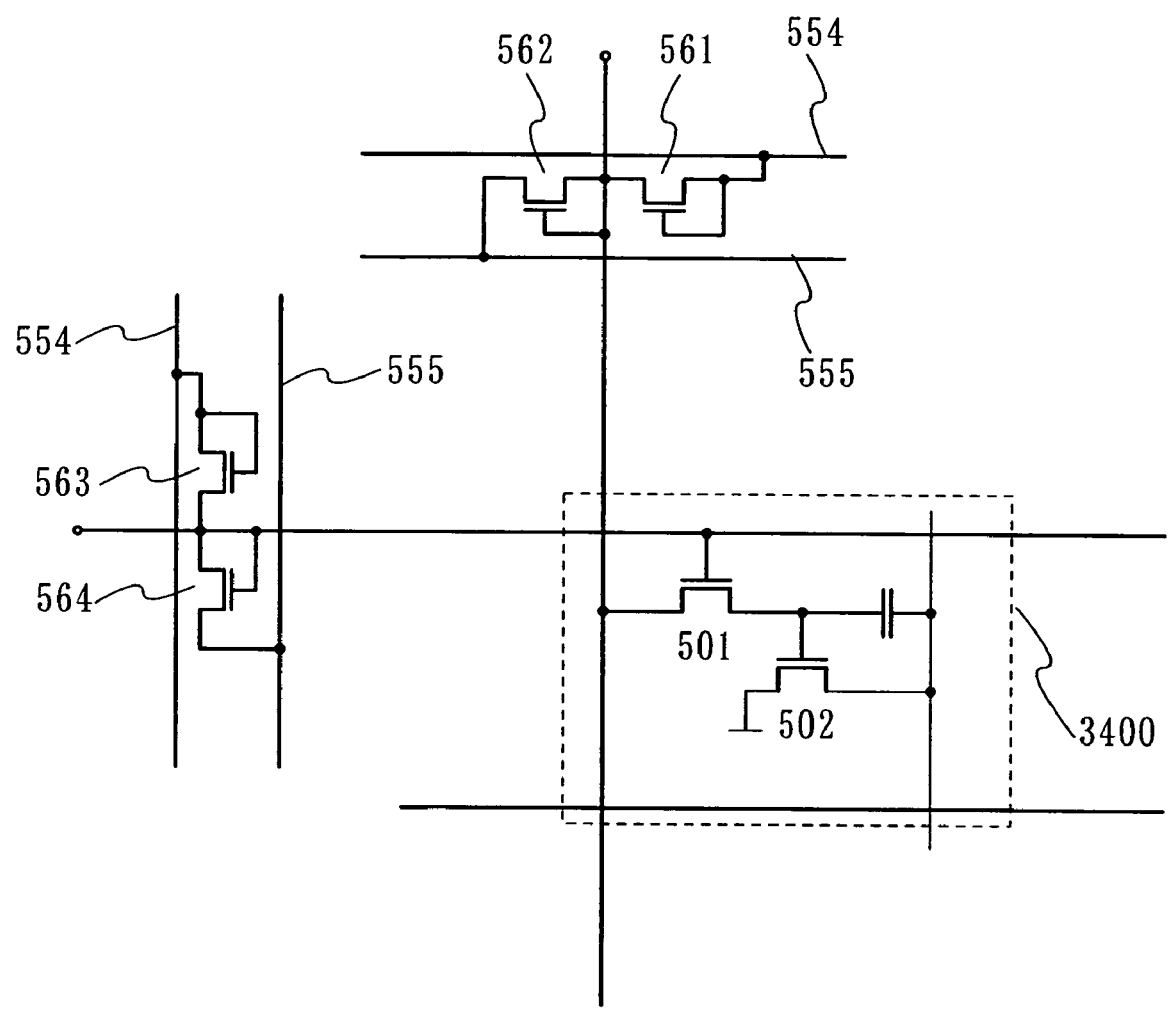
FIG. 19 is a top view illustrating an EL display panel according to a certain aspect of the invention.

Protective diodes 561 and 562 are provided for the signal line input terminal portion. This protective diode is manufactured in the same step as in the TFT 501 or 502, and being operated as a diode by being connected to a gate and one of a drain or a source. FIG. 19 shows an equivalent circuit diagram of a top view shown in FIG. 21.

The protective diode 561 includes a gate electrode layer 550, a semiconductor layer 551, an insulating layer 552 for channel protection, and a wiring layer 553. The protective diode 562 has the same structure. Common potential lines 554 and 555 connecting to this protective diode are formed in the same layer as the gate electrode layer. Thus, it is necessary to form a contact hole in a gate insulating layer to electrically connect to the wiring layer 553.

A mask layer may be formed and etching process may be carried out to form the contact hole in the gate insulating layer. In this case, when etching process by atmospheric pressure discharge is applied, local discharge process is also possible, and it does not need to form the mask layer over an entire surface of a substrate.

A signal wiring layer 237 is formed in the same layer as a source wiring layer and a drain wiring layer 220 or 221 in the TFT 501 and has a structure in which the signal wiring layer 237 is connected to a source side or a drain side of the TFT 501. The TFT 501 includes a gate electrode layer 203, the source wiring layer and the drain wiring layer 220 or 221, and an insulating layer 214 for channel protection.

The input terminal portion of the scanning signal line side also has the same structure. According to the present invention, the protective diodes provided in an input stage can be formed at the same time. Note that the position of depositing the protective diodes is not limited to this embodiment mode and can be provided between a driver circuit and a pixel.

Embodiment Mode 8

Figure 15:
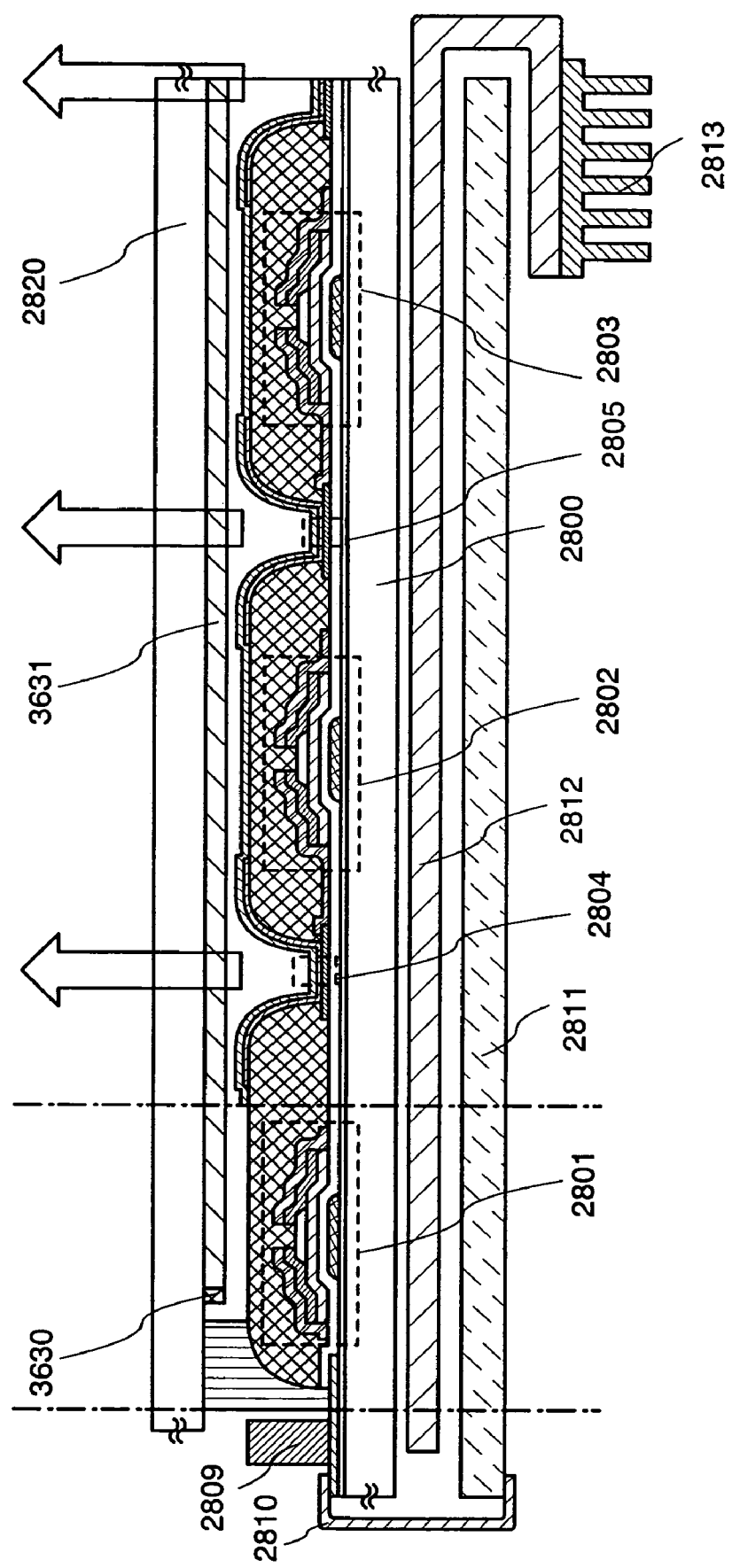
FIG. 15 is a cross-sectional view illustrating an example of a structure of an EL display module according to a certain aspect of the invention.

FIG. 15 shows an example of constituting an EL display module having a TFT substrate 2800 manufactured according to the present invention. A pixel portion composed of pixels is formed over the TFT substrate 2800 according to FIG. 15.

In FIG. 15, a TFT which is the same as that formed in a pixel or a protective circuit portion 2801 operated in the same manner as a diode by being connected to a gate and one of a source or a drain of the TFT is provided between a driver circuit and the pixel where it is outside of the pixel portion. A driver IC formed from a single crystal semiconductor, a stick driver IC formed from a polycrystalline semiconductor film over a glass substrate, or a driver circuit formed from an SAS is applied to a driver circuit 2809.

The TFT substrate 2800 on which a TFT 2802 and a TFT 2803 are formed may be adhered to a sealing substrate 2820 by interposing a spacer therebetween. A space between two substrates can be kept constantly by the spacer even when a substrate is thin and an area of a pixel portion is enlarged; therefore, the spacer is preferable to be provided. In the sealing substrate 2820, a light-transmitting layer 3631 containing a hygroscopic substance is provided by being surrounded with a frame 3630. A light-transmitting resin material may be filled and solidified or anhydrous nitrogen or inert gas may be filled in a space between the TFT substrate 2800 and the sealing substrate 2820 over light-emitting elements 2804 and 2805.

FIG. 15 shows the case in which the light-emitting elements 2804 and 2805 have a structure of top emission type and has a structure in which light is emitted in a direction of an arrow shown in the figure. Thus, the layer 3631 containing the hygroscopic substance has light-transmitting properties. Multicolor display can be carried out in each pixel by having different luminescent colors of red, green, and blue. In addition, at this time, color purity of the luminescence emitted outside can be enhanced by forming a colored layer corresponding to each color on the sealing substrate 2820 side. Moreover, the colored layer may be combined by using the pixel as a white light-emitting element. Since the layer 3631 containing a hygroscopic substance has light-transmitting properties, light can be transmitted and light extraction efficiency is not decreased even in the case of the display device of this embodiment mode in which light is extracted from the sealing substrate side.

The exteriorly provided driver circuit 2809 is connected to a wiring board 2811 with a scanning line or signal line connection terminal 2810 provided on one end of the TFT substrate 2800. In addition, a heat pipe 2813 and a heat sink 2812 may be provided to have a structure improving a heat effect by being in contact with or being disposed close to the TFT substrate 2800.

FIG. 15 shows the top emission type EL display module; however, it may be a bottom emission structure by changing the structure of the light-emitting element or the disposition of the external circuit substrate. In the case of the top emission structure, the insulating layer which is to be a bank may be used as a black matrix by coloring it. This bank can be formed by a droplet discharge method and it may be formed by mixing carbon black or the like into a resin material such as polyimide, or a lamination thereof may be also used.

Embodiment Mode 9

Figure 13:
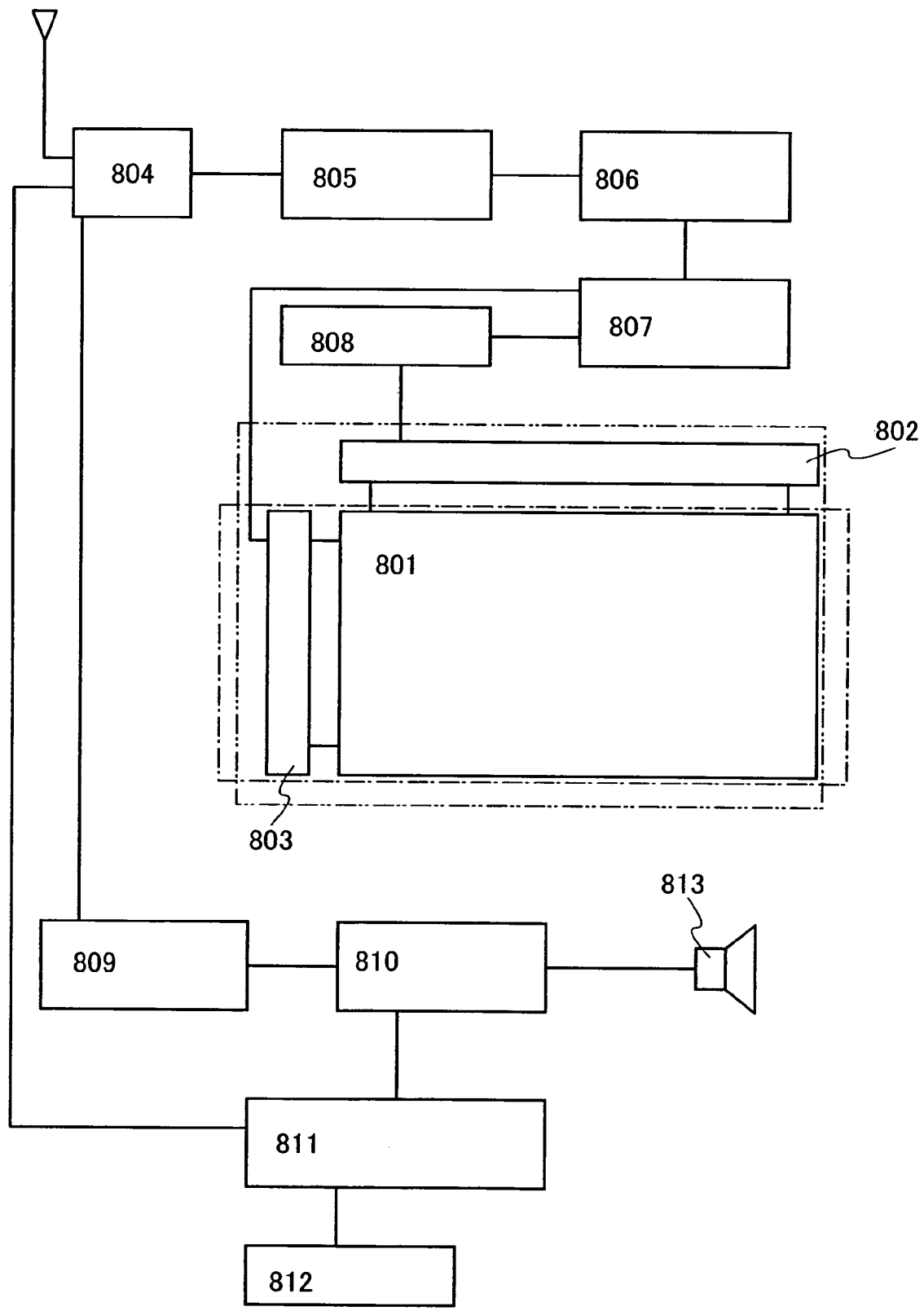
FIG. 13 is a block diagram illustrating a main structure of an electronic device according to a certain aspect of the invention.

A television device can be completed by a display device formed according to the present invention. FIG. 13 shows a block diagram showing a main structure of the television device. A display panel can be formed in any manners as follows: in the case where only a pixel portion 801 is formed, and then a scanning line driver circuit 813 and a signal line driver circuit 802 are mounted by a TAB method as shown in FIG. 16; the pixel portion 801 and the scanning line driver circuit 803 and the signal line driver circuit 802 which are peripheral thereof are formed by COG method as shown in FIG. 17; a TFT is formed to include SAS, the pixel portion 801 and the scanning line driver circuit 803 are integrally formed over the substrate, and the signal line driver circuit 802 is separately mounted as a driver IC; the pixel portion 801, the signal line driver circuit 802, and the scanning line driver circuit 803 are integrally formed over the substrate; or the like.

Another structure of an external circuit includes a video wave amplifier circuit 805 which amplifies a video signal received by a tuner 804; a video signal processing circuit 806 which converts the video signal outputted therefrom into a chrominance signal corresponding to each color of red, green, and blue; a control circuit 807 which converts the video signal into an input specification of a driver IC; and the like on inputting side of the video signal. The control circuit 807 outputs the signal into the scanning line side and the signal line side, respectively. In the case of digital driving, a signal division circuit 808 may be provided on the signal line side so as to have a structure in which an input digital signal is provided by dividing into m-pieces.

Among a signal received from the tuner 804, an audio signal is transmitted to an audio wave amplifier circuit 809, and the output thereof is provided for a speaker 813 through an audio signal processing circuit 810. A control circuit 811 receives control information of a receiving station (a receiving frequency) or sound volume from an input portion 812 and transmits the signal to the tuner 804 or the audio signal processing circuit 810.

As shown in FIG. 14, a television device can be completed by incorporating this module into a casing 2001. An EL television device can be completed by using such an EL display module like in FIG. 15. A main screen 2003 is formed by using the display module, and a speaker portion 2009, operation switches, and the like are provided as other attached equipments. In such a manner, the television device can be completed according to the invention.

Figure 26:
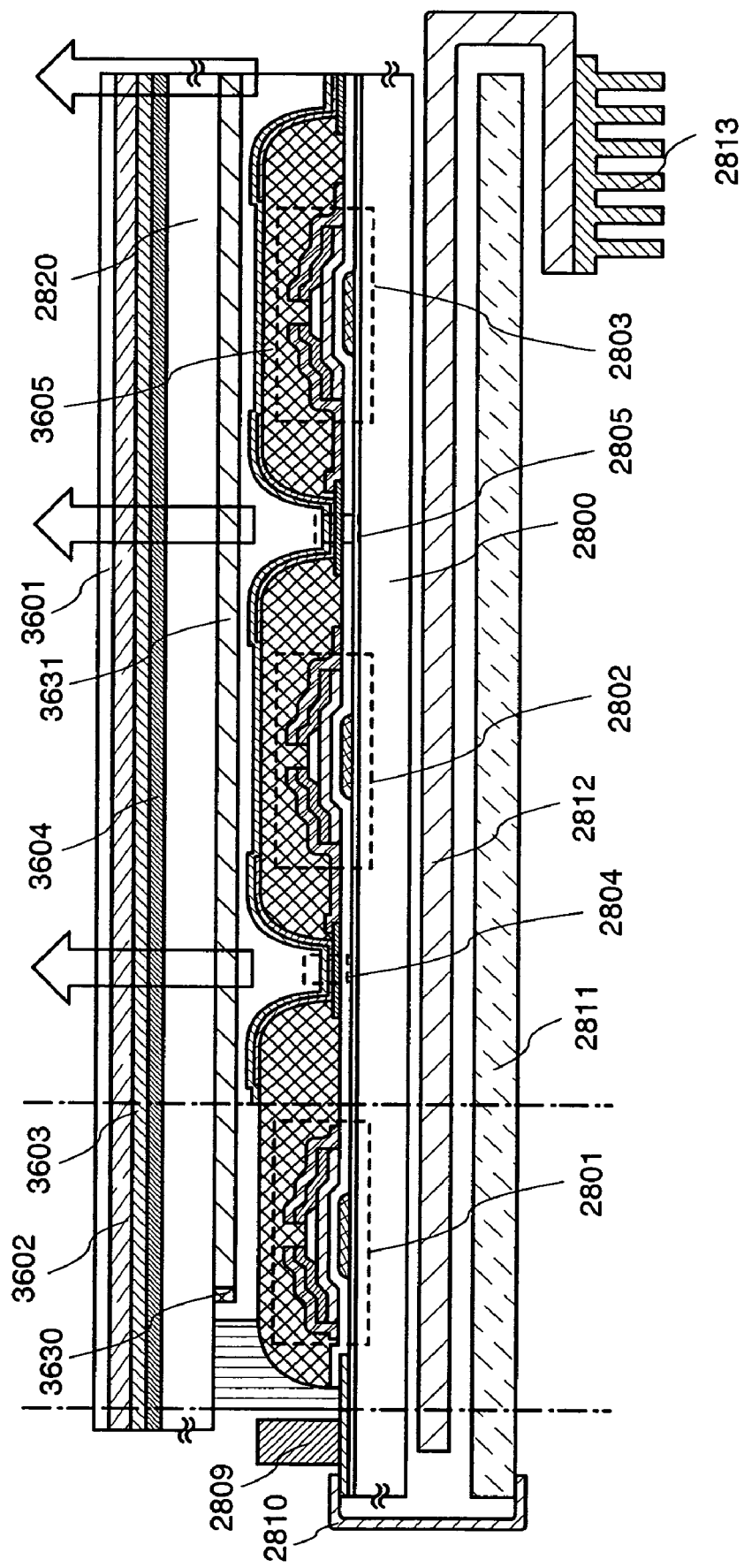
FIG. 26 is a cross-sectional view illustrating an example of a structure of an EL display module according to a certain aspect of the invention.

In addition, as shown in FIG. 26, reflected light of light entered from exterior may be shielded by using a retardation film and a polarizing plate. FIG. 26 is a structure of a top emission type and an insulating layer 3605 which is to be a bank is used as a black matrix by being colored. This bank can be formed by a droplet discharge method, and a carbon black or the like may be mixed into a resin material such as polyimide or a lamination thereof may be also applied. In this embodiment mode, a pigment-based black resin is used. The bank may be formed by discharging the different materials to the same region for several times. $\lambda/4\backslash\lambda/2$ may be used as retardation films 3603 and 3604 and may be designed to be able to control light. The structure is as follows: a TFT substrate 2800\a light-emitting element 2804\a sealing substrate (sealant) 2820\the retardation films 3603 and 3604 ($\lambda/4\backslash\lambda/2$) \a polarizing plate 3602, in which light emitted from the light-emitting element is emitted outside of the polarizing plate side to transmit them. These retardation films and polarizing plate may be provided on a side where light is emitted or may be provided on the both sides in the case of a dual emission type display device in which light is emitted from the both faces. In addition, an anti-reflective film 3601 may be provided on the outer side of the polarizing plate. Accordingly, a higher definition and more precise image can be displayed.

A display panel 2002 using an EL element is incorporated into the casing 2001. Information communication can be also carried out in one direction (from a transmitter to a receiver) or in the both directions (between a transmitter and a receiver or between receivers) by connecting to a communications network by a fixed line or a wireless through a modem 2004. For example, general television broadcasting is received from a receiver 2005. The operation of the television device can be carried out by switches incorporated into the casing or by a remote control device 2006, which is separated from the main body. A display portion 2007 that displays information to be outputted may be also provided for this remote control device.

In addition, in the television device, a structure displaying a channel, sound volume, or the like may be additionally provided by forming a sub-screen 2008 of a second display panel in addition to the main screen 2003. A structure in which the main screen 2003 is formed of the EL display panel superior in a viewing angle and the sub-screen is also formed of the EL display panel to be able to flash on and off may be also applied. According to the invention, a display device with high reliability can be manufactured even by using many TFTs and electronic parts by using such a large-sized substrate.

Of course, the invention is not limited to the television device and it can be applied to various usages especially as the display mediums with a large-sized area such as an information display board at a station, an airport, or the like, or an advertisement display board on the street as well as a monitor of a personal computer.

Embodiment Mode 10

Various display devices can be manufactured by applying the present invention. In other words, the invention can be applied to various electronic devices in which these display devices are incorporated into display portions.

The electronic devices include a camera such as a video camera or a digital camera, a projector, a head mounted display (goggle type display), a car navigation, a car stereo, a personal computer, a game machine, a portable information terminal (a mobile computer, a cellular phone, an electronic book, or the like), an image reproducing device provided with a recording medium (specifically a device that is capable of playing a recording medium such as a Digital Versatile Disc (DVD) and that has a display device that can display the image) or the like. FIGS. 12A to 12E show the examples thereof.

Figure 12A:
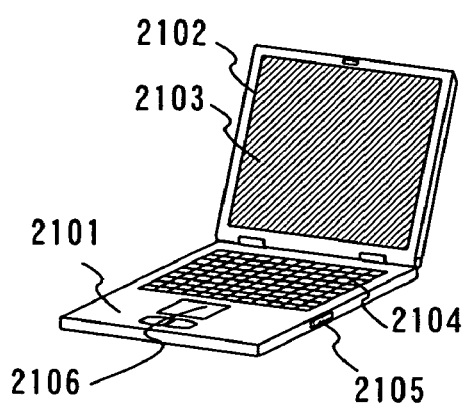
FIGS. 12A to 12D are views illustrating electronic devices to which a certain aspect of the invention is applied.

FIG. 12A is a laptop computer, which includes a main body 2101, a casing 2102, a display portion 2103, keyboards 2104, an external connection port 2105, a pointing mouse 2106, and the like. The invention is applied in manufacturing the display portion 2103. According to the invention, an image with high reliability and high resolution can be displayed even when the laptop computer often taken out outside is used in harsh conditions.

Figure 12B:
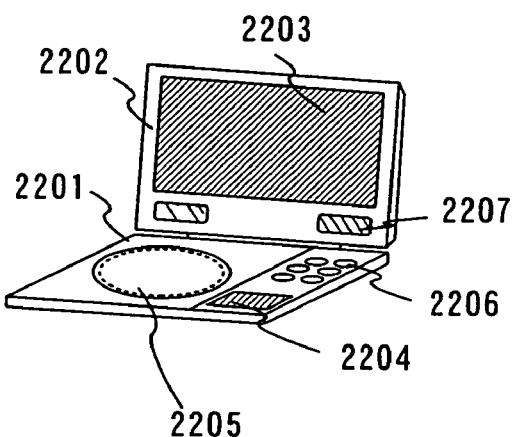

FIG. 12B is an image reproducing device provided with a recording medium (specifically a DVD reproducing device), which includes a main body 2201, a casing 2202, a display portion A 2203, a display portion B 2204, a recording medium (such as a DVD) reading portion 2205, operation keys 2206, a speaker portion 2207, and the like. The display portion A 2203 mainly displays image information and the display portion B 2204 mainly displays character information, and the invention is applied in manufacturing these display portions A 2203 and B 2204. According to the invention, an image with high reliability and high resolution can be displayed.

Figure 12C:
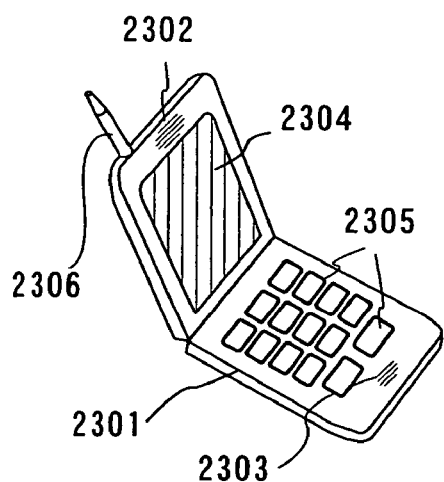

FIG. 12C is a cellular phone, which includes a main body 2301, an audio output portion 2302, an audio input portion 2303, a display portion 2304, operation switches 2305, an antenna 2306, and the like. By applying the display device manufactured according to the invention to the display portion 2304, display with high reliability and high resolution can be made even in the case of the cellular phone often used in high-temperature and humid circumstances such as outside.

Figure 12D:
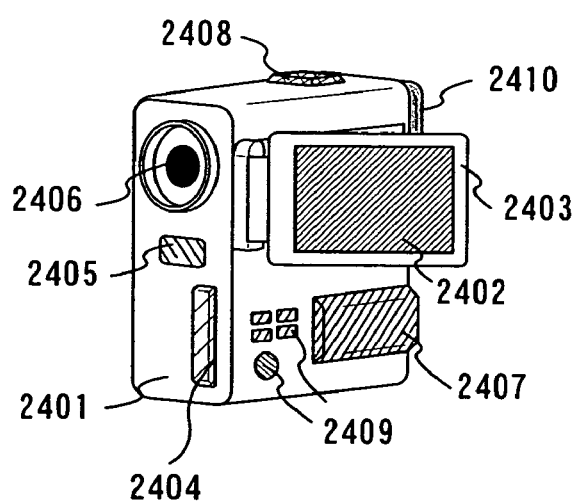

FIG. 12D is a video camera, which includes a main body 2401, a display portion 2402, a casing 2403, an external connection port 2404, a remote control receiving portion 2405, an image receiving portion 2406, a battery 2407, an audio input portion 2408, operation keys 2409, an eye piece portion 2410, and the like. By applying the display device manufactured according to the invention to the display portion 2402, display with high reliability and high resolution can be made even when the video camera is used in high-temperature and humid circumstances such as outside.

Figure 27:
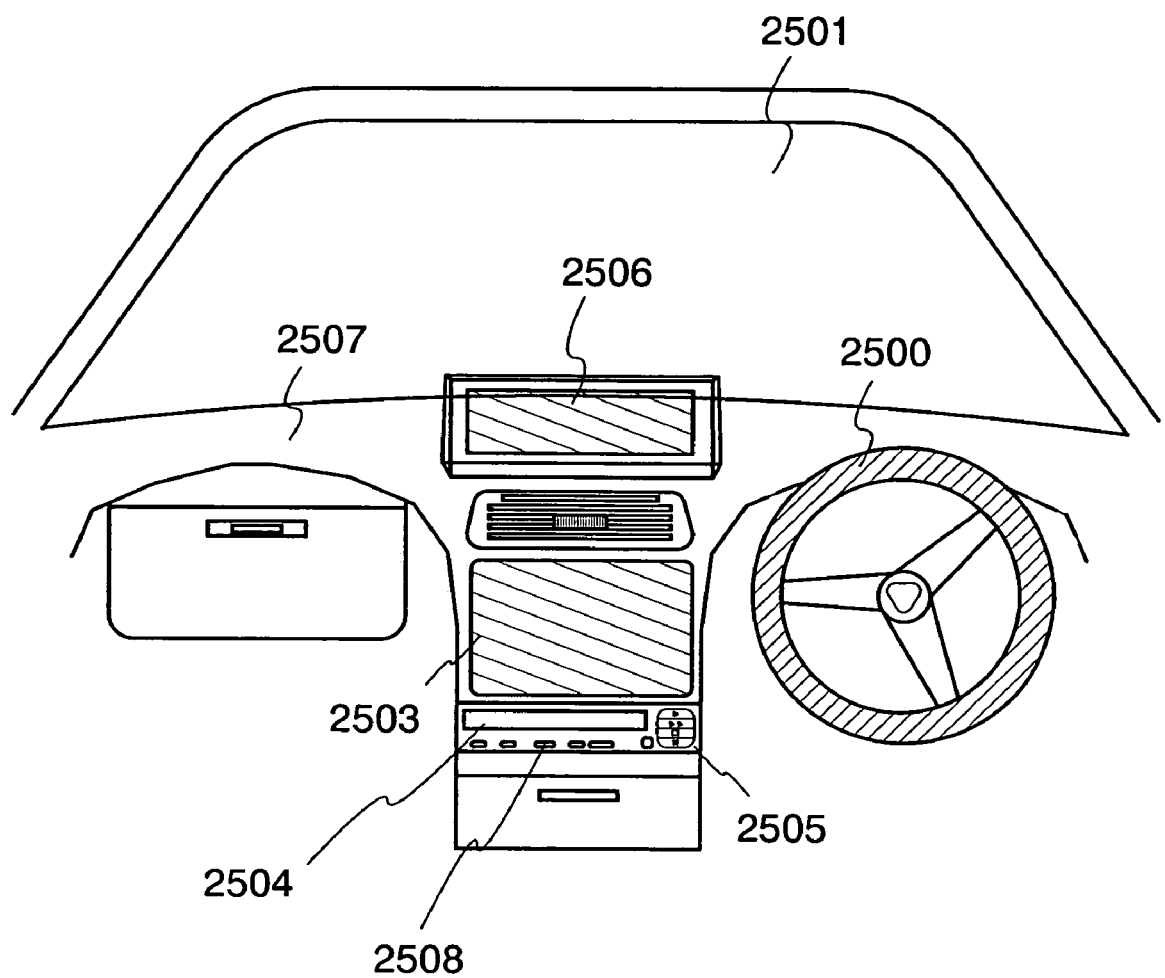
FIG. 27 is a view illustrating an electronic device to which a certain aspect of the invention is applied.

FIG. 27 shows an example in which the display portion is mounted on an automobile. An automobile is used here as a typical example of a vehicle; however, it is not limited thereto and also applicable to an aircraft, a train, or the like. It is important that the display device mounted specifically on the automobile has high reliability even in harsh circumstances (an automobile which tends to be high-temperature and humid therein).

FIG. 27 is a view showing a periphery of a driver seat of the automobile. Reference numeral 2501 denotes a front glass and 2500 denotes an operation handle. An audio reproducing device, specifically a car audio or a car navigation is provided for a dash board 2507. A main body 2505 of the car audio includes a display portion 2504 and operation buttons 2508. By applying the invention to a display portion 2503, a car audio provided with high reliability can be completed.

In addition, a car navigation provided with high reliability can be also completed by applying the invention to the display portion 2503 of the car navigation and to a display portion 2506 displaying an air conditioning state in the automobile.

In addition, this embodiment mode shows the vehicle-mounted car audio and car navigation; however, it may be applied also to an indicator of other vehicles, or a stationary audio or navigation device.

As mentioned above, the application range of the invention is extremely broad and the invention can be applied to electronic devices of various fields.

This application is based on Japanese Patent Application serial no. 2003-432005 filed in Japanese Patent Office on Dec. 26, 2003, the contents of which are hereby incorporated by reference.

What is claimed is:

1. A display device comprising:
a pair of substrates;
a light-emitting element;
a layer containing a hydroscopic substance; and
a frame,
wherein a region surrounded with the frame is filled with the layer containing the hydroscopic substance, and
wherein the pair of substrates are adhered to each other with a sealant so that the light-emitting element, the layer containing the hydroscopic substance, and the frame are sealed with the sealant between the pair of substrates.

2. The display device according to claim 1, wherein the layer containing the hydroscopic substance is light transmitting.

3. The display device according to claim 1, wherein the sealant is separately formed from the frame.

4. A display device comprising:
a first substrate having a pixel portion comprising a light-emitting element;
a second substrate;
a layer containing a hydroscopic substance; and
a frame surrounding the pixel portion,
wherein a region surrounded with the frame is filled with the layer containing the hydroscopic substance, and
wherein the first substrate and the second substrate are adhered to each other with a sealant so that the pixel portion, the layer containing the hydroscopic substance, and the frame are sealed with the sealant between the pair of substrates.

5. The display device according to claim 4, wherein the layer containing the hydroscopic substance is light transmitting.

6. The display device according to claim 4, wherein the layer containing the hydroscopic substance is provided over the second substrate.

7. The display device according to claim 4, wherein the frame and the sealant are made from a same substance.

8. The display device according to claim 4, wherein the first substrate further includes a circuit portion having a driver circuit and the frame surrounds the pixel portion and a part of the circuit portion.

9. The display device according to claim 4, wherein the first substrate further includes a circuit portion having a driver circuit and the frame surrounds the pixel portion and the circuit portion.

10. The display device according to claim 4, wherein the sealant is separately formed from the frame.

11. A display device comprising:
a first substrate including a pixel portion comprising a light-emitting element and a circuit portion having a driver circuit;
a second substrate;
a layer containing a hydroscopic substance;
a frame surrounding the pixel portion; and
a sealant surrounding the pixel portion and the circuit portion,
wherein a region between the frame and the sealant is filled with the layer containing the hydroscopic substance, and
wherein the first substrate and the second substrate are adhered to each other with the sealant so that the pixel portion, the circuit portion, the layer containing the hydroscopic substance, and the frame are sealed with the sealant between the pair of substrates.

12. The display device according to claim 11, wherein the layer containing the hydroscopic substance is light transmitting.

13. The display device according to claim 11, wherein the layer containing the hydroscopic substance is provided over the second substrate.

14. The display device according to claim 11, wherein the frame and the sealant are made from a same substance.

15. The display device according to claim 11, wherein the sealant is separately formed from the frame.

16. A display device comprising:
a first substrate including a pixel portion comprising a light-emitting element and a circuit portion having a driver circuit;
a second substrate;
a layer containing a hydroscopic substance; and
a frame surrounding the circuit portion,
wherein a region surrounded with the frame is filled with the layer containing the hydroscopic substance, and
wherein the first substrate and the second substrate are adhered to each other with a sealant so that the pixel portion, the circuit portion, the layer containing the hydroscopic substance, and the frame are sealed with the sealant between the pair of substrates.

17. The display device according to claim 16, wherein the layer containing the hydroscopic substance is light transmitting.

18. The display device according to claim 16, wherein the layer containing the hydroscopic substance is provided over the second substrate.

19. The display device according to claim 16, wherein the frame and the sealant are made from a same substance.

20. The display device according to claim 16, wherein the sealant is separately formed from the frame.

21. A display device comprising:
- a first substrate including a pixel portion comprising a light-emitting element and a circuit portion having a driver circuit;
- a second substrate;
- a layer containing a hydroscopic substance;
- a first frame surrounding the pixel portion and the circuit portion; and
- a second frame surrounding the pixel portion,
- wherein a region between the first frame and the second frame is filled with the layer containing the hydroscopic substance, and
- wherein the first substrate and the second substrate are adhered to each other with a sealant so that the pixel portion, the circuit portion, the layer containing the hydroscopic substance, the first frame and the second frame are sealed with the sealant between the pair of substrates.

22. The display device according to claim 21, wherein the layer containing the hydroscopic substance is light transmitting.

23. The display device according to claim 21, wherein the layer containing the hydroscopic substance is provided over the second substrate.

24. The display device according to claim 21, wherein the frame and the sealant are made from a same substance.

25. The display device according to claim 21, wherein the sealant is separately formed from the frame.

26. A method for manufacturing a display device comprising the steps of:
- forming a light-emitting element over a first substrate;
- forming a frame to surround the light-emitting element;
- dropping a composition containing a liquid hydroscopic substance in a region surrounded with the frame; and
- forming a layer containing the hydroscopic substance by solidifying the composition,
- wherein the region surrounded with the frame is filled with the layer containing the hydroscopic substance, and
- wherein the first substrate and a second substrate are adhered by a sealant so that the light-emitting element, the layer containing the hydroscopic substance, and the frame are sealed with the sealant between the pair of substrates.

27. The method for manufacturing a display device according to claim 26, wherein the composition is heated to solidify and the layer containing the hydroscopic substance is formed.

28. The method for manufacturing a display device according to claim 26, wherein the layer containing the hydroscopic substance is light transmitting.

29. The method for manufacturing a display device according to claim 26, wherein the layer containing the hydroscopic substance is formed over the second substrate.

30. The method for manufacturing a display device according to claim 26, wherein the frame and the sealant are formed by using the same material.

31. The method for manufacturing a display device according to claim 26, wherein the composition is dropped in an inert gas atmosphere.

32. The method for manufacturing a display device according to claim 26, wherein the composition is dropped under a reduced pressure.

33. The method for manufacturing a display device according to claim 26, wherein a driver circuit is further formed over the first substrate and the frame is formed to surround the light-emitting element and the driver circuit.

34. The method for manufacturing a display device according to claim 26, wherein the sealant is separately formed from the frame.

35. A method for manufacturing a display device comprising the steps of:
- forming a light-emitting element and a driver circuit over a first substrate;
- forming a frame to surround the driver circuit;
- forming a sealant to surround the light-emitting element and the driver circuit;
- dropping a composition containing a liquid hydroscopic substance between the frame and the sealant; and
- forming a layer containing the hydroscopic substance by solidifying the composition,
- wherein a region between the frame and the sealant is filled with the layer containing the hydroscopic substance, and
- wherein the first substrate and a second substrate are adhered to each other with the sealant so that the light-emitting element, the driver circuit, the layer containing the hydroscopic substance, and the frame are sealed with the sealant between the pair of substrates.

36. The method for manufacturing a display device according to claim 35, wherein the composition is heated to solidify and the layer containing the hydroscopic substance is formed.

37. The method for manufacturing a display device according to claim 35, wherein the layer containing the hydroscopic substance is light transmitting.

38. The method for manufacturing a display device according to claim 35, wherein the layer containing the hydroscopic substance is formed over the second substrate.

39. The method for manufacturing a display device according to claim 35, wherein the frame and the sealant are formed by using the same material.

40. The method for manufacturing a display device according to claim 35, wherein the composition is dropped in an inert gas atmosphere.

41. The method for manufacturing a display device according to claim 35, wherein the composition is dropped under a reduced pressure.

42. The method for manufacturing a display device according to claim 35, wherein the sealant is separately formed from the frame.

43. A method for manufacturing a display device comprising the steps of:
- forming a light-emitting element and a driver circuit over a first substrate;
- forming a frame to surround the driver circuit;
- dropping a composition containing a liquid hydroscopic substance in a region surrounded with the frame; and
- forming a layer containing the hydroscopic substance by solidifying the composition,
- wherein the region surrounded with the frame is filled with the layer containing the hydroscopic substance, and
- wherein the first substrate and a second substrate are adhered to each other with a sealant so that the light-emitting element, the driver circuit, the layer containing the hydroscopic substance, and the frame are sealed with the sealant between the pair of substrates.

44. The method for manufacturing a display device according to claim 43, wherein the composition is heated to solidify and the layer containing the hydroscopic substance is formed.

45. The method for manufacturing a display device according to claim 43, wherein the layer containing the hydroscopic substance is light transmitting.

46. The method for manufacturing a display device according to claim 43, wherein the layer containing the hydroscopic substance is formed over the second substrate.

47. The method for manufacturing a display device according to claim 43, wherein the frame and the sealant are formed by using the same material.

48. The method for manufacturing a display device according to claim 43, wherein the composition is dropped in an inert gas atmosphere.

49. The method for manufacturing a display device according to claim 43, wherein the composition is dropped under a reduced pressure.

50. The method for manufacturing a display device according to claim 43, wherein the sealant is separately formed from the frame.

51. A method for manufacturing a display device comprising the steps of:
    forming a light-emitting element and a driver circuit over a first substrate;
    forming a first frame to surround the light-emitting element and the driver circuit;
    forming a second frame to surround the light-emitting element;
    dropping a composition containing a liquid hydroscopic substance between the first frame and the second frame; and
    forming a layer containing the hydroscopic substance by solidifying the composition,
    wherein a region between the first frame and the second frame is filled with the layer containing the hydroscopic substance, and
    wherein the first substrate and a second substrate are adhered to each other with a sealant so that the light-emitting element, the driver circuit, the layer containing the hydroscopic substance, the first frame, and the second frame are sealed with the sealant between the pair of substrates.

52. The method for manufacturing a display device according to claim 51, wherein the composition is heated to solidify and the layer containing the hydroscopic substance is formed.

53. The method for manufacturing a display device according to claim 51, wherein the layer containing the hydroscopic substance is light transmitting.

54. The method for manufacturing a display device according to claim 51, wherein the layer containing the hydroscopic substance is formed over the second substrate.

55. The method for manufacturing a display device according to claim 51, wherein the frame and the sealant are formed by using the same material.

56. The method for manufacturing a display device according to claim 51, wherein the composition is dropped in an inert gas atmosphere.

57. The method for manufacturing a display device according to claim 51, wherein the composition is dropped under a reduced pressure.

58. The method for manufacturing a display device according to claim 51, wherein the sealant is separately formed from the frame.

* * * * *